(12) United States Patent
Jeong et al.

(10) Patent No.: US 10,567,115 B2
(45) Date of Patent: Feb. 18, 2020

(54) TRANSMITTER AND ADDITIONAL PARITY GENERATING METHOD THEREOF

(71) Applicant: SAMSUNG ELECTRONICS CO., LTD., Suwon-si (KR)

(72) Inventors: Hong-sil Jeong, Suwon-si (KR); Kyung-joong Kim, Seoul (KR); Se-ho Myung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/044,419

(22) Filed: Feb. 16, 2016

(65) Prior Publication Data

US 2016/0241357 A1    Aug. 18, 2016

Related U.S. Application Data

(60) Provisional application No. 62/202,304, filed on Aug. 7, 2015, provisional application No. 62/120,543, filed
(Continued)

(30) Foreign Application Priority Data

Sep. 27, 2015    (KR) .................. 10-2015-0137191

(51) Int. Cl.
*H04L 1/00* (2006.01)
*H03M 13/29* (2006.01)
(Continued)

(52) U.S. Cl.
CPC ....... *H04L 1/0041* (2013.01); *H03M 13/1102* (2013.01); *H03M 13/255* (2013.01);
(Continued)

(58) Field of Classification Search
CPC . H04L 1/0041; H04L 1/0068; H04L 27/2627; H04L 1/0057; H04L 1/0009;
(Continued)

(56) References Cited

U.S. PATENT DOCUMENTS 8,707,125 B2    4/2014  Jeong et al.
9,106,261 B2    8/2015  Jeong et al.
(Continued)

FOREIGN PATENT DOCUMENTS

CN    102714504 A    10/2012
CN    103765781 A    4/2014
(Continued)

OTHER PUBLICATIONS

International Search Report (PCT/ISA/210) dated Aug. 24, 2016 issued by the International Searching Authority in counterpart International Application No. PCT/KR2016/001506.
(Continued)

*Primary Examiner* — April Y Blair
*Assistant Examiner* — Sazzad Hossain
(74) *Attorney, Agent, or Firm* — Sughrue Mion, PLLC

(57) ABSTRACT

A transmitter is provided. The transmitter includes: a Low Density Parity Check (LDPC) encoder which encodes input bits including outer encoded bits to generate an LDPC codeword including the input bits and parity bits to be transmitted to a receiver in a current frame; a puncturer which punctures a part of the parity bits which is not transmitted in the current frame; and an additional parity generator which selects at least a part of the parity bits to generate additional parity bits transmitted to the receiver in a previous frame of the current frame, wherein a number of the additional parity bits is determined based on a number of the outer encoded bits and a number of the parity bits left after the puncturing.

4 Claims, 64 Drawing Sheets

Related U.S. Application Data on Feb. 25, 2015, provisional application No. 62/115,810, filed on Feb. 13, 2015.

(51) Int. Cl.
*H04L 27/26* (2006.01)
*H03M 13/25* (2006.01)
*H03M 13/11* (2006.01)

(52) U.S. Cl.
CPC ....... *H03M 13/2906* (2013.01); *H04L 1/0009* (2013.01); *H04L 1/0057* (2013.01); *H04L 1/0068* (2013.01); *H04L 27/2627* (2013.01)

(58) Field of Classification Search
CPC .......... H03M 13/2906; H03M 13/255; H03M 13/005; H03M 13/1102
See application file for complete search history.

(56) References Cited

U.S. PATENT DOCUMENTS

| | | | |
|---|---|---|---|
| 10,027,350 B2* | 7/2018 | Myung | H04L 1/0041 |
| 2006/0123277 A1 | 6/2006 | Hocevar | |
| 2006/0150068 A1* | 7/2006 | Yang | G09G 3/3685 |
| | | | 714/801 |
| 2007/0092034 A1* | 4/2007 | Yu | H03M 13/235 |
| | | | 375/295 |
| 2007/0260772 A1* | 11/2007 | Garmonov | H03M 13/1131 |
| | | | 710/33 |
| 2007/0260958 A1* | 11/2007 | Li | H04L 1/0048 |
| | | | 714/755 |
| 2008/0062909 A1* | 3/2008 | Shin | H04B 7/022 |
| | | | 370/315 |
| 2010/0275089 A1 | 10/2010 | Mow et al. | |
| 2010/0325520 A1* | 12/2010 | Kuri | H03M 13/6356 |
| | | | 714/758 |
| 2011/0041043 A1* | 2/2011 | Kim | H04L 1/0068 |
| | | | 714/790 |
| 2012/0185757 A1* | 7/2012 | Jeong | H03M 13/2906 |
| | | | 714/801 |
| 2012/0216099 A1 | 8/2012 | Jeong et al. | |
| 2013/0055051 A1* | 2/2013 | Jeong | H04L 1/0057 |
| | | | 714/782 |
| 2013/0198593 A1* | 8/2013 | Jeong | H03M 13/005 |
| | | | 714/790 |
| 2016/0173312 A1* | 6/2016 | Moon | H04H 20/72 |
| | | | 375/295 |
| 2016/0248445 A1* | 8/2016 | Myung | H04L 1/0041 |
| 2016/0248544 A1* | 8/2016 | Jeong | H03M 13/1165 |
| 2016/0261370 A1* | 9/2016 | Jeong | H03M 13/1148 |

FOREIGN PATENT DOCUMENTS

| | | |
|---|---|---|
| KR | 10-2012-0096154 A | 8/2012 |
| KR | 10-2013-0024704 A | 3/2013 |
| WO | 2011/062424 A2 | 5/2011 |
| WO | 2013032156 A1 | 3/2013 |
| WO | 2015/016666 A1 | 2/2015 |

OTHER PUBLICATIONS

Written Opinion (PCT/ISA/237) dated Aug. 24, 2016 issued by the International Searching Authority in counterpart International Application No. PCT/KR2016/001506.

Communication dated May 18, 2018 issued by the Canadian Patent Office in counterpart Canadian Application No. 2,975,077.

Communication dated Jan. 14, 2019, issued by the Korean Intellectual Property Office in corresponding Korean Application No. 10-2018-0107324.

Communication dated Oct. 23, 2019 issued by the State Intellectual Property Office of P.R. China in counterpart Chinese Application No. 201680011134.0.

Communication dated Nov. 6, 2019 issued by the Indian Intellectual Property Office in counterpart Indian Application No. 201717030537.

* cited by examiner

TRANSMITTER AND ADDITIONAL PARITY GENERATING METHOD THEREOF

CROSS-REFERENCE TO THE RELATED APPLICATIONS

This application claims priority from Korean Patent Application No. 10-2015-0137191 filed on Sep. 27, 2015, and U.S. Provisional Application Nos. 62/115,810, 62/120, 543, and 62/202,304 filed on Feb. 13, 2015, Feb. 25, 2015, and Aug. 7, 2015, respectively, the disclosures of which are incorporated herein in their entirety by reference.

BACKGROUND

1. Field

Apparatuses and methods consistent with exemplary embodiments of the inventive concept relate to a transmitter and a method of generating an additional parity for signal transmission.

2. Description of the Related Art

Broadcast communication services in information oriented society of the 21$^{st}$ century are entering an era of digitalization, multi-channelization, bandwidth broadening, and high quality. In particular, as a high definition digital television (TV) and portable broadcasting signal reception devices are widespread, digital broadcasting services have an increased demand for a support of various receiving schemes.

According to such demand, standard groups set up broadcasting communication standards to provide various signal transmission and reception services satisfying the needs of a user. Still, however, a method for providing better services to a user with more improved performance is required.

SUMMARY

Exemplary embodiments of the inventive concept may overcome disadvantages of related art signal transmitter and receiver and methods thereof. However, these embodiments are not required to or may not overcome such disadvantages. The exemplary embodiments provide a transmitter and a method for generating an additional parity bit using parity bits generated by encoding.

According to an aspect of an exemplary embodiment, there is provided a transmitter which may include: a Low Density Parity Check (LDPC) encoder which encodes input bits including outer encoded bits to generate an LDPC codeword including the input bits and parity bits to be transmitted to a receiver in a current frame; a puncturer which punctures a part of the parity bits which is not transmitted in the current frame; and an additional parity generator which selects at least a part of the parity bits to generate additional parity bits transmitted to the receiver in a previous frame of the current frame, wherein a number of the additional parity bits is determined based on a number of the outer encoded bits and a number of the parity bits left after the puncturing.

The number of the additional parity bits may be determined further based on a number of the punctured parity bits which are not transmitted to the receiver in the current frame.

The transmitter may further include a repeater which repeats, in the LDPC codeword, at least a part of bits of the LDPC codeword so that the repeated bits of the LDPC codeword are transmitted along with the LDPC codeword prior to the repetition in the current frame.

The number of the additional parity bits is determined further based on a number of the repeated bits of the LDPC codeword.

The number of the additional parity bits may be calculated based on a temporary number $N_{AP\_temp}$ of the additional parity bits calculated based on Equation 8.

The number of the additional parity bits may be calculated based on Equation 10.

According to an aspect of another exemplary embodiment, there is provided a method for generating an additional parity at a transmitter. The method may include: encoding input bits including outer encoded bits to generate an LDPC codeword including the input bits and parity bits to be transmitted to a receiver in a current frame; puncturing a part of the parity bits which is not transmitted in the current frame; and generating additional parity bits transmitted to the receiver in a previous frame of the current frame by selecting at least a part of the parity bits, wherein a number of the additional parity bits is determined based on a number of the outer encoded bits and a number of remaining parity bits left after the puncturing.

The method may further include repeating, in the LDPC codeword, at least a part of bits of the LDPC codeword so that the repeated bits of the LDPC codeword are transmitted along with the LDPC codeword prior to the repetition in the current frame.

The number of the additional parity bits is determined further based on a number of the repeated bits of the LDPC codeword.

The repeated bits of the LDPC codeword may be at least a part of the parity bits. When a number of the additional parity bits to be generated is greater than a number of the punctured parity bits and less than a sum of the punctured parity bits and the repeated parity bits, the punctured bits and bits from a first bit of the repeated parity bits may be selected to form the additional parity bits. When a number of the additional parity bits to be generated by the additional parity generator is greater than a sum of a number of the punctured parity bits and a number of the parity bits, bits may be selected in an order of the punctured bits, the repeated parity bits, and the parity bits to generate the additional parity bits. When a number of the additional parity bits to be generated is less than a number of the punctured parity bits, bits may be selected from a lastly punctured bit of the punctured parity bits to generate the additional parity bits.

A number of the additional parity bits may be set to an integer multiple of a modulation order used to modulate the input bits and the remaining parity bits for transmission to the receiver.

As described above, according to various exemplary embodiments, some of the parity bits may be additionally transmitted to obtain a coding gain and a diversity gain.

BRIEF DESCRIPTION OF THE DRAWINGS

The above and/or other aspects of the exemplary embodiments will be described herein with reference to the accompanying drawings, in which.

DETAILED DESCRIPTION OF THE EXEMPLARY EMBODIMENTS

Hereinafter, the exemplary embodiments will be described in more detail with reference to accompanying drawings.

Figure 1:
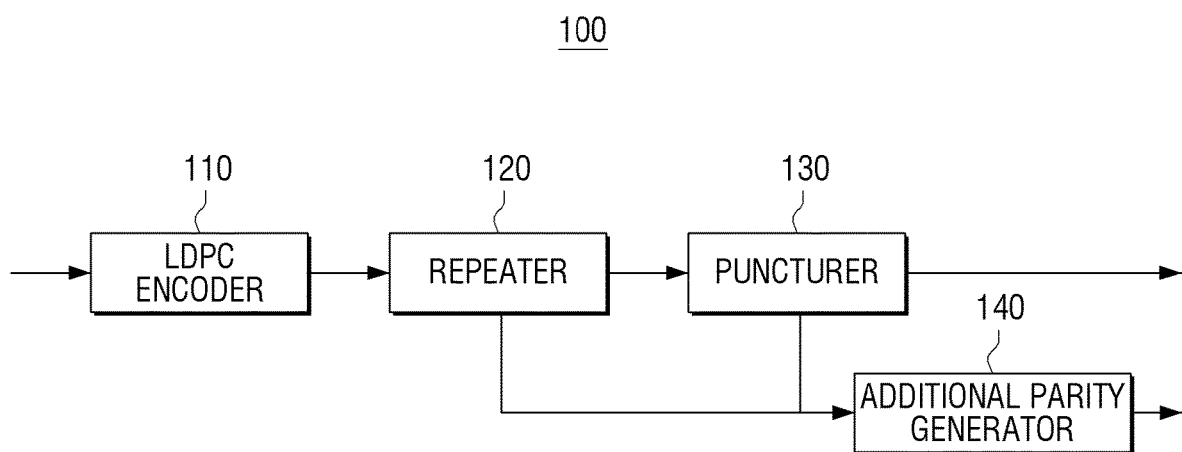
FIG. 1 is a block diagram for describing a configuration of a transmitter, according to an exemplary embodiment.

FIG. 1 is a block diagram illustrating a configuration of a transmitter according to an exemplary embodiment. Referring to FIG. 1, a transmitter 100 includes a Low Density Parity Check (LDPC) encoder 110, a repeater 120, a puncturer 130, and an additional parity generator 140.

The LDPC encoder 110 may encode input bits of a service which may include various data. In other words, the LDPC encoder 110 may perform LDPC encoding on the input bits to generate parity bits, that is, LDPC parity bits.

In detail, the input bits are LDPC information bits for the LDPC encoding and may include outer-encoded bits and zero bits (that is, bits having a 0 value). Here, the outer-encoded bits include information bits and parity bits (or parity check bits) generated by outer-encoding the information bits.

Figure 58:
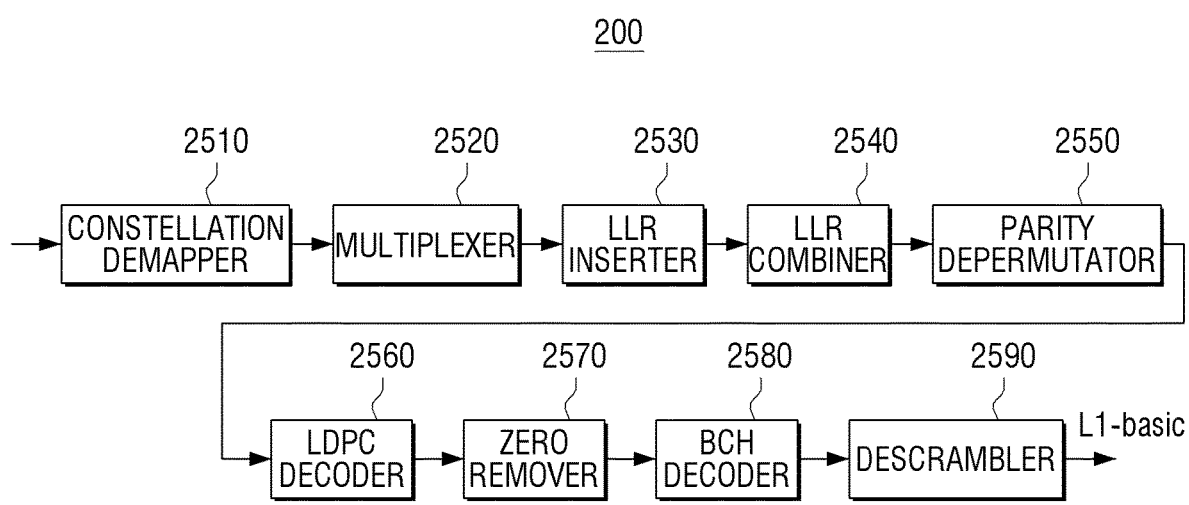
FIGS. 58 and 59 are block diagrams for describing configurations of a receiver, according to exemplary embodiments.
Figure 59:
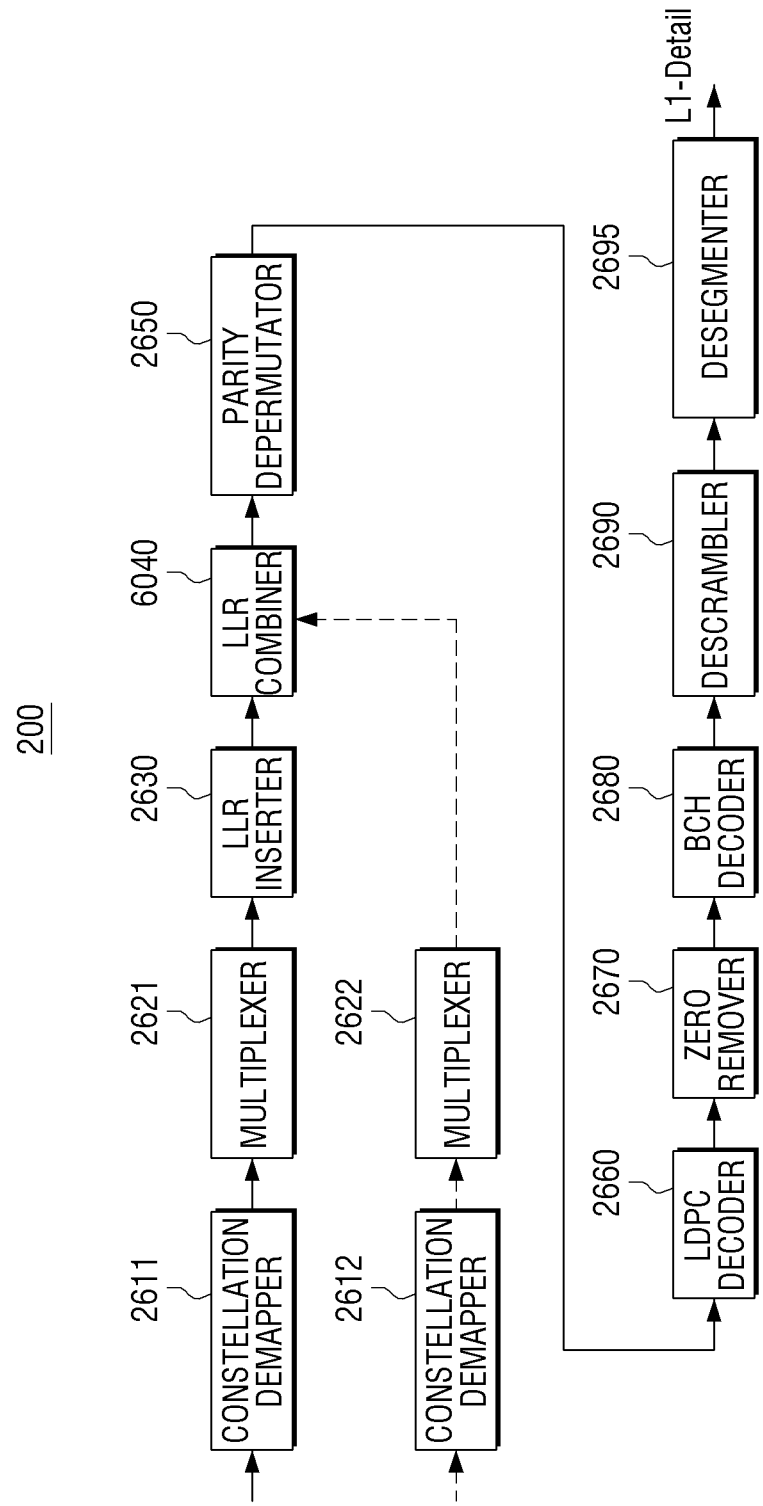

Here, the information bits may be signaling (alternatively referred to as "signaling bits" or "signaling information"). The signaling may include information required for a receiver 200 (as illustrated in FIG. 58 or 59) to process service data (for example, broadcasting data) transmitted from the transmitter 100.

The outer encoding is a coding operation which is performed before inner encoding in a concatenated coding operation, and may use various encoding schemes such as Bose, Chaudhuri, Hocquenghem (BCH) encoding and/or cyclic redundancy check (CRC) encoding. In this case, an inner code for inner encoding may be an LDPC code.

For LDPC encoding, a predetermined number of LDPC information bits depending on a code rate and a code length are required. Therefore, when the number of outer-encoded bits generated by outer-encoding the information bits is less than the required number of LDPC information bits, an appropriate number of zero bits are padded to obtain the required number of LDPC information bits for the LDPC encoding. Therefore, the outer-encoded bits and the padded zero bits may configure the LDPC information bits as many as the number of bits required for the LDPC encoding.

Since the padded zero bits are bits required to obtain the predetermined number of bits for the LDPC encoding, the padded zero bits are LDPC-encoded and then are not transmitted to the receiver 200. As such, a procedure of padding zerobits or a procedure of padding the zero bits and then not transmitting the padded zero bits to the receiver 200 may be referred to as shortening. In this case, the padded zero bits may be referred to as shortening bits (or shortened bits).

For example, it is assumed that the number of information bits is $K_{sig}$ and the number of bits when $M_{outer}$ parity bits are added to the information bits by the outer encoding, that is, the number of outer-encoded bits including the information bits and the parity bits is $N_{outer}(=K_{sig}+M_{outer})$.

In this case, when the number $N_{outer}$ of outer-encoded bits is less than the number $K_{ldpc}$ of LDPC information bits, $K_{ldpc}-N_{outer}$ zero bits are padded so that the outer-encoded bits and the padded zero bits may configure the LDPC information bits together.

The foregoing example describes that zero bits are padded, which is only one example.

When the information bits are signaling for data or a service data, a length of the information bits may vary depending on the amount of the data. Therefore, when the number of information bits is greater than the number of LDPC information bits required for the LDPC encoding, the information bits may be segmented below a predetermined value.

Therefore, when the number of information bits or the number of segmented information bits is less than the number obtained by subtracting the number of parity bits (that is, $M_{outer}$) generated by the outer encoding from the number of LDPC information bits, zero bits are padded as many as the number obtained by subtracting the number of outer-encoded bits from the number of LDPC information bits so that the LDPC information bits may be formed of the outer-encoded bits and the padded zero bits.

However, when the number of information bits or the number of segmented information bits are equal to the number obtained by subtracting the number of parity bits generated by outer encoding from the number of LDPC information bits, the LDPC information bits may be formed of the outer-encoded bits without padded zero bits.

The foregoing example describes that the information bits are outer-encoded, which is only one example. However, the information bits may not be outer-encoded and configure the LDPC information bits along with zero bits padded depending on the number of information bits or only the information bits may configure LDPC information bits without separately padding.

For convenience of explanation, outer encoding will be described below under an assumption that it is performed by BCH encoding.

In detail, the input bits will be described under an assumption that they include BCH-encoded bits and zero bits, the BCH-encoded bits including information bits and BCH parity-check bits (or BCH parity bits) generated by BCH-encoding the information bits.

That is, it is assumed that the number of the information bits is $K_{sig}$ and the number of bits when $M_{outer}$ BCH parity check bits by the BCH encoding are added to the information bits, that is, the number of BCH-encoded bits including the information bits and the BCH parity check bits is $N_{outer}$ $(=K_{sig}+M_{outer})$ Here, $M_{outer}=168$.

The foregoing example describes that zero bits, which will be shortened, are padded, which is only one example.

That is, since zero bits are bits having a value preset by the transmitter 100 and the receiver 200 and padded only to form LDPC information bits along with information bits including information to be substantially transmitted to the receiver 200, bits having another value (for example, 1) preset by the transmitter 100 and the receiver 200 instead of zero bits may be padded for shortening.

The LDPC encoder 110 may systematically encode LDPC information bits to generate LDPC parity bits, and output an LDPC codeword (or LDPC-encoded bits) formed of the LDPC information bits and the LDPC parity bits. That is, the LDPC code is a systematic code, and therefore, the LDPC codeword may be formed of the LDPC information bits before being LDPC-encoded and the LDPC parity bits generated by the LDPC encoding.

For example, the LDPC encoder 110 may LDPC-encode $K_{ldpc}$ LDPC information bits $i=(i_0, i_1, \ldots, i_{K_{ldpc}-1})$ to generate $N_{ldpc\_parity}$ LDPC parity bits $(p_0, p_1, \ldots, p_{N_{ldpc}-K_{ldpc}-1})$ and output an LDPC codeword $\Lambda=(c_0, c_1, \ldots, c_{N_{inner}-1})=(i_0, i_1, \ldots, i_{K_{ldpc}-1}, p_0, p_1, \ldots, p_{N_{inner}-K_{ldpc}-1})$ formed of $N_{inner}(=K_{ldpc}+N_{ldpc\_parity})$ bits.

In this case, the LDPC encoder 110 may perform the LDPC encoding on the input bits (i.e., LDPC information bits) at various code rates to generate an LDPC codeword having a predetermined length.

For example, the LDPC encoder 110 may perform LDPC encoding on 3240 input bits at a code rate of 3/15 to generate an LDPC codeword formed of 16200 bits. As another example, the LDPC encoder 110 may perform LDPC encoding on 6480 input bits at a code rate of 6/15 to generate an LDPC codeword formed of 16200 bits.

A process of performing LDPC encoding is a process of generating an LDPC codeword to satisfy $H \cdot C^T=0$, and thus, the LDPC encoder 110 may use a parity check matrix to perform the LDPC encoding. Here, H represents the parity check matrix and C represents the LDPC codeword.

Hereinafter, a structure of the parity check matrix according to various exemplary embodiments will be described with reference to the accompanying drawings. In the parity check matrix, elements of a portion other than 1 are 0.

Figure 2:
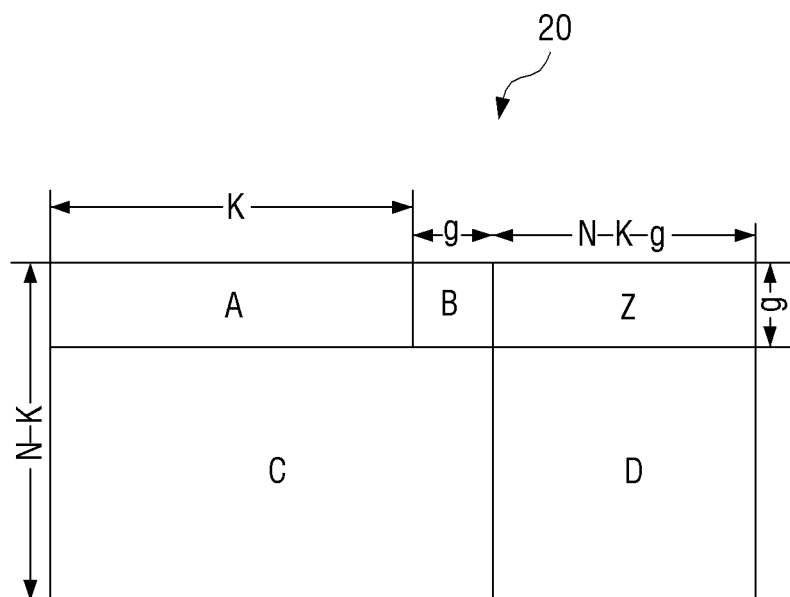
FIGS. 2 and 3 are diagrams for describing a parity check matrix, according to exemplary embodiments.

For example, the parity check matrix according to an exemplary embodiment may have a structure as illustrated in FIG. 2.

Referring to FIG. 2, a parity check matrix 20 may be formed of five sub-matrices A, B, C, Z and D. Hereinafter, for describing the structure of the parity check matrix 20, each matrix structure will be described.

The sub-matrix A is formed of K columns and g rows, and the sub-matrix C is formed of K+g columns and N−K−g rows. Here, K (or $K_{ldpc}$) represents a length of LDPC information bits and N (or $N_{inner}$) represents a length of an LDPC codeword.

Further, in the sub-matrices A and C, indexes of a row in which 1 is positioned in a 0-th column of an i-th column group may be defined based on Table 1 when the length of the LDPC codeword is 16200 and the code rate is 3/15. The number of columns belonging to a same column group may be 360.

TABLE 1

8 372 841 4522 5253 7430 8542 9922 10550 11896 11988
80 255 667 1511 3549 5239 5422 5497 7157 7654 11267
257 405 792 2916 3072 3214 3638 4090 8175 8892 9003
80 150 346 1883 6838 7818 9482 10366 10514 11468 12341
32 100 978 3493 6751 7787 8496 10170 10318 10451 12561
504 803 856 2048 6775 7631 8110 8221 8371 9443 10990

TABLE 1-continued 152 283 696 1164 4514 4649 7260 7370 11925 11986 12092
127 1034 1044 1842 3184 3397 5931 7577 11898 12339 12689
107 513 979 3934 4374 4658 7286 7809 8830 10804 10893
2045 2499 7197 8887 9420 9922 10132 10540 10816 11876
2932 6241 7136 7835 8541 9403 9817 11679 12377 12810
2211 2288 3937 4310 5952 6597 9692 10445 11064 11272

Hereinafter, positions (alternatively referred to as "indexes" or "index values") of a row in which 1 is positioned in the sub-matrices A and C will be described in detail with reference to, for example, Table 1.

When the length of an LDPC codeword is 16,200 and the code rate is 3/15, coding parameters $M_1$, $M_2$, $Q_1$ and $Q_2$ based on the parity check matrix 200 each are 1080, 11880, 3 and 33.

Here, $Q_1$ represents a size at which columns belonging to a same column group in the sub-matrix A are cyclic-shifted, and $Q_2$ represents a size at which columns belonging to a same column group in the sub-matrix C are cyclic-shifted.

Further, $Q_1=M_1/L$, $Q_2=M_2/L$, $M_1=g$, $M_2=N-K-g$ and L represents an interval at which patterns of a column are repeated in the sub-matrices A and C, respectively, that is, the number (for example, 360) of columns belonging to a same column group.

The indexes of the row in which 1 is positioned in the sub-matrices A and C, respectively, may be determined based on an $M_1$ value.

For example, in above Table 1, since $M_1=1080$, the position of a row in which 1 is positioned in a 0-th column of an i-th column group in the sub-matrix A may be determined based on values less than 1080 among index values of above Table 1, and the position of a row in which 1 is positioned in a 0-th column of an i-th column group in the sub-matrix C may be determined based on values equal to or greater than 1080 among the index values of above Table 1.

In detail, a sequence corresponding to a 0-th column group in above Table 1 is "8 372 841 4522 5253 7430 8542 9822 10550 11896 11988". Therefore, in a 0-th column of a 0-th column group in the sub-matrix A, 1 may be positioned in an eighth row, a 372-th row, and an 841-th row, respectively, and in a 0-th column of a 0-th column group in the sub-matrix C, 1 may be positioned in a 4522-th row, a 5253-th row, a 7430-th row, an 8542-th row, a 9822-th row, a 10550-th row, a 11896-th row, and a 11988-row, respectively.

In the sub-matrix A, when the position of 1 is defined in a 0-th columns of each column group, it may be cyclic-shifted by $Q_1$ to define a position of a row in which 1 is positioned in other columns of each column group, and in the sub-matrix C, when the position of 1 is defined in a 0-th columns of each column group, it may be cyclic-shifted by $Q_2$ to define a position of a row in which 1 is positioned in other columns of each column group.

In the foregoing example, in the 0-th column of the 0-th column group in the sub-matrix A, 1 is positioned in an eighth row, a 372-th row, and an 841-th row. In this case, since $Q_1=3$, indexes of a row in which 1 is positioned in a first column of the 0-th column group may be 11(=8+3), 375(=372+3), and 844(=841+3) and indexes of a row in which 1 is positioned in a second column of the 0-th column group may be 14(=11+3), 378(=375+3), and 847(=844+3).

In a 0-th column of a 0-th column group in the sub-matrix C, 1 is positioned in a 4522-th row, a 5253-th row, a 7430-th row, an 8542-th row, a 9822-th row, a 10550-th row, a 11896-th row, and a 11988-th row. In this case, since $Q_2=33$, the indexes of the row in which 1 is positioned in a first column of the 0-th column group may be 4555(=4522+33), 5286(=5253+33), 7463(=7430+33), 8575(=8542+33), 9855 (=9822+33) 10583(=10550+33), 11929(=11896+33), and 12021(=11988+33) and the indexes of the row in which 1 is positioned in a second column of the 0-th column group may be 4588(=4555+33), 5319(=5286+33), 7496(=7463+33), 8608(=8575+33), 9888(=9855+33), 10616(=10583+33), 11962(=11929+33), and 12054(=12021+33).

According to the scheme, the positions of the row in which 1 is positioned in all the column groups in the sub-matrices A and C may be defined.

The sub-matrix B is a dual diagonal matrix, the sub-matrix D is an identity matrix, and the sub-matrix Z is a zero matrix.

As a result, the structure of the parity check matrix 20 as illustrated in FIG. 2 may be defined by the sub-matrices A, B, C, D and Z having the above structure.

Hereinafter, a method for performing, by the LDPC encoder 110, LDPC encoding based on the parity check matrix 20 as illustrated in FIG. 2 will be described.

An LDPC code may be used to encode an information block $S=(s_0, s_1, \ldots, s_{K-1})$. In this case, to generate an LDPC codeword $\Lambda=(\lambda_0, \lambda_1, \ldots, \lambda_{N-1})$ having a length of $N=K+M_1+M_2$, parity blocks $P=(p_0, p_1, \ldots, p_{M_1+M_2-1})$ from the information block S may be systematically encoded.

As a result, the LDPC codeword may be $\Lambda=(s_0, s_1, \ldots, s_{K-1}, p_0, p_1, \ldots, p_{M_1+M_2-1})$.

Here, $M_1$ and $M_2$ each represent a size of parity sub-matrices corresponding to the dual diagonal sub-matrix B and the identity matrix sub-D, respectively, in which $M_1=g$ and $M_2=N-K-g$.

A process of calculating parity bits may be represented as follows. Hereinafter, for convenience of explanation, a case in which the parity check matrix 20 is defined as above Table 1 will be described as one example.

Step 1) $\lambda_i$ is initialized to be $s_i$ (i=0, 1, \ldots, K−1) and $p_j$ is initialized to be 0 (j=0, 1, \ldots, $M_1+M_2-1$).

Step 2) A first information bit $\lambda_0$ is accumulated in a parity bit address defined in the first row of above Table 1.

Step 3) For the next L−1 information bits $\lambda_m$ (m=1, 2, \ldots, L−1), $\lambda_m$ is accumulated in the parity bit address calculated based on following Equation 1.

$(x+m \times Q_1) \bmod M_1 (\text{if } x<M_1)$ $M_1+\{(x-M_1+m \times Q_2) \bmod M_2\} (\text{if } x \geq M_1)$ (1)

In above Equation 1, x represents an address of a parity bit accumulator corresponding to a first information bit $\lambda_0$. Further, $Q_1=M_1/L$ and $Q_2=M_2/L$.

In this case, since the length of the LDPC codeword is 16200 and the code rate is 3/15, $M_1=1080$, $M_2=11880$, $Q_1=3$, $Q_2=33$, $L=360$.

Step 4) Since the parity bit address like the second row of above Table 1 is given to an L-th information bit $\lambda_L$, similar to the foregoing scheme, the parity bit address for next L−1 information bits $\lambda_m$ (m=L+1, L+2, \ldots, 2L−1) is calculated by the scheme described in the above step 3. In this case, x represents the address of the parity bit accumulator corresponding to the information bit $\lambda_L$ and may be obtained based on the second row of above Table 1.

Step 5) For L new information bits of each group, the new rows of above Table 1 are set as the address of the parity bit accumulator, and thus, the foregoing process is repeated.

Step 6) After the foregoing process is repeated from the codeword bit $\lambda_0$ to $\lambda_{K-1}$, a value for following Equation 2 is sequentially calculated from i=1.

$p_i = p_i \oplus p_{i-1}$ (i=1,2, \ldots, $M_1$−1) (2)

Step 7) The parity bits $\lambda_K$ to $\lambda_{K+M_1-1}$ corresponding to the dual diagonal sub-matrix B are calculated based on following Equation 3.

$\lambda_{K+L \times t+s} = p_{Q_1 \times s+t}$ (0≤s<L, 0≤t<$Q_1$) (3)

Step 8) The address of the parity bit accumulator for the L new codeword bits $\lambda_K$ to $\lambda_{K+M_1-1}$ of each group is calculated based on the new row of above Table 1 and above Equation 1.

Step 9) After the codeword bits $\lambda_K$ to $\lambda_{K+M_1-1}$ are applied, the parity bits $\lambda_{K+M_1}$ to $\lambda_{K+M_1 M_2-1}$ corresponding to the sub-matrix D are calculated based on following Equation 4.

$\lambda_{K+M_1+L \times t+s} = p_{M_1+Q_1 \times s+t}$ (0≤s<L, 0≤t<$Q_2$) (4)

As a result, the parity bits may be calculated by the above scheme. However, this is only one example, and therefore, the scheme for calculating the parity bits based on the parity check matrix as illustrated in FIG. 2 may be variously defined.

As such, the LDPC encoder 110 may perform the LDPC encoding based on above Table 1 to generate the LDPC codeword.

In detail, the LDPC encoder 110 may perform the LDPC encoding on 3240 input bits, that is, the LDPC information bits at the code rate of 3/15 based on above Table 1 to generate 12960 LDPC parity bits, and output the LDPC parity bits and the LDPC codeword including the LDPC parity bits. In this case, the LDPC codeword may be formed of 16200 bits.

Figure 3:
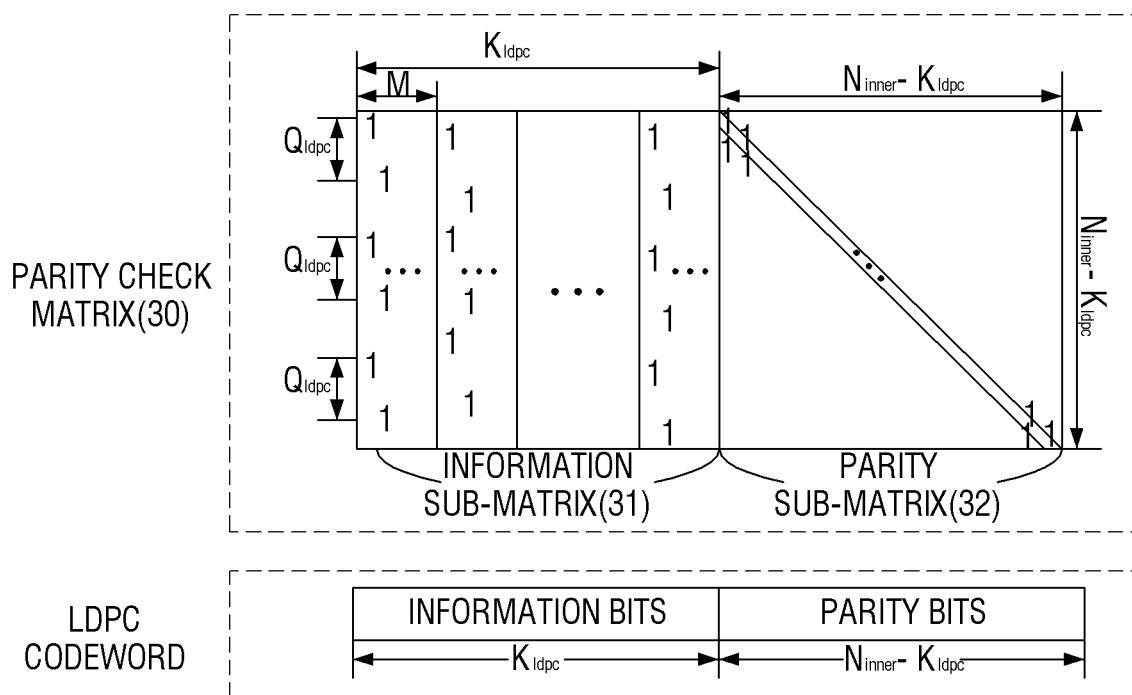

As another example, the parity check matrix according to an exemplary embodiment may have a structure as illustrated in FIG. 3.

Referring to FIG. 3, a parity check matrix 30 is formed of an information sub-matrix 31 which is a sub-matrix corresponding to the information bits (that is, LDPC information bits) and a parity sub-matrix 32 which is a sub-matrix corresponding to the parity bits (that is, LDPC parity bits).

The information sub-matrix 31 includes $K_{ldpc}$ columns and the parity sub-matrix 32 includes $N_{ldpc\_parity}=N_{inner}-K_{ldpc}$ columns. The number of rows of the parity check matrix 30 is equal to the number $N_{ldpc\_parity}=N_{inner}-K_{ldpc}$ of columns of the parity sub-matrix 32.

Further, in the parity check matrix 30, $N_{inner}$ represents the length of the LDPC codeword, $K_{ldpc}$ represents the length of the information bits, and $N_{ldpc\_parity}=N_{inner}-K_{ldpc}$ represents the length of the parity bits.

Hereinafter, the structures of the information sub-matrix 31 and the parity sub-matrix 32 will be described.

The information sub-matrix 31 is a matrix including the $K_{ldpc}$ columns (that is, 0-th column to ($K_{ldpc}$−1)-th column) and depends on the following rule.

First, the $K_{ldpc}$ columns configuring the information sub-matrix 31 belong to the same group by M numbers and are divided into a total of $K_{ldpc}$/M column groups. The columns belonging to the same column group have a relationship that they are cyclic-shifted by $Q_{ldpc}$ from one another. That is, $Q_{ldpc}$ may be considered as a cyclic shift parameter value for columns of the column group in the information sub-matrix configuring the parity check matrix 30.

Here, M represents an interval (for example, M=360) at which the pattern of columns in the information sub-matrix 31 is repeated and $Q_{ldpc}$ is a size at which each column in the information sub-matrix 31 is cyclic-shifted. M is a common divisor of $N_{inner}$ and $K_{ldpc}$, and is determined so that $Q_{ldpc}=(N_{inner}-K_{ldpc})/M$ is established. Here, M and $Q_{ldpc}$ are integers and $K_{ldpc}/M$ also becomes an integer. M and $Q_{ldpc}$ may have various values depending on the length of the LDPC codeword and the code rate.

For example, when M=360, the length $N_{inner}$ of the LDPC codeword is 16200, and the code rate is 6/15, $Q_{ldpc}$ may be 27.

Second, if a degree (herein, the degree is the number of values is positioned in a column and the degrees of all columns belonging to a same column group are the same) of a 0-th column of an i-th (i=0, 1, . . . , $K_{ldpc}/M-1$) column group is set to be $D_i$ and positions (or index) of each row in which 1 is positioned in the 0-th column of the i-th column group is set to be $R_{i,0}^{(0)}, R_{i,0}^{(1)}, \ldots R_{i,0}^{(D_i-1)}$, an index $R_{i,j}^{(k)}$ of a row in which a k-th 1 is positioned in a j-th column in the i-th column group is determined based on following Equation 5.

$$R_{i,j}^{(k)}=R_{i,(j-1)}^{(k)}+Q_{ldpc} \bmod(N_{inner}-K_{ldpc}) \quad (5)$$

In above Equation 5, k=0, 1, 2, . . . , $D_i-1$; i=0, 1, . . . , $K_{ldpc}/M-1$; j=1, 2, . . . , M-1.

Above Equation 5 may be represented like following Equation 6.

$$R_{i,j}^{(k)}=(R_{i,0}^{(k)}+(j \bmod M)\times Q_{ldpc})\bmod(N_{inner}-K_{ldpc}) \quad (6)$$

In above Equation 6, k=0, 1, 2, . . . , $D_i-1$; i=0, 1, . . . , $K_{ldpc}/M-1$; j=1, 2, . . . , M-1. In above Equation 6, since j=1, 2, . . . , M-1, (j mod M) may be considered as j.

In these Equations, $R_{i,j}^{(k)}$ represents the index of a row in which a k-th 1 is positioned in a j-th column in an i-th column group, $N_{inner}$ represents the length of an LDPC codeword, $K_{ldpc}$ represents the length of information bits, $D_i$ represents the degree of columns belonging to the i-th column group, M represents the number of columns belonging to one column group, and $Q_{ldpc}$ represents the size at which each column is cyclic-shifted.

As a result, referring to the above Equations, if a $R_{i,0}^{(k)}$ value is known, the index $R_{i,j}^{(k)}$ of the row in which the k-th 1 is positioned in the j-th column in the i-th column group may be known. Therefore, when the index value of the row in which the k-th 1 is positioned in a 0-th columns of each column group is stored, the positions of the column and the row in which 1 is positioned in the parity check matrix 30 (that is, information sub-matrix 31 of the parity check matrix 30) having the structure of FIG. 3 may be checked.

According to the foregoing rules, all degrees of columns belonging to the i-th column group are $D_i$. Therefore, according to the foregoing rules, an LDPC code in which the information on the parity check matrix is stored may be briefly represented as follows.

For example, when $N_{inner}$ is 30, $K_{ldpc}$ is 15, and $Q_{ldpc}$ is 3, positional information of the row in which 1 is positioned in 0-th columns of three column groups may be represented by sequences as following Equation 7, which may be named 'weight-1 position sequence'.

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \quad (7)$$

In above Equation 7, $R_{i,j}^{(k)}$ represents the indexes of the row in which the k-th 1 is positioned in the j-th column of the i-th column group.

The weight-1 position sequences as above Equation 7 representing the index of the row in which 1 is positioned in the 0-th columns of each column group may be more briefly represented as following Table 2.

TABLE 2

1 2 8 10
0 9 13
0 14

Above Table 2 represents positions of elements having a value 1 in the parity check matrix and the i-th weight-1 position sequence is represented by the indexes of the row in which 1 is positioned in the 0-th column belonging to the i-th column group.

The information sub-matrix 31 of the parity check matrix according to the exemplary embodiment described above may be defined based on following Table 3.

Here, following Table 3 represents the indexes of the row in which 1 is positioned in a 0-th column of an i-th column group in the information sub-matrix 31. That is, the information sub-matrix 31 is formed of a plurality of column groups each including M columns and the positions of is in 0-th columns of each of the plurality of column groups may be defined as following Table 3.

For example, when the length $N_{inner}$ of the LDPC codeword is 16200, the code rate is 6/15, and the M is 360, the indexes of the row in which 1 is positioned in the 0-th column of the i-th column group in the information sub-matrix 31 are as following Table 3.

TABLE 3

27 430 519 828 1897 1943 2513 2600 2640 3310 3415 4266 5044 5100
5328 5483 5928 6204 6392 6416 6602 7019 7415 7623 8112 8485 8724
8994 9445 9667
29 174 188 631 1172 1427 1779 2217 2270 2601 2813 3196 3582 3895
3908 3948 4463 4955 5120 5809 5988 6478 6604 7096 7673 7735 7795
8925 9613 9670
27 370 617 852 910 1030 1326 1521 1606 2118 2248 2909 3214 3413
3623 3742 3752 4317 4694 5300 5687 6039 6100 6232 6491 6621 6860
7304 8542 8634
990 1753 7695 8540
933 1415 5666 8745
27 6567 8707 9216
2341 8692 9580 9615
260 1092 5839 6080
352 3750 4847 7726
4610 6580 9506 9597
2512 2974 4814 9348
1461 4021 5060 7009
1796 2883 5553 8306
1249 5422 7057
3965 6968 9422
1498 2931 3092
27 2090 6215
26 232 6354

According to another exemplary embodiment, a parity check matrix in which an order of indexes in each sequence corresponding to each column group in above Table 3 is changed is considered as a same parity check matrix for an LDPC code as the above described parity check matrix is another example of the inventive concept.

According to still another exemplary embodiment, a parity check matrix in which an array order of the sequences of the column groups in above Table 3 is changed is also considered as a same parity check matrix as the above described parity check matrix in that they have a same algebraic characteristics such as cycle characteristics and degree distributions on a graph of a code.

According to yet another exemplary embodiment, a parity check matrix in which a multiple of $Q_{ldpc}$ is added to all indexes of a sequence corresponding to column group in above Table 3 is also considered as a same parity check matrix as the above described parity check matrix in that they have a same cycle characteristics and degree distributions on the graph of the code. Here, it is to be noted that when a value obtained by adding the multiple of $Q_{ldpc}$ to a given sequence is equal to or more than $N_{inner}-K_{ldpc}$, the value needs to be changed into a value obtained by performing a modulo operation on the $N_{inner}-K_{ldpc}$ and then applied.

If the position of the row in which 1 is positioned in the 0-th column of the i-th column group in the information sub-matrix 31 as shown in above Table 3 is defined, it may be cyclic-shifted by $Q_{ldpc}$, and thus, the position of the row in which 1 is positioned in other columns of each column group may be defined.

For example, as shown in above Table 3, since the sequence corresponding to the 0-th column of the 0-th column group of the information sub-matrix 31 is "27 430 519 828 1897 1943 2513 2600 2640 3310 3415 4266 5044 5100 5328 5483 5928 6204 6392 6416 6602 7019 7415 7623 8112 8485 8724 8994 9445 9667", in the 0-th column of the 0-th column group in the information sub-matrix 31, 1 is positioned in a 27-th row, a 430-th row, a 519-th-row, . . . .

In this case, since $Q_{ldpc}=(N_{inner}-K_{ldpc})/M=(16200-6480)/360=27$, the indexes of the row in which 1 is positioned in the first column of the 0-th column group may be 54(=27+27), 457(=430+27), 546(=519+27), 81(=54+27), 484(=457+27), 573(=546+27), . . . .

By the above scheme, the indexes of the row in which 1 is positioned in all the rows of each column group may be defined.

Hereinafter, the method for performing LDPC encoding based on the parity check matrix 30 as illustrated in FIG. 3 will be described.

First, information bits to be encoded are set to be $i_0, i_1, \ldots, i_{K_{ldpc}-1}$, and code bits output from the LDPC encoding are set to be $c_0, c_1, \ldots, c_{N_{ldpc}-1}$.

Further, since an LDPC code is systematic, for k $(0 \leq k < K_{ldpc}-1)$, $c_k$ is set to be $i_k$. The remaining code bits are set to be $p_k := c_{k+K_{ldpc}}$.

Hereinafter, a method for calculating parity bits $p_k$ will be described.

Hereinafter, $q(i,j,0)$ represents a j-th entry of an i-th row in an index list as above Table 3, and $q(i,j,1)$ is set to be $q(i,j,1)=q(i, j, 0)+Q_{ldpc} \times 1 \pmod{N_{inner}-K_{ldpc}}$ for $0 < i < 360$. All the accumulations may be realized by additions in a Galois field (GF) (2). Further, in above Table 3, since the length of the LDPC codeword is 16200 and the code rate is 6/15, the $Q_{ldpc}$ is 27.

When the $q(i,j,0)$ and the $q(i,j,1)$ are defined as above, a process of calculating the parity bit is as follows.

Step 1) The parity bits are initialized to '0'. That is, $p_k=0$ for $0 \leq k < N_{inner}-K_{ldpc}$.

Step 2) For all k values of $0 \leq k < K_{ldpc}$, i and l are set to be $i:=\lfloor k/360 \rfloor$ and $l:=k \pmod{360}$. Here, $\lfloor x \rfloor$ is a maximum integer which is not greater than x.

Next, for all i, $i_k$ is accumulated in $p_{q(i,j,l)}$. That is, $p_{q(i,0,l)}=p_{q(i,0,l)}+i_k$, $p_{q(i,1,l)}=p_{q(i,1,l)}+i_k$, $p_{q(i,2,l)}=p_{q(i,2,l)}+i_k, \ldots, p_{q(i,w(i)-1,l)}=p_{q(i,w(i)-1,l)}+i_k$ are calculated.

Here, w(i) represents the number of the values (elements) of an i-th row in the index list as above Table 3 and represents the number of is in a column corresponding to $i_k$ in the parity check matrix. Further, in above Table 3, q(i, j, 0) which is a j-th entry of an i-th row is an index of a parity bit and represents the position of the row in which 1 is positioned in a column corresponding to $i_k$ in the parity check matrix.

In detail, in above Table 3, q(i,j,0) which is the j-th entry of the i-th row represents the position of the row in which 1 is positioned in the first (that is, 0-th) column of the i-th column group in the parity check matrix of the LDPC code.

The q(i, j, 0) may also be considered as the index of the parity bit to be generated by LDPC encoding according to a method for allowing a real apparatus to implement a scheme for accumulating $i_k$ in $p_{q(i,j,1)}$ for all i, and may also be considered as an index in another form when another encoding method is implemented. However, this is only one example, and therefore, it is apparent to obtain an equivalent result to an LDPC encoding result which may be obtained from the parity check matrix of the LDPC code which may basically be generated based on the q(i,j,0) values of above Table 3 whatever the encoding scheme is applied.

Step 3) A parity bit $p_k$ is calculated by calculating $p_k=p_k+p_{k-1}$ for all k satisfying $0 < k < N_{inner}-K_{ldpc}$.

Accordingly, all code bits $c_0, c_1, \ldots, c_{N_{ldpc}-1}$ may be obtained.

As a result, parity bits may be calculated by the above scheme. However, this is only one example, and therefore, the scheme for calculating the parity bits based on the parity check matrix as illustrated in FIG. 3 may be variously defined.

As such, the LDPC encoder 110 may perform LDPC encoding based on above Table 3 to generate an LDPC codeword.

In detail, the LDPC encoder 110 may perform the LDPC encoding on 6480 input bits, that is, the LDPC information bits at the code rate of 6/15 based on above Table 3 to generate 9720 LDPC parity bits and output LDPC parity bits and an LDPC codeword including the LDPC parity bits. In this case, the LDPC codeword may be formed of 16200 bits.

As described above, the LDPC encoder 110 may encode input bits at various code rates to generate an LDPC codeword formed of the input bits and the LDPC parity bits.

The repeater 120 repeats at least some bits of the LDPC codeword in the LDPC codeword so that these bits of the LDPC codeword are repeated in a current frame to be transmitted. Here, the bits repeated in the LDPC codeword are referred to as repetition bits or repeated bits. Further, the repeater 120 may output to the puncture 130 the repeated LDPC codeword, that is, an LDPC codeword with repetition which refers to the LDPC codeword bits including the repetition bits. Further, the repeater 120 may output the LDPC codeword with repetition to the additional parity generator 140 and provide the repetition information (for example, the number, position, etc., of the repetition bits) to the additional parity generator 140.

In detail, the repeater 120 may repeat a predetermined number of LDPC codeword bits (for example, $N_{repeat}$ LDPC parity bits) at a predetermined position within the LDPC codeword. In this case, the number of repetition bits may have various values depending on a system including the transmitter 100 and/or the receiver 200.

For example, the repeater 120 may add the predetermined number of LDPC parity bits after the LDPC information bits within the LDPC codeword including the LDPC information bits and the LDPC parity bits. That is, the repeater 120 may add at least some of the parity bits after the input bits, that is, the LDPC information bits.

Further, the repeater 120 may add the predetermined number of LDPC parity bits after the LDPC parity bits, add it to a predetermined position between the LDPC information bits, or add it to a predetermined position between the LDPC parity bits.

Therefore, since the predetermined number of LDPC parity bits within the LDPC codeword with repetition may be repeated and additionally transmitted to the receiver 200, the foregoing operation may be referred to as repetition.

Hereinafter, an example in which bits are repeated according to various exemplary embodiments will be described with reference to the accompanying drawings.

When a number $N_{repeat}$ of bits to be repeated is equal to or less than the number of LDPC parity bits in the LDPC codeword, the repeater 120 may add $N_{repeat}$ bits of the LDPC parity bits, from a first LDPC parity bit, after the LDPC information bits.

Figure 4:
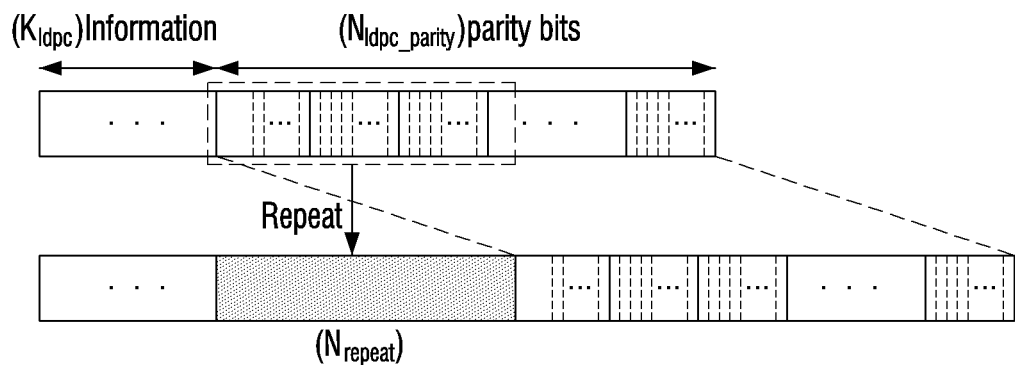
FIGS. 4 to 7 are block diagrams for describing repetition, according to exemplary embodiments.

For example, when $N_{repeat}$ is equal to or less than $N_{ldpc\_parity}$, that is, when $N_{repeat} \leq N_{ldpc\_parity}$, as illustrated in FIG. 4, the repeater 120 may add first $N_{repeat}$ bits ($p_0$, $p_1$, ..., $p_{N_{repeat}-1}$) of LDPC parity bits ($p_0$, $p_1$, ..., $p_{N_{ldpc}-K_{ldpc}-1}$) after LDPC information bits ($i_0$, $i_1$, ..., $i_{K_{ldpc}-1}$).

Therefore, the first bit to the $N_{repeat}$-th bit among the LDPC parity bits are added after the LDPC information bits, and the $N_{repeat}$ bits are positioned between the LDPC information bits and the LDPC parity bits like ($i_0$, $i_1$, $i_{K_{ldpc}-1}$, $p_0$, $p_1$, ..., $p_{N_{repeat}-1}$, $p_0$, $p_1$, ..., $p_{N_{ldpc}-K_{ldpc}-1}$).

When the number $N_{repeat}$ of bits to be repeated is greater than the number of LDPC parity bits, the repeater 120 may add all the LDPC parity bits as a part of repetition bits after the LDPC information bits, add bits as many as the number obtained by subtracting the number of LDPC parity bits from the number of repetition bits from the first LDPC parity bit after the earlier added LDPC parity bits.

In this case, the repeater 120 may additionally add bits as many as the number obtained by subtracting the number of LDPC parity bits from the number of repetition bits from the first bit of the existing LDPC parity bits, that is, the LDPC parity bits generated by the LDPC encoding, not from the repeated LDPC parity bits, after the first added LDPC parity bits.

Figure 5:
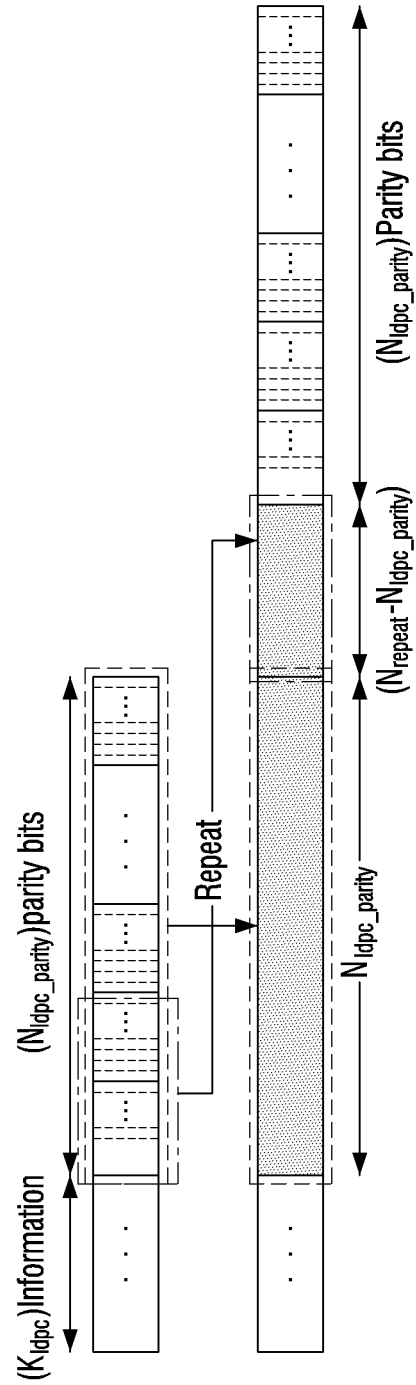

For example, when $N_{repeat}$ is greater than $N_{ldpc\_parity}$, that is, when $N_{repeat} > N_{ldpc\_parity}$, as illustrated in FIG. 5, the repeater 120 adds $N_{ldpc\_parity}$ LDPC parity bits ($p_0$, $p_1$, $p_{N_{ldpc}-K_{ldpc}-1}$), as a part of the repetition bits, after the LDPC information bits ($i_0$, $i_1$, ..., $i_{K_{ldpc}-1}$). Further, the repeater 120 may additionally add $N_{repeat}-N_{ldpc\_parity}$ bits ($p_0$, $p_1$, ..., $p_{N_{repeat}-N_{ldpc\_parity}-1}$) of the LDPC parity bits after the earlier added $N_{ldpc\_parity}$ LDPC parity bits.

Therefore, $N_{ldpc\_parity}$ LDPC parity bits may be added after the LDPC information bits and $N_{repeat}-N_{ldpc\_parity}$ bits from the first bit of the LDPC parity bits may be additionally added after the earlier added $N_{ldpc\_parity}$ LDPC parity bits.

Therefore, $N_{repeat}$ bits are positioned between the LDPC information bits and the LDPC parity bits, like ($i_0$, $i_1$, ..., $i_{K_{ldpc}-1}$, $p_0$, $p_1$, ..., $p_{N_{ldpc}-K_{ldpc}-1}$, $p_0$, $p_1$, ..., $p_{N_{repeat}-N_{ldpc\_parity}-1}$, $p_0$, $p_1$, ..., $p_{N_{ldpc}-K_{ldpc}-1}$).

The foregoing example describes that the repetition bits are added after the LDPC information bits, which is only an example. According to another exemplary embodiment, the repeater 120 may add the repetition bits after the LDPC parity bits.

Figure 6:
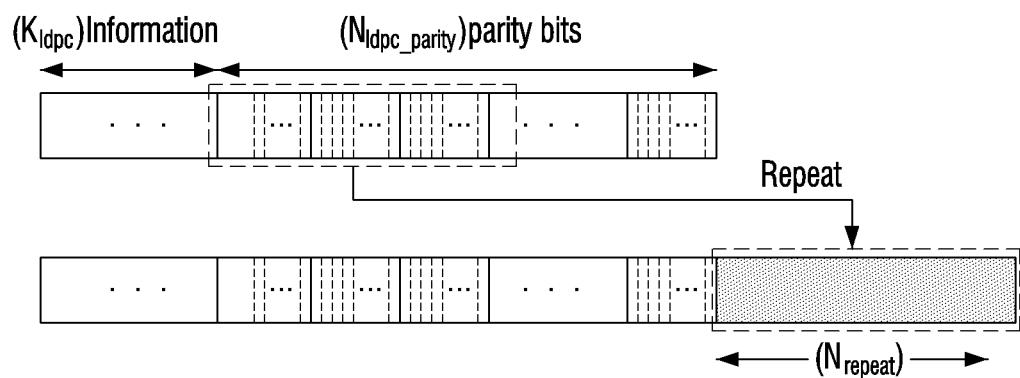

For example, when $N_{repeat}$ is equal to or less than $N_{ldpc\_parity}$, that is, when $N_{repeat} \leq N_{ldpc\_parity}$, as illustrated in FIG. 6, the repeater 120 may add $N_{repeat}$ bits ($p_0$, $p_1$, ..., $p_{N_{repeat}-1}$) of the LDPC parity bits after LDPC parity bits ($p_0$, $p_1$, ..., $p_{N_{ldpc}-K_{ldpc}-1}$).

Therefore, the first bit to $N_{repeat}$-th bit among the LDPC parity bits are added after the LDPC parity bits, and the $N_{repeat}$ bits are positioned after the LDPC parity bits like ($i_0$, $i_1$, ..., $i_{K_{ldpc}-1}$, $p_0$, $p_1$, ..., $p_{N_{ldpc}-K_{ldpc}-1}$, $p_0$, $p_1$, ..., $p_{N_{repeat}-1}$).

Figure 7:
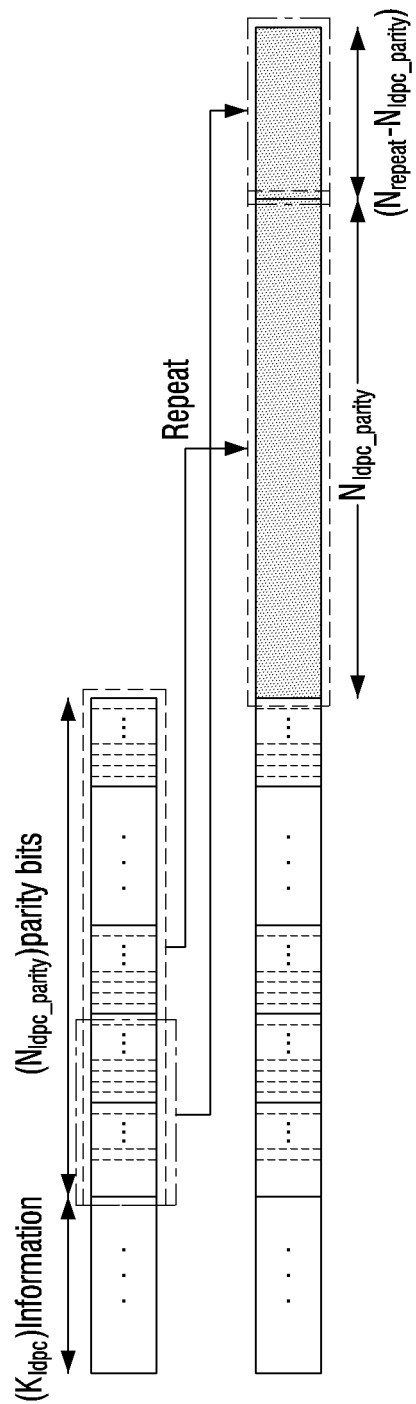

Further, when $N_{repeat}$ is greater than $N_{ldpc\_parity}$, that is, when $N_{repeat} > N_{ldpc\_parity}$, as illustrated in FIG. 7, the repeater 120 may add the $N_{ldpc\_parity}$ LDPC parity bits ($p_0$, $p_1$, $p_{N_{ldpc}-K_{ldpc}-1}$) after the LDPC parity bits generated from the LDPC encoding. Further, the repeater 120 may additionally add the first $N_{repeat}-N_{ldpc\_parity}$ bits ($p_0$, $p_1$, ..., $p_{N_{repeat}-N_{ldpc\_parity}-1}$) of the LDPC parity bits after the added $N_{ldpc\_parity}$ LDPC parity bits.

Therefore, $N_{ldpc\_parity}$ LDPC parity bits may be added after the LDPC party bits as a part of repetition bits, and $N_{repeat}-N_{ldpc\_parity}$ bits of the LDPC parity bits may be additionally added as the other part of the repetition bits after the earlier added $N_{ldpc\_parity}$ LDPC parity bits.

Therefore, in the form of ($i_0$, $i_1$, ..., $p_0$, $p_1$, ..., $p_{N_{ldpc}-K_{ldpc}-1}$, $p_0$, $p_1$, ..., $p_{N_{ldpc}-K_{ldpc}-1}$, $p_0$, $p_1$, ..., $p_{N_{repeat}-N_{ldpc\_parity}-1}$), the $N_{repeat}$ bits $i_{K_{ldpc}-1}$ are positioned after the LDPC parity bits.

The foregoing example describes that LDPC parity bits of a front portion are repeated, which is only an example. According to another exemplary embodiment, the repeater 120 may repeat the LDPC parity bits present at various positions such as a back portion and a middle portion of the LDPC parity bits.

The foregoing example describes that only LDPC parity bits in an LDPC codeword are repeated, which is only an example. According to another exemplary embodiment, LDPC information bits or some of the LDPC information bits and some of the LDPC parity bits may also be repeated.

The foregoing example describes that the repetition is performed, which is only an example. In some cases, the repetition may also be omitted. In this case, some of LDPC parity bits included in an LDPC codeword may be punctured by the puncturer 130 to be described below. It may be previously determined whether to perform the repetition depending on a system.

The puncturer 130 may puncture some bits from LDPC parity bits in an LDPC codeword. Further, the puncturer 130 outputs the punctured LDPC codeword which refers to the rest of the LDPC codeword bits other than the punctured bits, that is, the LDPC codeword with puncturing. Further, the puncturer 130 may provide information (for example, the number and positions of punctured bits, etc.) about the punctured LDPC parity bits to the additional parity generator 140.

Here, the puncturing means that some of the LDPC parity bits are not transmitted to the receiver 200. In this case, the puncturer 130 may remove the punctured LDPC parity bits or output only the remaining bits other than the punctured LDPC parity bits in the LDPC codeword.

In detail, the puncturer 130 may puncture a predetermined number of bits (for example, $N_{punc}$ bits) of the LDPC parity bits. Here, the number $N_{punc}$, of punctured bits is 0 or a positive integer, and may have various values depending on a system. $N_{punc}=0$ means that puncturing is not performed.

In this case, the puncturer 130 may puncture the predetermined number of bits at a back portion of the LDPC parity bits. For example, the puncturer 130 may sequentially puncture $N_{punc}$ LDPC parity bits from the last LDPC parity bit.

However, this is only one example and positions at which bits are punctured in the LDPC parity bits may be variously changed. For example, the puncturer 130 may puncture the $N_{punc}$ LDPC parity bits at a front portion or a middle portion of the LDPC parity bits or puncture $N_{punc}$ LDPC parity bits present at predetermined positions in the LDPC parity bits.

Further, when repetition is performed, the puncturer 130 may puncture not the repetition bits but a predetermined number of bits of the LDPC parity bits generated by LDPC encoding.

For example, it is assumed that repetition is performed to add $N_{repeat}$ LDPC parity bits after LDPC information bits.

In this case, an LDPC codeword with repetition includes repetition bits and LDPC parity bits generated by LDPC encoding. In this case, the repetition bits are positioned between the LDPC information bits and the LDPC parity bits generated by the LDPC encoding, and thus, the puncturer 130 may puncture $N_{punc}$ bits from a last LDPC parity bit among the LDPC parity bits generated by the LDPC encoding.

Hereinafter, puncturing methods according to various exemplary embodiments will be described with reference to the accompanying FIGS. 8 to 11. FIGS. 8 to 11 illustrate examples for describing the puncturing method when the repetition is performed as illustrated in FIGS. 4 to 7.

First, as illustrated in FIG. 4, it is assumed that $N_{repeat}$ LDPC parity bits are added by repetition after LDPC information bits by repetition and before LDPC parity bits generated by LDPC encoding.

Figure 8:
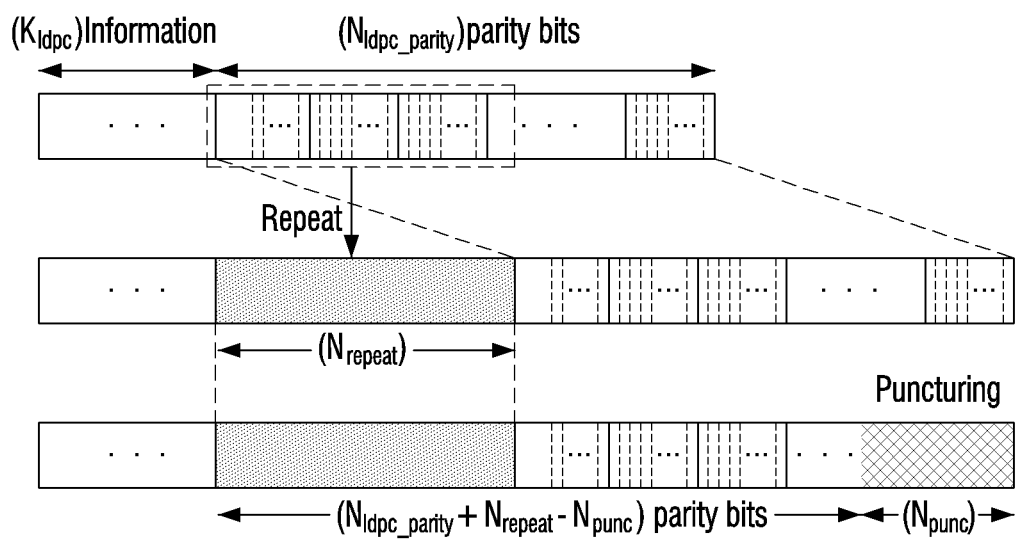
FIGS. 8 to 11 are block diagrams for describing puncturing, according to exemplary embodiments.

In this case, as illustrated in FIG. 8, the puncturer 130 may puncture $N_{punc}$ bits from a last LDPC parity bit of the $N_{ldpc\_parity}$ LDPC parity bits.

Therefore, the number of LDPC parity bits in a repeated and punctured LDPC codeword is $N_{ldpc\_parity}+N_{repeat}-N_{punc}$ and may be represented by $(p_0, p_1, \ldots, p_{N_{repeat}-1}, p_0, p_1, \ldots, p_{N_{ldpc}-K_{ldpc}-N_{punc}-1})$.

As another example, as illustrated in FIG. 5, it is assumed that $N_{repeat}$ LDPC parity bits are added by repetition after LDPC information bits and before LDPC parity bits generated by LDPC encoding.

Figure 9:
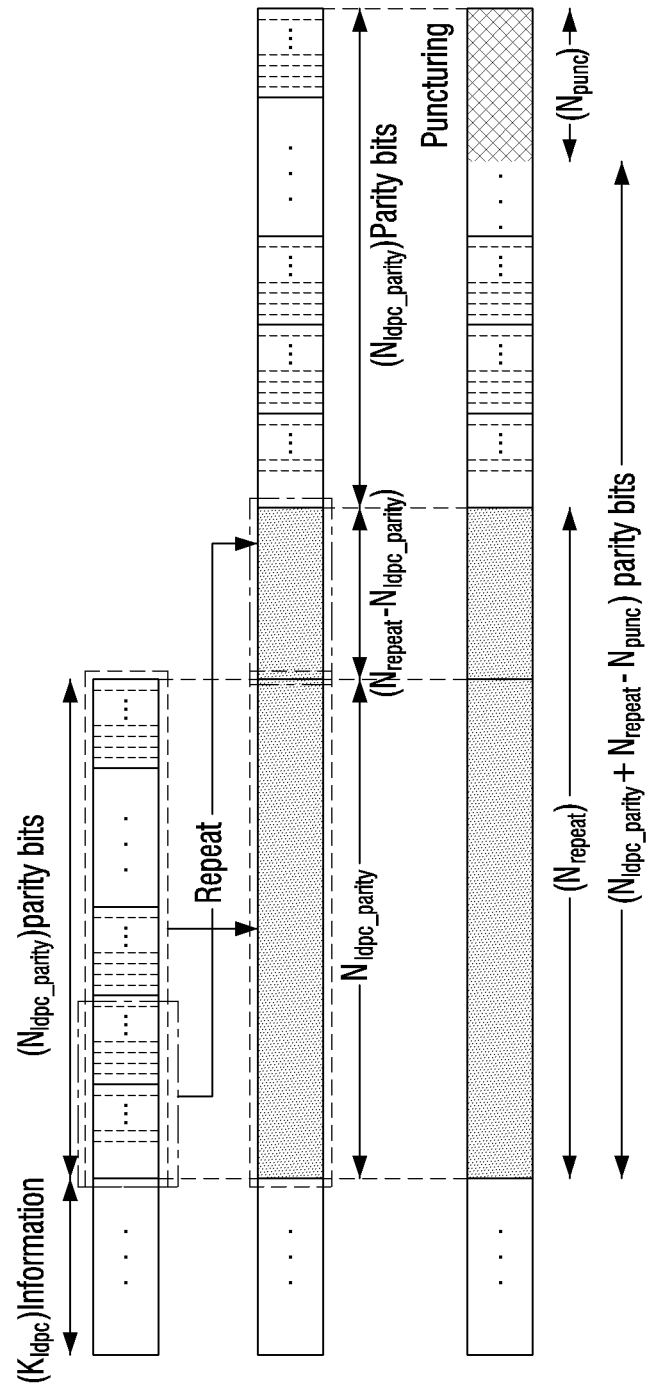

In this case, as illustrated in FIG. 9, the puncturer 130 may puncture $N_{punc}$ bits from a last LDPC parity bit of the $N_{ldpc\_parity}$ LDPC parity bits.

Therefore, the number of LDPC parity bits in a repeated and punctured LDPC codeword is $N_{ldpc\_parity}+N_{repeat}-N_{punc}$ and may be represented by $(p_1, p_1, \ldots, p_{N_{ldpc}-K_{ldpc}-1}, p_0, p_1, p_{N_{repeat}-N_{ldpc\_parity}-1}, p_0, p_1, \ldots, p_{N_{ldpc}-K_{ldpc}-N_{punc}-1})$.

As another example, as illustrated in FIG. 6, it is assumed that $N_{repeat}$ LDPC parity bits are added by repetition after LDPC parity bits generated by LDPC encoding.

Figure 10:
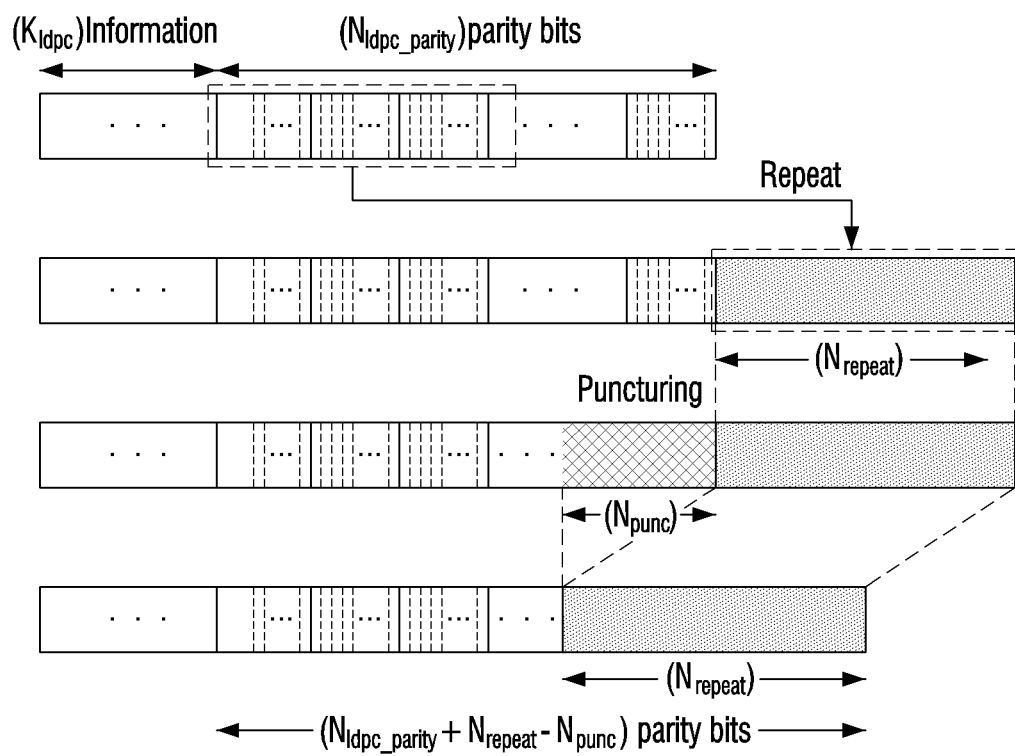

In this case, as illustrated in FIG. 10, the puncturer 130 may puncture $N_{punc}$ bits from a last LDPC parity bit of $N_{ldpc\_parity}$ LDPC parity bits.

Therefore, the number of LDPC parity bits in a repeated and punctured LDPC codeword is $N_{ldpc\_parity}+N_{repeat}-N_{punc}$ and may be represented by $(p_0, p_1, \ldots, p_{N_{ldpc}-K_{ldpc}-N_{punc}-1}, p_0, p_1, \ldots, q_{N_{repeat}-1}, p_0, p_1, \ldots, )$.

As another example, as illustrated in FIG. 7, it is assumed that the $N_{repeat}$ LDPC parity bits are added by repetition after the LDPC parity bits generated by LDPC encoding.

Figure 11:
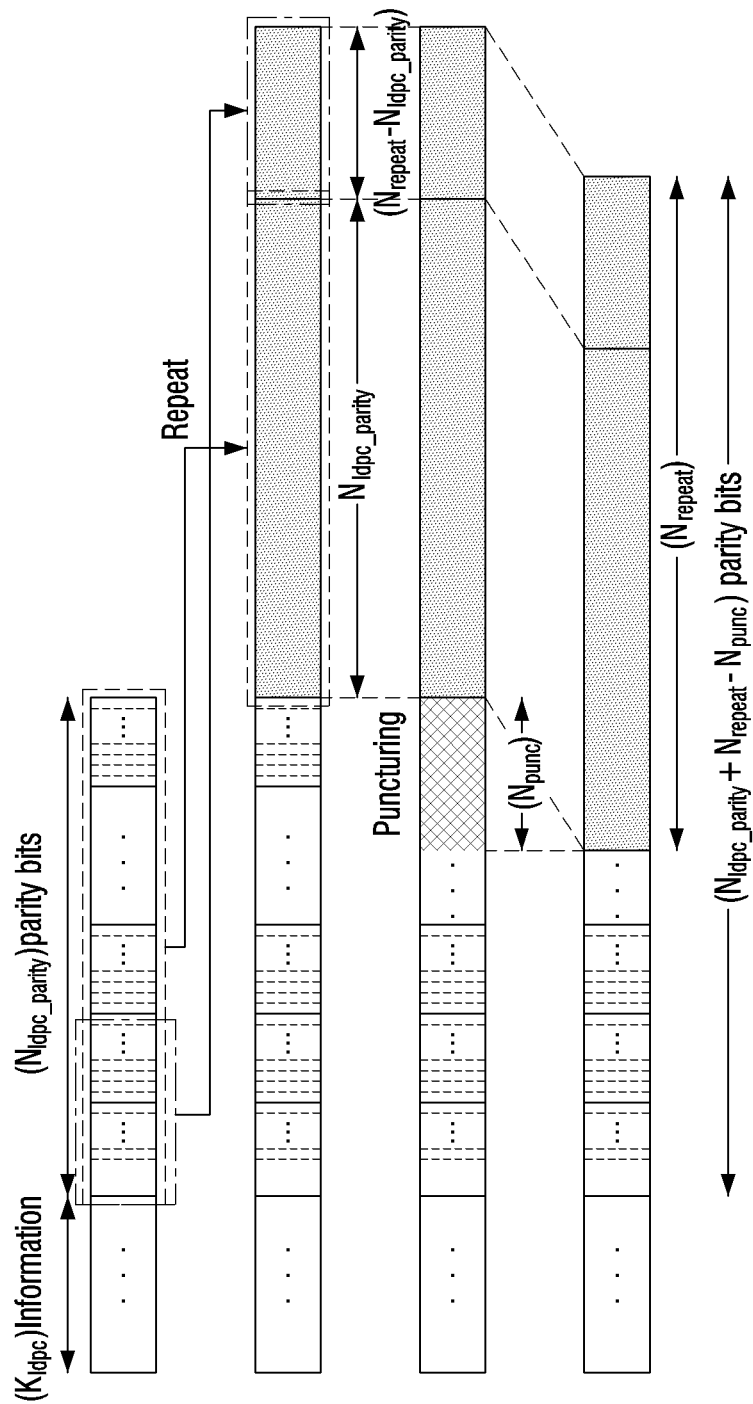

In this case, as illustrated in FIG. 11, the puncturer 130 may puncture $N_{punc}$ bits from a last LDPC parity bit of $N_{ldpc\_parity}$ LDPC parity bits.

Therefore, the number of LDPC parity bits in a repeated and punctured LDPC codeword is $N_{ldpc\_parity}+N_{repeat}-N_{punc}$ and may be represented by $(p_0, p_1, \ldots, p_{N_{ldpc}-K_{ldpc}-N_{punc}-1}, p_0, p_1, \ldots, p_{N_{ldpc}-K_{ldpc}-1}, p_0, p_1, \ldots, p_{N_{repeat}-N_{ldpc\_parity}-1})$.

The additional parity generator 140 may select at least some of the parity bits to generate additional parity bits to be transmitted in a previous frame.

In this case, the additional parity bits may be selected from the LDPC parity bits generated based on the information bits transmitted in a current frame to be transmitted to the receiver 200 through a frame before the current frame, that is, the previous frame.

In detail, the input bits including the information bits are LDPC encoded, and the LDPC parity bits generated by the LDPC encoding are added to the input bits to configure the LDPC codeword.

Further, the repetition, the puncturing and the shortening are performed on the LDPC codeword and the repeated, punctured, and shortened LDPC codeword, that is, the LDPC codeword bits including the repetition bits, other than the punctured bits and the shortened bits, may be mapped to a frame to be transmitted to the receiver 200. However, when the repetition is not performed, the punctured and shortened LDPC codeword may be mapped to the frame to be transmitted to the receiver 200.

In this case, the information bits corresponding to each frame may be transmitted to the receiver 200 through each frame, along with the LDPC parity bits. For example, the repeated, punctured and shortened LDPC codeword including the information bits corresponding to an (i–1)-th frame may be mapped to the (i–1)-th frame to be transmitted to the receiver 200, and the repeated, punctured, and shortened LDPC codeword including the information bits corresponding to the i-th frame may be mapped to the i-th frame to be transmitted to the receiver 200.

The additional parity generator 140 may select at least some of the LDPC parity bits generated based on the information bits transmitted in the i-th frame to generate the additional parity bits.

In detail, some of the LDPC parity bits generated by LDPC encoding on the information bits are punctured and then are not transmitted to the receiver 200. In this case, the additional parity generator 140 may select some or all of the punctured LDPC parity bits among the LDPC parity bits generated by LDPC encoding on the information bits transmitted in the i-th frame, thereby generating the additional parity bits.

Further, the additional parity generator 140 may select at least some of the LDPC parity bits transmitted to the receiver 200 through the i-th frame to generate the additional parity bits.

In detail, the LDPC parity bits included in the repeated, punctured, and shortened LDPC codeword mapped to the i-th frame may be formed of the LDPC parity bits generated by the LDPC encoding and the repeated LDPC parity bits.

In this case, the additional parity generator 140 may select at least some of the LDPC parity bits included in the repeated, punctured and shortened LDPC codeword to be mapped to the i-th frame to generate the additional parity bits. However, when the repetition is omitted, the additional parity generator 140 may select at least some of the LDPC parity bits included in the punctured and shortened LDPC codeword to be mapped to the i-th frame to generate the additional parity bits.

The additional parity bits may be transmitted to the receiver 200 through the frame before the i-th frame, that is, the (i–1)-th frame.

That is, the transmitter 100 may not only transmit the repeated, punctured and shortened LDPC codeword including the information bits corresponding to the (i–1)-th frame but also transmit the generated additional parity bits selected from the LDPC parity bits generated based on the information bits transmitted in the i-th frame to the receiver 200 through the (i–1)-th frame.

The foregoing example describes that the additional parity bits are transmitted to the receiver 200 through the (i–1)-th frame, which is only example. Therefore, the additional parity bits may be transmitted to the receiver 200 through a frame transmitted temporally before the i-th frame.

Hereinafter, a method for generating additional parity bits by selecting bits from the LDPC parity bits will be described in detail.

The additional parity generator 140 may select bits as many as the number of additional parity bits to be generated in the LDPC parity bits to generate the additional parity bits.

In detail, when the number of punctured LDPC parity bits is equal to or greater than the number of additional parity bits to be generated, the additional parity generator 140 may select bits as many as the number of additional parity bits to be generated from the first LDPC parity bit among the punctured LDPC parity bits to generate the additional parity bits.

When the number of punctured LDPC parity bits is less than the number of additional parity bits to be generated, the additional parity generator 140 may first select all the punctured LDPC parity bits and additionally select bits as many as the number obtained by subtracting the number of punctured LDPC parity bits from the number of additional parity bits to be generated from the first bit among the LDPC parity bits included in the LDPC codeword to generate the additional parity bits.

In detail, when the repetition is not performed, the LDPC parity bits included in the LDPC codeword are the LDPC parity bits generated by the LDPC encoding.

In this case, the additional parity generator 140 may first select all the punctured LDPC parity bits, and additionally select bits as many as the number obtained by subtracting the number of punctured LDPC parity bits from the number of additional parity bits to be generated from the first LDPC bit among the LDPC parity bits generated by the LDPC encoding to generate the additional parity bits.

Here, the LDPC parity bits generated by the LDPC encoding are divided into non-punctured LDPC parity bits and punctured LDPC parity bits. Therefore, when the puncturing is performed from the last bit among the LDPC parity bits generated by the LDPC encoding, if bits are selected from the first bit among the LDPC parity bits generated by the LDPC encoding for the additional parity, bits may be selected in an order of the non-punctured LDPC parity bits and the punctured LDPC parity bits.

When the repetition is performed, the additional parity generator 140 may select at least some bits from the LDPC codeword with repetition to generate the additional parity bits.

As described above, the LDPC parity bits of the LDPC codeword with repetition include the repetition bits and the LDPC parity bits generated by the LDPC encoding. In this case, the additional parity generator 140 may first select all the punctured LDPC parity bits and additionally select bits as many as the number obtained by subtracting the number of punctured LDPC parity bits from the number of additional parity bits to be generated from the first bit among the repetition bits and the LDPC parity bits generated by the LDPC encoding to generate the additional parity bits.

Therefore, when the bits as many as the number obtained by subtracting the number of punctured LDPC parity bits from the number of additional parity bits to be generated are additionally selected, the repetition bits are first selected and when the number obtained by subtracting the number of punctured LDPC parity bits from the number of additional parity bits to be generated exceeds the number of repetition bits, bits may be further selected from the LDPC parity bits generated by the LDPC encoding. In this case, when the bits are further selected from the LDPC parity bits generated by the LDPC encoding, the first bit among the LDPC parity bits generated by the LDPC encoding may start to be selected.

As described above, the repetition bits may be positioned at various positions within the LDPC codeword with repetition.

Hereinafter, the method for generating additional parity when the repetition is performed will be described in more detail with reference to, for example, the case in which the repeated LDPC parity bits are positioned between the LDPC information bits and the LDPC parity bits generated by the LDPC encoding.

In this case, it is assumed that the repeater 120 selects at least some of the LDPC parity bits and adds the selected parity bits after the LDPC information bits and the puncturer 130 performs the puncturing from the last bit among the LDPC parity bits including the repeated LDPC parity bits and the LDPC parity bits generated by the encoding.

In this case, the additional parity generator 140 may select at least some bits from the repetition bits added after the input bits, that is, the LDPC information bits based on the number of additional parity bits to be generated and the number of punctured LDPC parity bits to generate the additional parity bits.

In detail, when the number of additional parity bits to be generated is greater than the number of punctured LDPC parity bits, the additional parity generator 140 selects all the punctured LDPC parity bits and selects bits corresponding to the number obtained by subtracting the number of punctured LDPC parity bits from the number of additional parity bits to be generated from the first bit among the repetition bits to generate the additional parity bits.

Here, for the additional parity bits, if bits are selected from the first bit among the LDPC parity bits, they may be selected in an order of the repetition bits and the LDPC parity bits generated by the LDPC encoding. Further, within the LDPC parity bits generated by the LDPC encoding, the additional bits may be selected in an order of the non-punctured LDPC parity bits and the punctured LDPC parity bits.

As such, when the additional parity bits are generated as many as the predetermined number, the punctured bits are most preferentially, but not necessarily, selected. Further, when bits as many as the number exceeding the punctured bits are selected, the repeated LDPC parity bits among the LDPC parity bits are preferentially selected depending on whether to perform the repetition.

As such, a coding gain may be obtained in that the punctured bits not transmitted in the current frame are selected and transmitted as the additional parity bits. Further, after the punctured bits are selected, the repeated LDPC parity bits which are relatively more important bits among the LDPC parity bits are selected to constitute the additional parity bits. Further, the LDPC parity bits are arranged depending on the puncturing order, and thus, may be considered to be arranged depending on a priority of the parity bits. The detailed contents associated with the puncturing order will be described below.

When the puncturing is not performed, that is, when the number of punctured bits is 0, the additional parity generator 140 may select at least some bits from the LDPC codeword or the repeated LDPC codeword to generate the additional parity bits.

First, when the repetition is not performed, the additional parity generator 140 may select bits as many as the number of additional parity bits to be generated from the first bit among the LDPC parity bits to generate the additional parity bits. That is, when the number of punctured bits is 0 and the number of repetition bits is 0, the additional parity generator 140 may select bits as many as the number of additional parity bits to be generated from the first bit among the LDPC parity bits generated by the LDPC encoding to generate the additional parity bits.

When the repetition is performed, the additional parity generator 140 may select bits as many as the number of additional parity bits to be generated from the first bit among the repeated LDPC parity bits to generate the additional parity bits.

That is, when the number of punctured bits is 0 and the number of repetition bits is 1 or more, the additional parity generator 140 may select bits as many as the number of additional parity bits to be generated from the first bit of the repeated bits among the repetition bits and the LDPC parity bits generated by the LDPC encoding to generate the additional parity bits.

Therefore, when the repetition bits are first selected and the number obtained by subtracting the number of repetition bits from the number of additional parity bits to be generated exceeds the number of repetition bits, bits may be additionally selected from the LDPC parity bits generated by the LDPC encoding. In this case, when the bits are additionally selected from the LDPC parity bits generated by the LDPC encoding, the first bit among the LDPC parity bits generated by the LDPC encoding may start to be selected.

The punctured bits mean that bits are punctured based on a punctured LDPC codeword to be transmitted in a frame in which information bits are transmitted.

In the foregoing example in which the number of additional parity bits to be generated (hereafter referred to as $N_{AP}$) is greater than the number of punctured LDPC parity bits, after all the punctured LDPC parity bits are selected as initial additional bits, the remaining additional bits, that is, bits corresponding to the number obtained by subtracting the number of punctured LDPC parity bits from the number of additional parity bits to be generated ($N_{AP}-N_{punc}$) are selected from the first bit of the repetition bits, which is only one example. That is, the additional parity generator 140 may also additionally select the $N_{AP}-N_{punc}$ bits from the first information bit or the first outer encoded bit.

Further, when the LDPC parity bits are not punctured, the additional parity generator 140 may also select the $N_y$ bits from the first bit among the repetition bits to generate the additional parity bits.

Hereinafter, a method for calculating the number of additional parity bits to be generated will be described.

First, the additional parity generator 140 calculates a temporary number $N_{AP\_temp}$ of additional parity bits to be generated based on following Equation 8.

$$N_{AP\_temp} = \min \left\{ \begin{array}{l} 0.5 \times K \times (N_{outer} + N_{ldpc\_parity} - N_{punc} + N_{repeat}), \\ (N_{ldpc\_parity} + N_{punc} + N_{repeat}) \end{array} \right\}, \quad (8)$$

$$K = 0, 1, 2$$

In above Equation 8, $$\min(a, b) = \begin{cases} a, \text{ if } a \le b \\ b, \text{ if } b < a \end{cases}.$$

Further, $N_{ldpc\_parity}$ is the number of LDPC parity bits, and $N_{punc}$ is the number of punctured LDPC parity bits. Further, $N_{outer}$ represents the number of outer-encoded bits. Here, when the outer encoding is performed by BCH encoding, $N_{outer}$ represents the number of BCH-encoded bits. Further, the $N_{repeat}$ represents the number of repetition bits and when the repetition is not performed, $N_{repeat}=0$.

Therefore, $N_{ldpc\_parity}-N_{punc}+N_{repeat}$ is a total number (that is, a total number of LDPC parity bits included in the repeated, punctured, and shortened LDPC codeword) of LDPC parity bits to be transmitted in the current frame in which the information bits are transmitted, and $N_{outer}+N_{ldpc\_parity}-N_{punc}+N_{repeat}$ is a total number of LDPC codeword bits (that is, a total number of repeated, punctured, and shortened LDPC codeword bits) to be transmitted in the current frame.

Further, K represents a ratio of the number of additional parity bits to a half of a total number of bits configuring repeated, punctured, and shortened LDPC codeword. Here, when K=2, the number of additional parity bits is equal to the total number of LDPC codeword bits transmitted in the current frame.

As such, the number of additional parity bits to be generated may be determined based on the total number of bits to be transmitted in the current frame.

Figure 12:
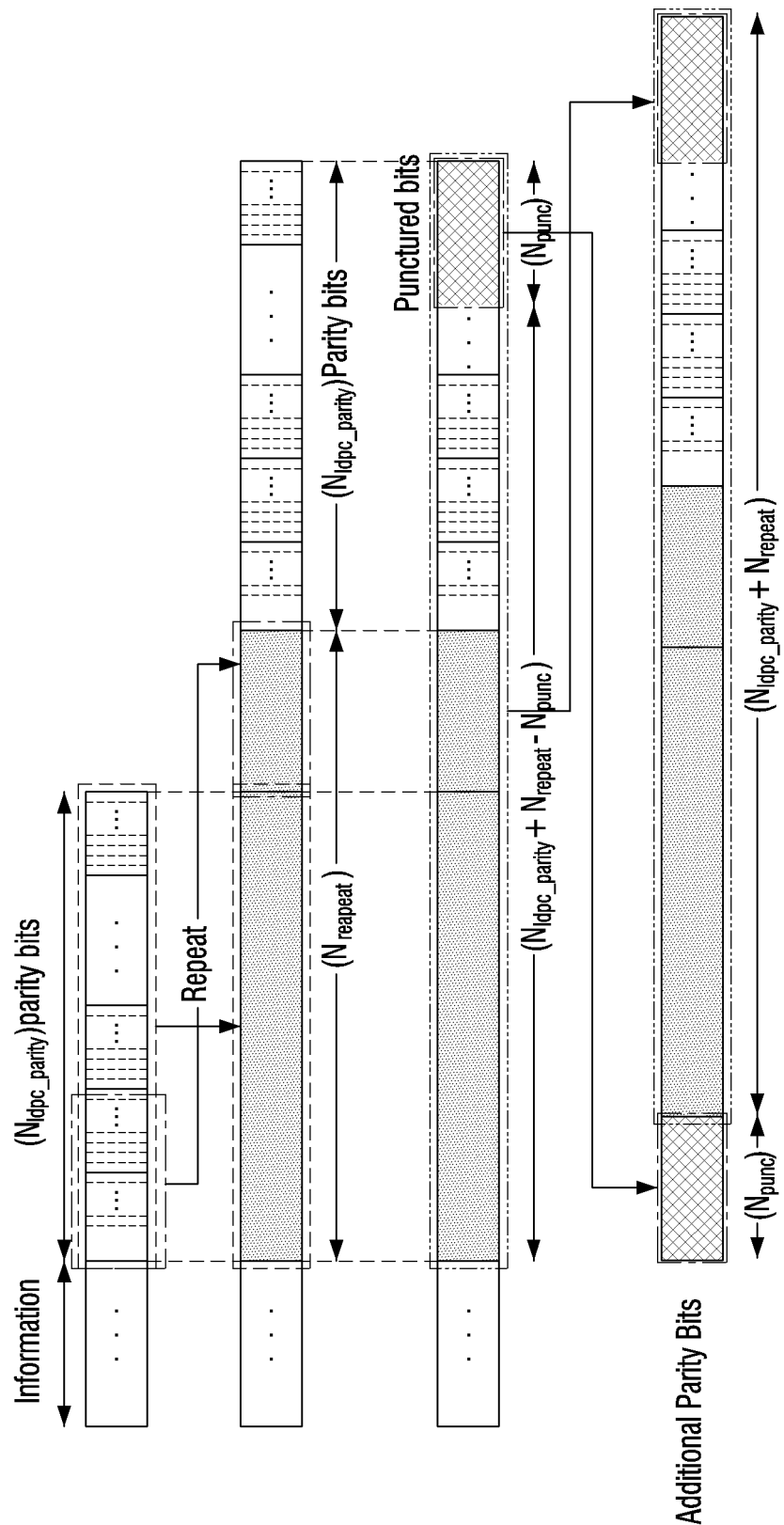
FIGS. 12 to 40 are diagrams for describing methods for generating additional parity bits, according to exemplary embodiments.

Referring to FIG. 12, according to an exemplary embodiment, when a length of the additional parity bits is calculated, all of the punctured bits, the repetition bits, and the LDPC parity bits are selected in consideration of performance and complexity, and then, are no longer selected for the additional parity bits. That is, as illustrated in FIG. 12, the length of the additional parity bits is equal to or less than $N_{AP\_max}(=N_{ldpc\_parity}+N_{punc}+N_{repeat})$, that is, the length of the additional parity bits is not greater than $N_{AP\_max}$ $(=N_{ldpc\_parity}+N_{punc}\ N_{repeat})$.

For example, when the number of punctured LDPC parity bits is 3200 and K=2, it is assumed that the number of additional parity bits to be generated is 13000 ($=N_{outer}+N_{ldpc\_parity}-N_{punc}=6480+9720-3200$).

In this case, since the number of punctured LDPC parity bits is 3200, when all the LDPC parity bits punctured for the additional parity bits are selected and all the LDPC parity bits are selected, the number of selected bits is 12920 (=3200+9720). Therefore, when there is no separate limitation, 80 bits may be further selected. However, like following Equation 12, when a maximum length of the additional parity bits is limited to $N_{ldpc\_parity}+N_{punc}+N_{repeat}$, the number of additional parity bits is limited to 12920 and 80 bits need not to be additionally selected.

However, as such, limiting the maximum length of the additional parity bits is only an example, and when the length of the additional parity bits is not limited, a temporary $N_{AP\_temp}$ of the additional parity bits to be generated may be calculated based on following Equation 9.

$$N_{AP\_temp}=0.5 \times K \times (N_{outer}+N_{ldpc\_parity}-N_{punc}+N_{repeat}),$$
$$K=0,1,2 \qquad (9)$$

When the length of the additional parity bits is not limited, the additional parity generator 140 may calculate the temporary $N_{AP\_temp}$ of the additional parity bits based on above Equation 9.

The additional parity generator 140 may calculate the number $N_{AP}$ of additional parity bits to be generated based on the temporary number $N_{AP\_temp}$ of the additional parity bits to be generated calculated based on above Equation 8 or 9.

In detail, the additional parity generator 140 may calculate the number $N_{AP}$ of additional parity bits based on following Equation 10.

As such, the number $N_{AP}$ of additional parity bits to be generated may be calculated based on the temporary number $N_{AP\_temp}$ of the additional parity bits to be generated which is calculated based on above Equation 8 or 9, and, in detail, may be calculated based on following Equation 10.

$$N_{AP} = \left\lfloor \frac{N_{AP\_temp}}{\eta_{MOD}} \right\rfloor \times \eta_{MOD} \quad (10)$$

In above Equation 10, $\eta_{MOD}$ is a modulation order. For example, in quadrature phase shift keying (QPSK), 16-quadrature amplitude modulation (QAM), 64-QAM and 256-QAM, η MOD may be 2, 4, 6 and 8, respectively.

Therefore, the number of additional parity bits may be an integer multiple of the modulation order. That is, since the additional parity bits are separately modulated from the information bits to be mapped to constellation symbols, the number of additional parity bits may be determined to be an integer multiple of the modulation order like above Equation 10.

In this case, above Equation 8 may be represented like following Equation 11, and above Equation 9 may be represented like following Equation 12.

$$N_{AP} = \left\lfloor \frac{\min\left\{ \begin{array}{c} \alpha \times K \times (N_{outer} + N_{ldpc\_parity} - N_{punc} + N_{repeat}), \\ (N_{ldpc\_parity} + N_{punc} + N_{repeat}) \end{array} \right\}}{\eta_{MOD}} \right\rfloor \times \eta_{MOD} \quad (11)$$

$$N_{AP} = \left\lfloor \frac{\alpha \times K \times (N_{outer} + N_{ldpc\_parity} - N_{punc} + N_{repeat})}{\eta_{MOD}} \right\rfloor \times \eta_{MOD} \quad (12)$$

In above Equations 11 and 12, $\alpha$ may be equal to 0.5.

As such, the number of additional parity bits to be generated may be determined based on the number of outer encoded bits transmitted in the current frame and the number of remaining parity bits after the puncturing.

Here, when repetition is performed, the number of additional parity bits to be generated may be determined based on the number of outer encoded bits transmitted in the current frame, the number of remaining parity bits after the puncturing, and the number of bits repeated in the current frame.

Hereinafter, a code rate changed according to the use of the additional parity bits will be described.

If a code rate R when the additional parity bits are not transmitted is equal to k/n, a code rate $R_{ap}$ when the additional parity bits are transmitted is equal to $k/(n+N_{AP})$ and the $N_{AP}$ has 1/2×n or an n value depending on a K value. Therefore, the code rate $R_{ap}$ in the case in which the additional parity bits are transmitted is equal to k/(3/2×n)= 2/3R or is equal to k/(2×n)=1/2R, and therefore, compared with the case in which the additional parity bits are not transmitted, the code rate is reduced to 2/3 or 1/2, thereby obtaining a coding gain. Further, bits other than the additional parity bits and the additional parity bits are transmitted in other frames and, as a result, a diversity gain may be obtained. This may allow maintaining characteristics of changing the code rate depending on the input length in response to the change in the code rate as described above regardless of the input length, that is, the length of the input information bits.

Hereinafter, a method for generating additional parity bits by selecting bits from the LDPC parity bits will be described in detail with reference to the drawings.

The additional parity generator 140 may select bits as many as calculated number in the LDPC parity bits to generate the additional parity bits.

In detail, when the number of additional parity bits to be generated is equal to or less than the number of punctured LDPC parity bits, the additional parity generator 140 may select bits as many as the calculated number from the first bit among the punctured LDPC parity bits to generate the additional parity bits.

For example, the LDPC parity bits are added after the LDPC information bits by repetition and thus an LDPC codeword with repetition is configured in an order of the LDPC information bits, the repeated LDPC parity bits, and the LDPC parity bits generated by the LDPC encoding.

Figure 13:
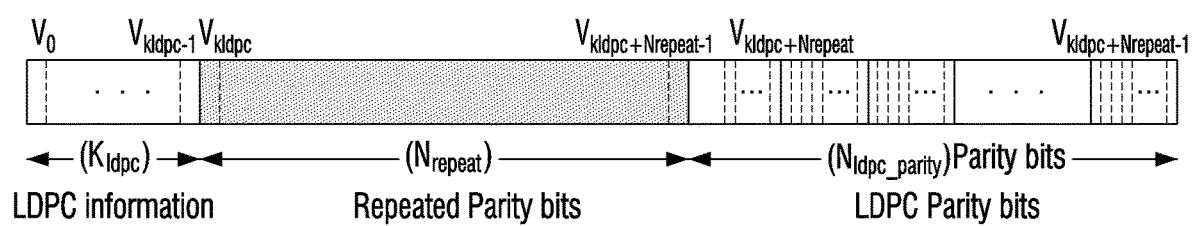

In this case, the repeated LDPC codeword $V=(v_0, v_1, \ldots, v_{N_{inner}+N_{repeat}-1})$ may be represented as illustrated in FIG. 13.

Figure 14:
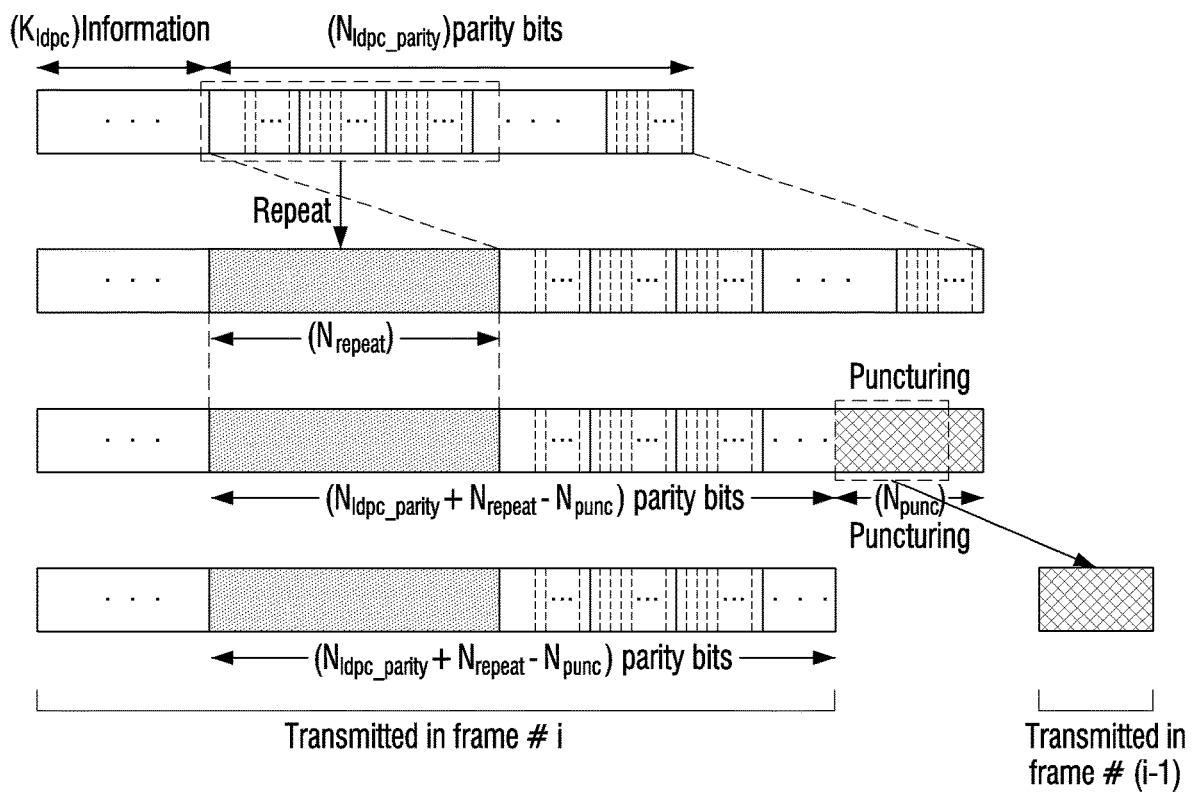
Figure 15:
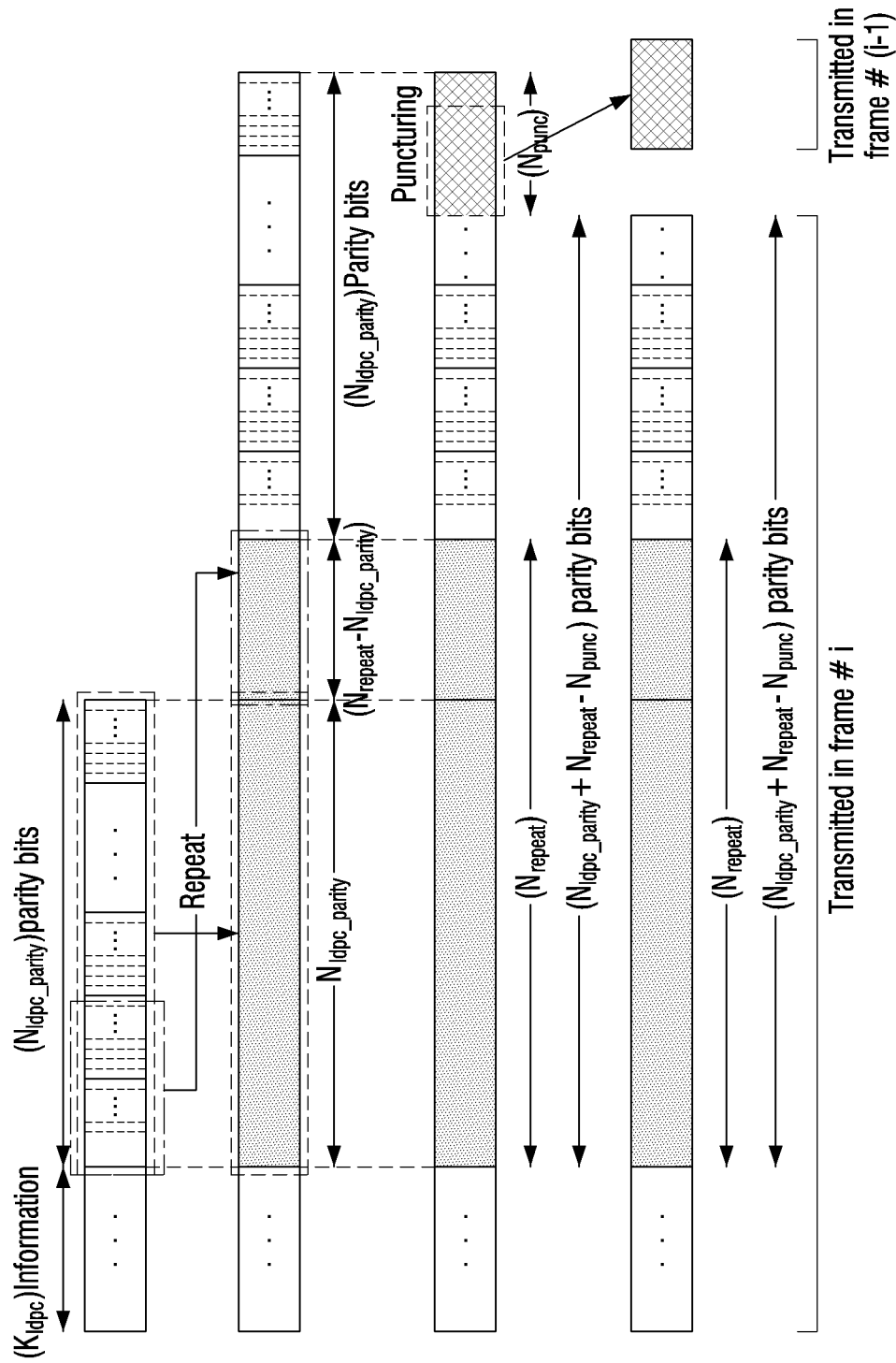

In detail, when the $N_{AP}$ is equal to or less than the $N_{punc}$, that is, $N_{AP} \leq N_{punc}$, the additional parity generator 140 may select $N_{AP}$ bits from the first bit among the punctured LDPC parity bits as illustrated in FIGS. 14 and 15 to generate the additional parity bits.

Therefore, for the additional parity bits, $(v_{N_{repeat}+N_{inner}-N_{punc}}, v_{N_{repeat}+N_{inner}-N_{punc}+1}, \ldots, v_{N_{repeat}+N_{inner}-N_{punc}+N_{AP}-1})$ may be selected.

When the number of additional parity bits to be generated is greater than the number of punctured LDPC parity bits, the additional parity generator 140 selects all the punctured LDPC parity bits and selects bits corresponding to the number obtained by subtracting the number of punctured LDPC parity bits from the number of additional parity bits to be generated from the first bit among the repetition bits to generate the additional parity bits.

Figure 16:
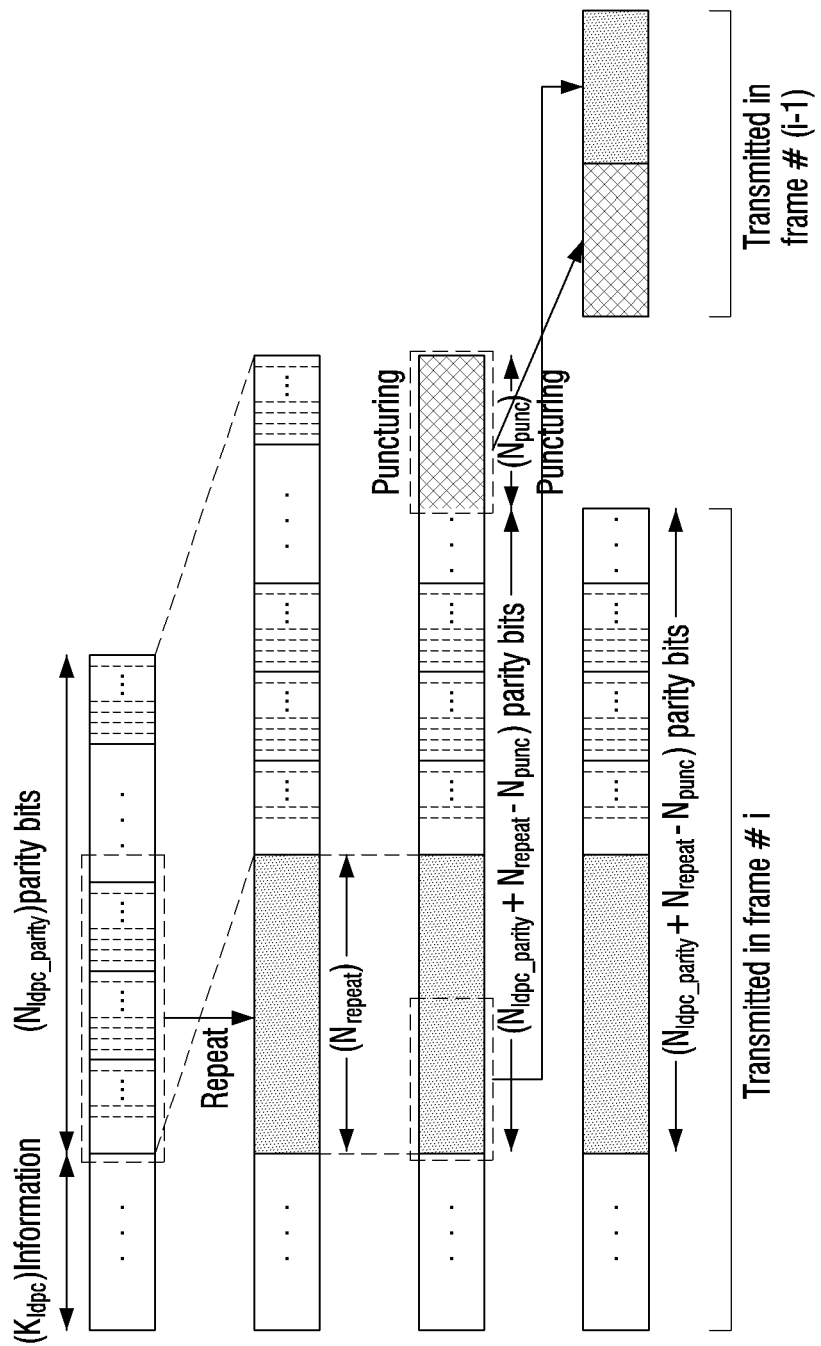
Figure 17:
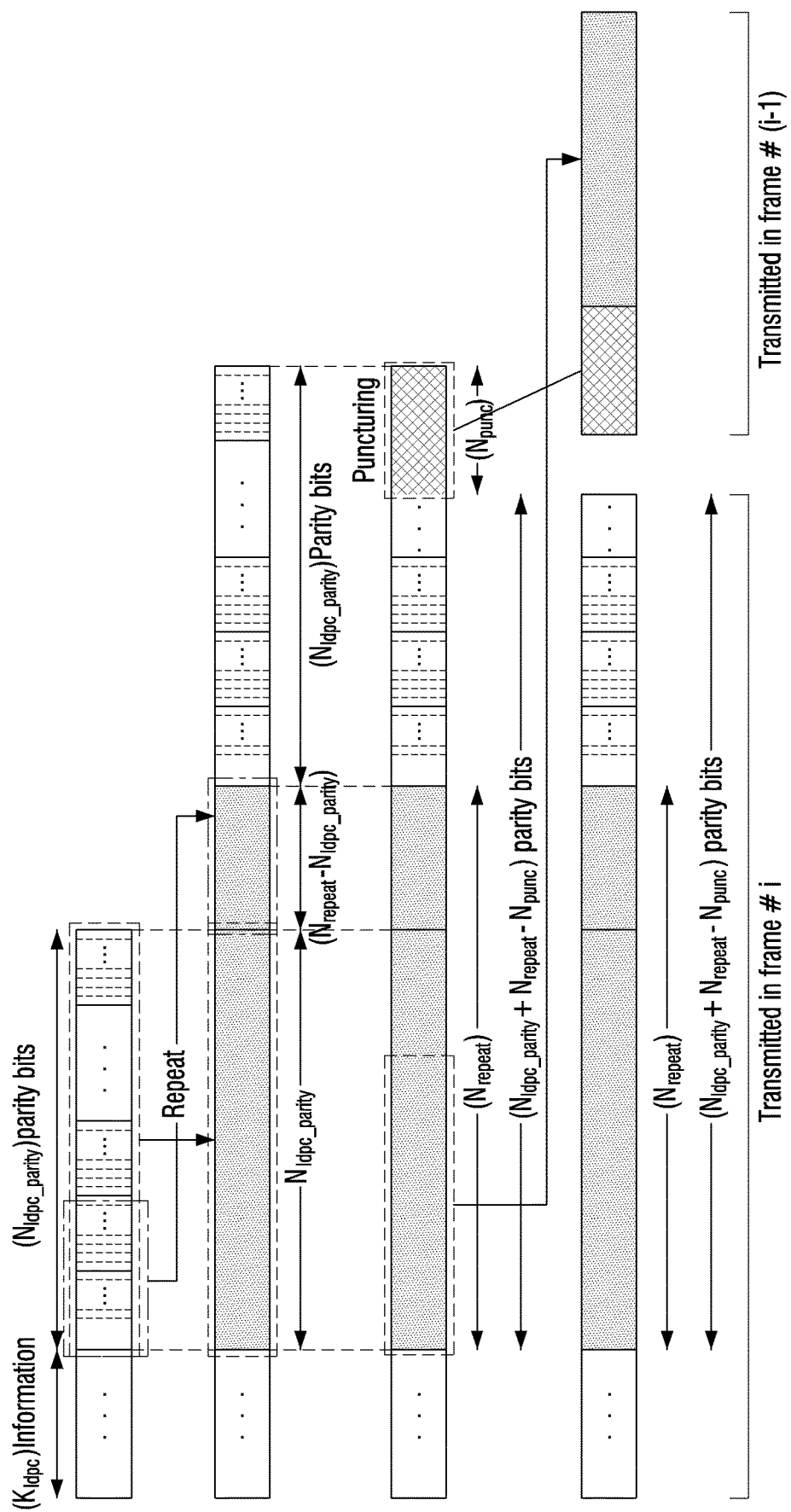

For example, when the $N_{AP}$ is greater than the $N_{punc}$, that is, $N_{AP} > N_{punc}$, the additional parity generator 140 may first select all the punctured LDPC parity bits as illustrated in FIGS. 16 and 17. Therefore, at first, $(v_{N_{repeat}+N_{inner}-N_{punc}}, v_{N_{repeat}+N_{inner}-N_{punc}+1}, \ldots, v_{N_{repeat}+N_{inner}-1})$ may be selected.

Further, the additional parity generator 140 may additionally select $N_{AP}-N_{punc}$ bits from the first bit among the LDPC parity bits including the repeated LDPC parity bits and the LDPC parity bits generated by the LDPC encoding.

In this case, the LDPC parity bits are added after the LDPC information bits by the repetition, and thus, the repeated LDPC parity bits and the LDPC parity bits generated by the LDPC encoding are sequentially arranged to configure the LDPC parity bits in the LDPC codeword.

Therefore, the additional parity generator 140 may additionally select bits (that is, $N_{AP}-N_{punc}$ bits) as many as the number obtained by subtracting the number of punctured LDPC parity bits from the number of additional parity bits to be generated from the first bit among the repeated LDPC parity bits. In this case, since the additional parity bits are selected from the first bit among the repeated LDPC parity bits, when the $N_{AP}-N_{punc}$ is i greater than the number $N_{repeat}$ of repeated LDPC parity bits, at least some of the LDPC parity bits generated by the LDPC encoding may also be selected as the additional parity bits.

Therefore, $(v_{K_{ldpc}}, v_{K_{ldpc}+1}, \ldots, v_{K_{ldpc}+N_{AP}-N_{punc}-1})$ may be additionally selected.

As a result, for the additional parity bits, $(v_{N_{repeat}+N_{inner}-N_{punc}}, v_{N_{repeat}+N_{inner}-N_{punc}+1}, \ldots, v_{N_{repeat}+N_{inner}-1})$ and $(v_{K_{ldpc}}, v_{K_{ldpc}+1}, \ldots, v_{K_{ldpc}+N_{AP}-N_{punc}-1})$ may be selected.

The additional parity generator 140 may also generate the additional parity bits using various different methods other than the foregoing methods.

For example, when the number of additional parity bits to be generated is equal to or less than the number of punctured LDPC parity bits, the additional parity generator 140 may select bits as many as the number of additional parity bits to be generated from the punctured LDPC parity bits to generate the additional parity bits.

Figure 18:
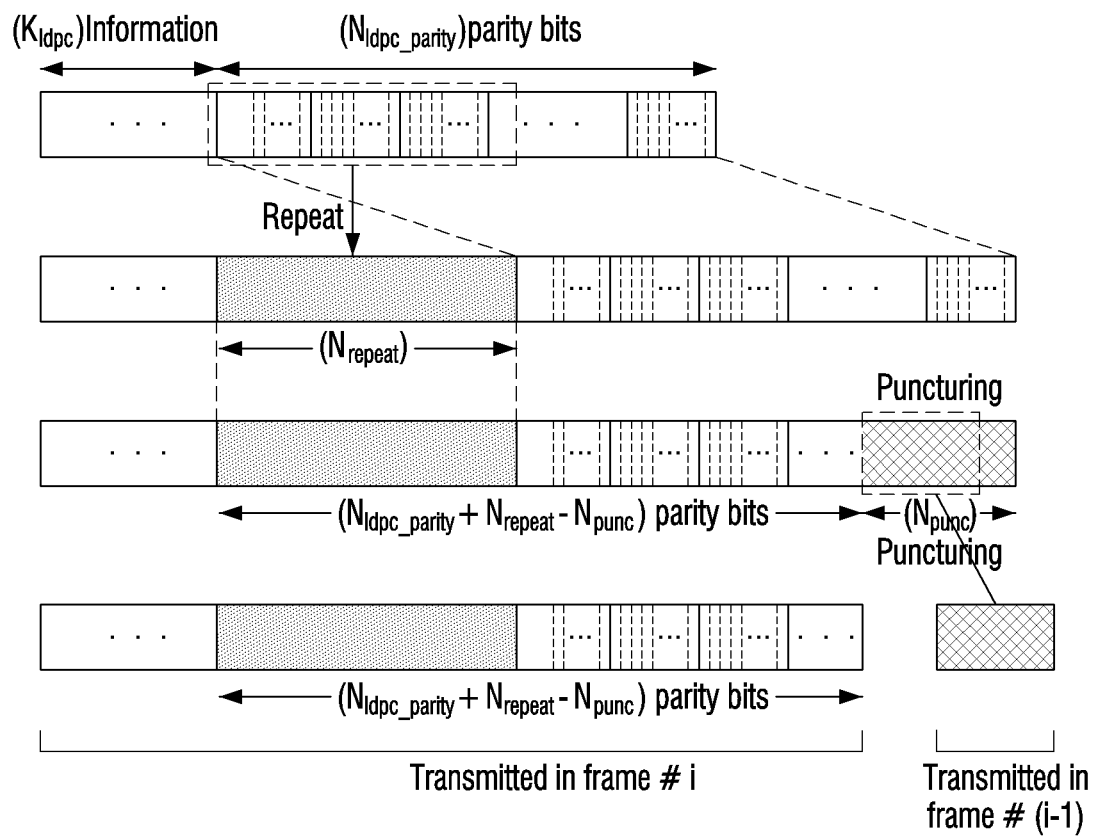

That is, when $N_{AP} \leq N_{punc}$, as illustrated in FIG. 18, the additional parity generator 140 may select $N_{AP}$ bits from the first bit among the punctured LDPC parity bits to generate the additional parity bits. Therefore, for the additional parity bits, $(v_{N_{repeat}+N_{inner}-N_{punc}}, v_{N_{repeat}+N_{inner}-N_{punc}+1}, \ldots, v_{N_{repeat}+N_{inner}-N_{punc}+N_{AP}-1})$ may be selected.

Further, when the number of additional parity bits to be generated is greater than the number of punctured LDPC parity bits but is equal to or less than a sum of the number of LDPC parity bits generated by the LDPC encoding and the number of punctured LDPC parity bits, the additional parity generator 140 may select all the punctured LDPC parity bits and select bits as many as the number obtained by subtracting the number of punctured LDPC parity bits from the number of additional parity bits to be generated from the first bit among the LDPC parity bits generated by the LDPC encoding to generate the additional parity bits.

Figure 19:
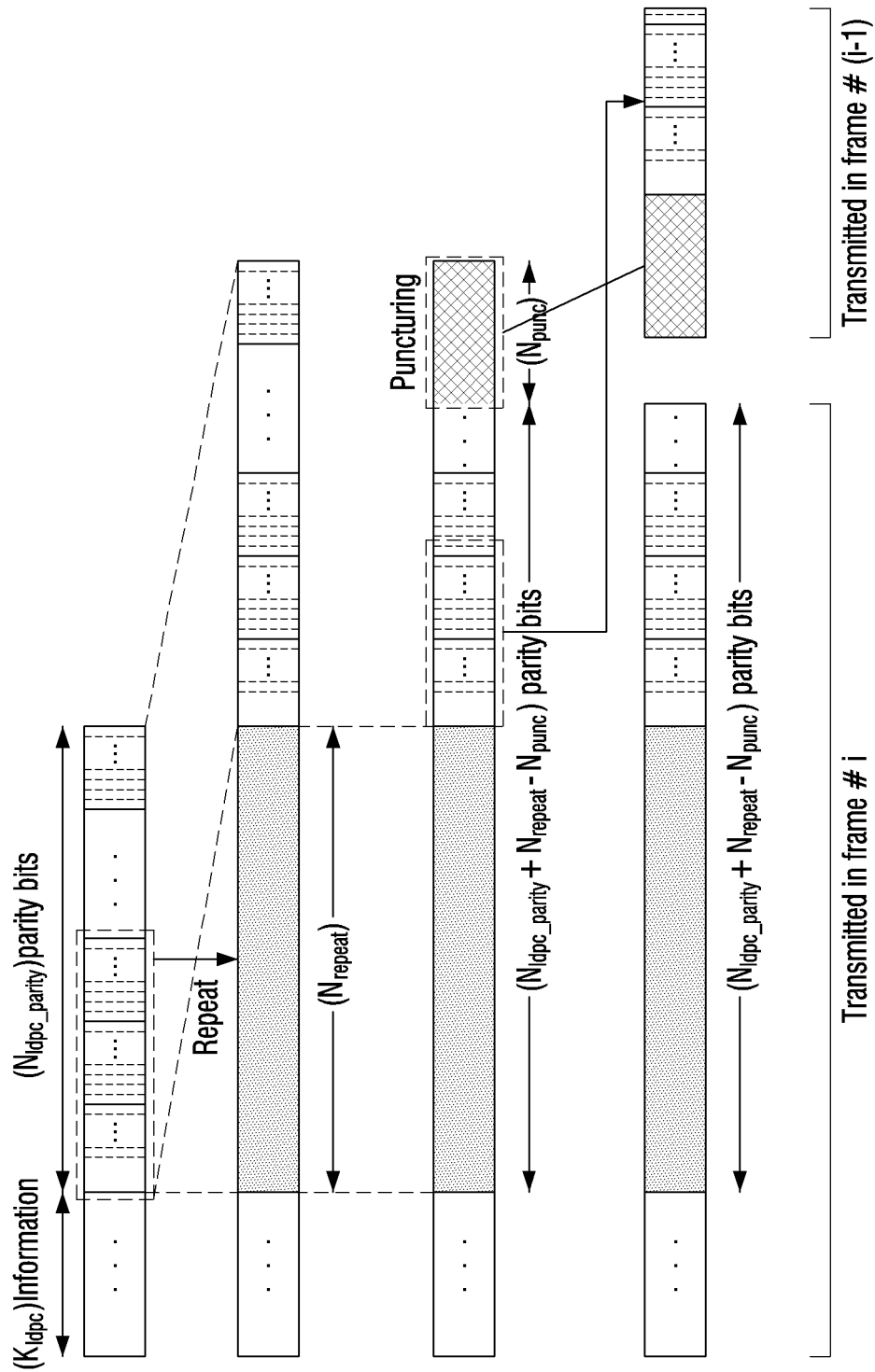

That is, when $N_{punc} < N_{AP} \leq N_{ldpc\_parity} + N_{punc}$, as illustrated in FIG. 19, the additional parity generator 140 may first select all the punctured LDPC parity bits. Therefore, at first, $(v_{N_{repeat}+N_{inner}-N_{punc}}, v_{N_{repeat}+N_{inner}-N_{punc}+1}, \ldots, v_{N_{repeat}+N_{inner}-1})$ may be selected.

Further, the additional parity generator 140 may additionally select $N_{AP}-N_{punc}$ bits from the first bit among the $N_{ldpc\_parity}$ LDPC parity bits generated by the LDPC encoding. Therefore, $(v_{N_{repeat}+K_{ldpc}}, v_{N_{repeat}+K_{ldpc}+1}, \ldots, v_{N_{repeat}+K_{ldpc}+N_{AP}-N_{punc}-1})$ may be additionally selected.

As a result, for the additional parity bits, $(v_{N_{repeat}+N_{inner}-N_{punc}}, v_{N_{repeat}+N_{inner}-N_{punc}+1}, \ldots, v_{N_{repeat}+N_{inner}-1})$ and $(v_{N_{repeat}+K_{ldpc}}, v_{N_{repeat}+K_{ldpc}+1}, \ldots, v_{N_{repeat}+K_{ldpc}+N_{AP}-N_{punc}-1})$ may be selected.

Further, when the number of additional parity bits to be generated is greater than the sum of the number of LDPC parity bits generated by the LDPC encoding and the number of punctured LDPC parity bits, the additional parity generator 140 may select all the punctured LDPC parity bits and all the LDPC parity bits generated by the LDPC encoding and select bits as many as the number obtained by subtracting the number of LDPC parity bits generated by the LDPC encoding and the number of punctured LDPC parity bits from the number of additional parity bits to be generated from the first bit among the repeated LDPC parity bits to generate the additional parity bits.

Figure 20:
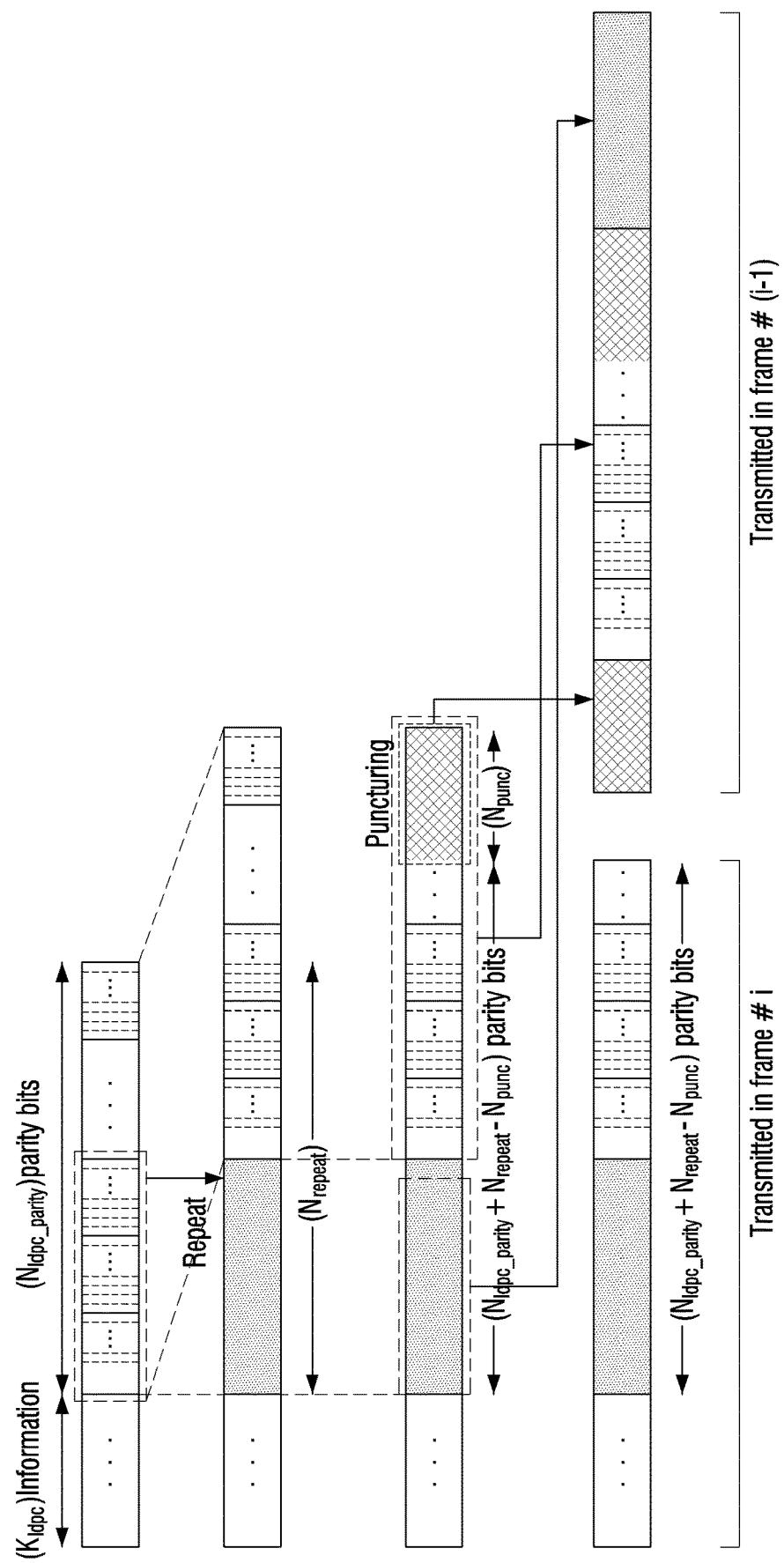

That is, when $N_{ldpc\_parity}+N_{punc} < N_{AP}$, as illustrated in FIG. 20, the additional parity generator 140 may first select all the punctured LDPC parity bits. Therefore, at first, $(v_{N_{repeat}+N_{inner}-N_{punc}}, v_{N_{repeat}+N_{inner}-N_{punc}+1}, \ldots, v_{N_{repeat}+N_{inner}-1})$ may be selected.

Further, the additional parity generator 140 additionally selects all the $N_{ldpc\_parity}$ LDPC parity bits generated by the LDPC encoding. Therefore, $(v_{N_{repeat}+K_{ldpc}}, v_{N_{repeat}+K_{ldpc}+1}, \ldots, v_{N_{repeat}+N_{inner}-1})$ may be additionally selected.

Further, the additional parity generator 140 may additionally select $N_{AP}-N_{ldpc\_parity}-N_{punc}$ bits from the first bit among the repeated LDPC parity bits. Therefore, $(v_{K_{ldpc}}, v_{K_{ldpc}+1}, \ldots, v_{K_{ldpc}+N_{AP}-N_{punc}-N_{inner}-1})$ may be additionally selected.

As a result, for the additional parity bits, $(v_{N_{repeat}+N_{inner}-N_{punc}}, v_{N_{repeat}+N_{inner}-N_{punc}+1}, \ldots, v_{N_{repeat}+N_{inner}-1})$, $(v_{N_{repeat}+K_{ldpc}}, v_{N_{repeat}+K_{ldpc}+1}, \ldots, v_{N_{repeat}+N_{inner}-1})$, and $(v_{K_{ldpc}}, v_{K_{ldpc}+1}, \ldots, v_{K_{ldpc}+N_{AP}-N_{punc}-N_{inner}-1})$ may be selected.

In the foregoing example, the case in which the repetition bits are added by repetition after the LDPC information bits is assumed.

Hereinafter, as another example, when the repetition bits are added by repetition after the LDPC parity bits generated by the LDPC encoding, a method for generating additional parity bits will be described. In this case, the LDPC parity bits generated by the LDPC encoding and the repeated LDPC parity bits may be sequentially arranged to configure the LDPC parity bits.

The LDPC codeword with repetition may be represented like $V=(v_0, v_1, \ldots, v_{N_{inner}+N_{repeat}-1})$.

First, when the number of additional parity bits to be generated is equal to or less than a sum of the number of punctured LDPC parity bits and the number of repeated LDPC parity bits, the additional parity generator 140 may select bits as many as the number of additional parity bits to be generated from the first bit among the punctured LDPC parity bits to generate the additional parity bits.

In this case, since the LDPC parity bits generated by the LDPC encoding and the repeated LDPC parity bits are sequentially arranged, when bits are selected from the first bit among the punctured LDPC parity bits, at least some of the repeated LDPC parity bits may also be selected as the additional parity bits depending on the number of additional parity bits to be generated.

Figure 21:
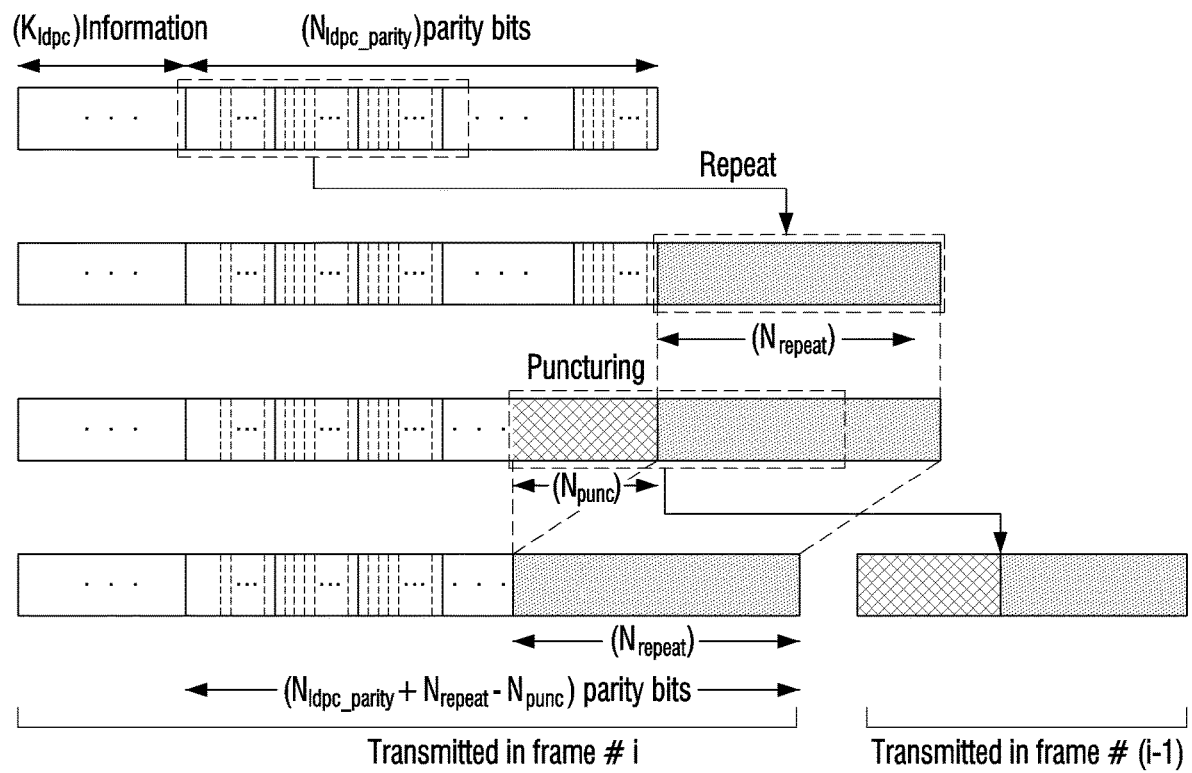

That is, when $N_{AP} \leq N_{punc}+N_{rep}$, as illustrated in FIG. 21, the additional parity generator 140 may select $N_{AP}$ bits from the first bit among the punctured LDPC parity bits. Therefore, for the additional parity bits, $(v_{N_{inner}-N_{punc}}, v_{N_{inner}-N_{punc}+1}, \ldots, v_{N_{inner}-N_{punc}+N_{AP}-1})$ may be selected.

Further, when the number of additional parity bits to be generated is greater than the sum of the number of punctured LDPC parity bits and the number of repeated LDPC parity bits, the additional parity generator 140 may select all the punctured LDPC parity bits and all the repeated LDPC parity bits and select bits as many as the number obtained by subtracting the number of punctured LDPC parity bits and the number of repeated LDPC parity bits from the number of additional parity bits to be generated from the first bit among the LDPC parity bits generated by the LDPC encoding to generate the additional parity bits.

Figure 22:
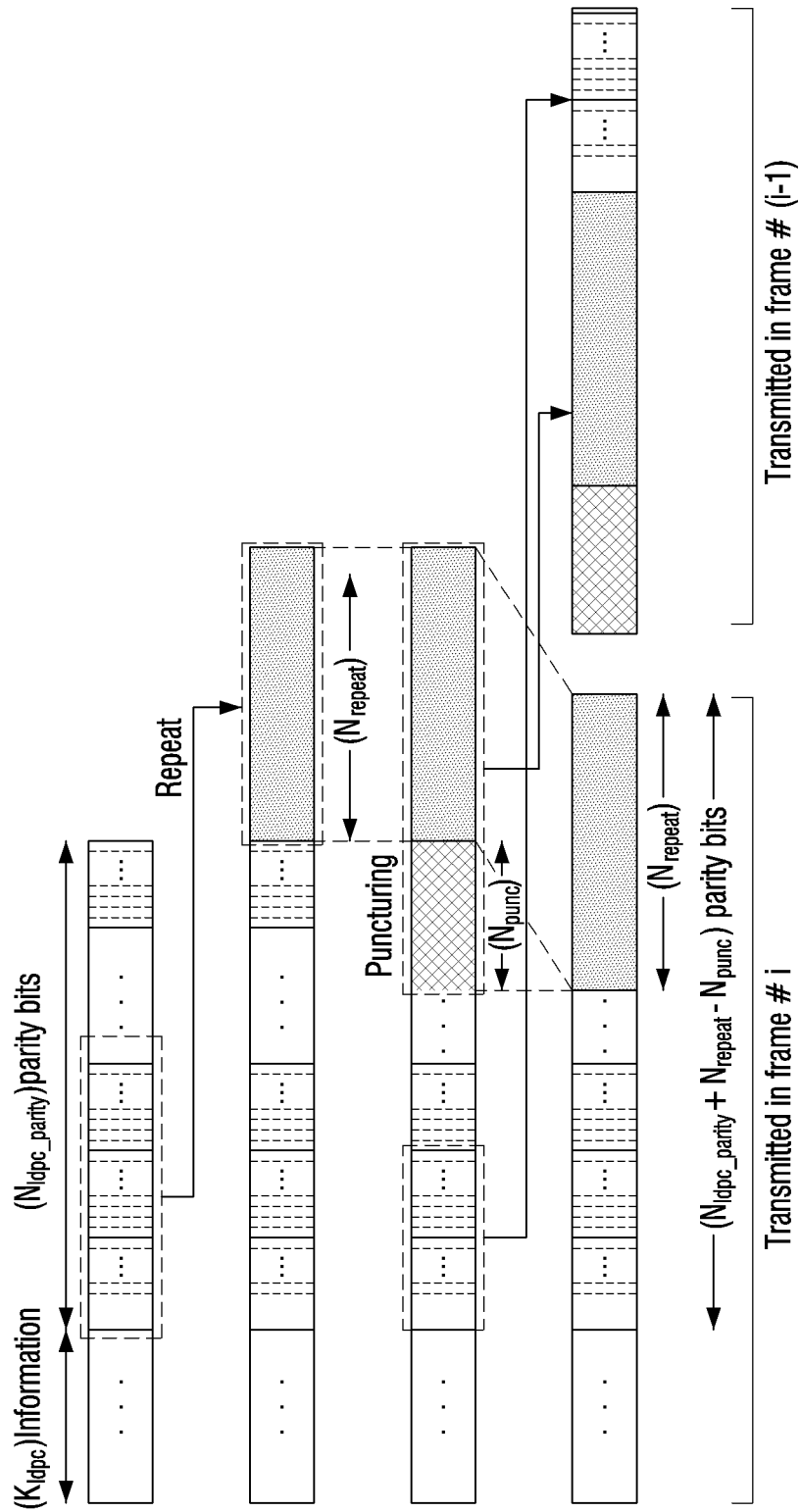

That is, when $N_{AP} > N_{punc}+N_{rep}$, as illustrated in FIG. 22, the additional parity generator 140 may first select all the punctured LDPC parity bits and all the repeated LDPC parity bits. Therefore, at first, $(v_{N_{inner}-N_{punc}}, v_{N_{inner}-N_{punc}+1}, \ldots, v_{N_{inner}-N_{repeat}-1})$ may be selected.

Further, the additional parity generator 140 may additionally select $N_{AP}-N_{punc}$ bits from the first bit among the $N_{ldpc\_parity}$ LDPC parity bits generated by the LDPC encoding. Therefore, $(v_{K_{ldpc}}, v_{K_{ldpc}+1}, \ldots, v_{K_{ldpc}+N_{AP}-N_{punc}-1})$ may be additionally selected.

As a result, for the additional parity bits, $(v_{N_{inner}-N_{punc}}, v_{N_{inner}-N_{punc}+1}, \ldots, v_{N_{inner}-N_{repeat}-1})$ and $(v_{K_{ldpc}}, v_{K_{ldpc}+1}, \ldots, v_{K_{ldpc}+N_{AP}-N_{punc}-1})$ may be selected.

As another example, when the number of additional parity bits to be generated is equal to or less than the number of punctured LDPC parity bits, the additional parity generator 140 may select bits as many as the number of additional parity bits to be generated from the punctured LDPC parity bits to generate the additional parity bits.

Figure 23:
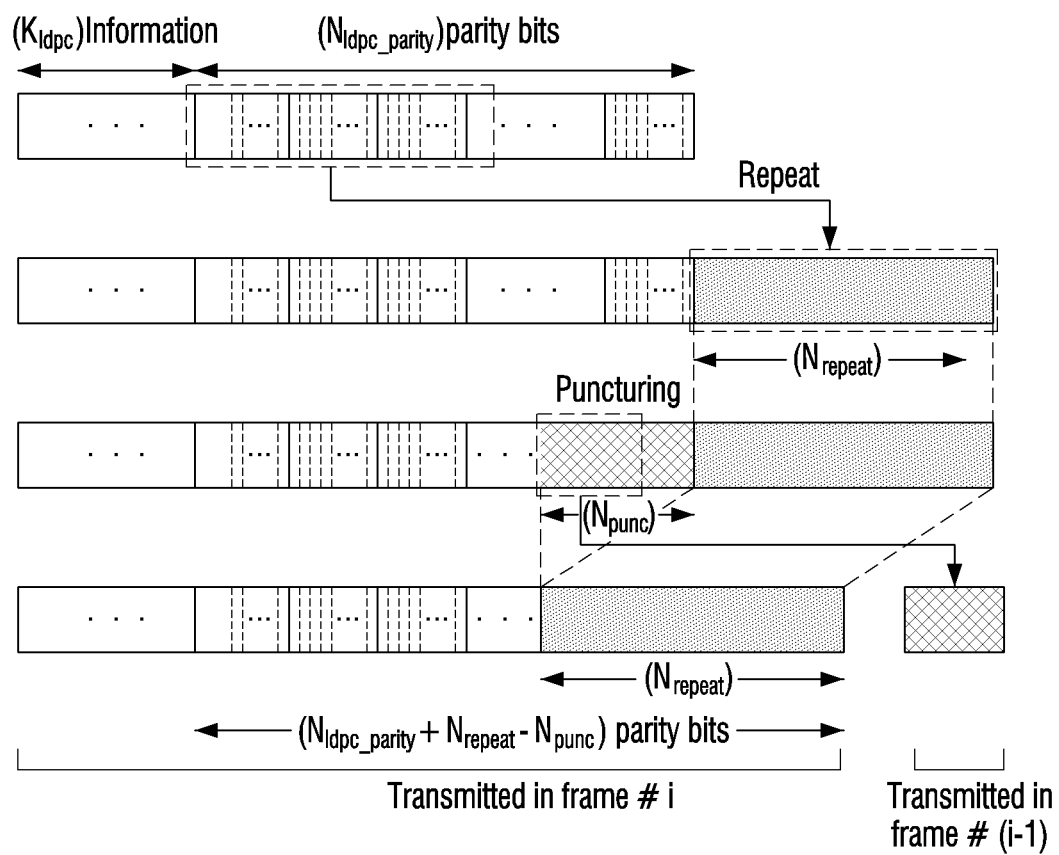

That is, when $N_{AP} \le N_{punc}$, as illustrated in FIG. 23, the additional parity generator 140 may select $N_{AP}$ bits from the first bit among the punctured LDPC parity bits to generate the additional parity bits. Therefore, for the additional parity bits, $(v_{N_{inner}-N_{punc}}, v_{N_{inner}-N_{punc}+1}, \ldots, v_{N_{inner}-N_{punc}+N_{AP}-1})$ may be selected.

Further, when the number of additional parity bits to be generated is greater than the number of punctured LDPC parity bits, the additional parity generator 140 selects all the punctured LDPC parity bits and selects bits corresponding to the number obtained by subtracting the number of punctured LDPC parity bits from the number of additional parity bits to be generated from the first bit among the LDPC parity bits generated by the LDPC encoding to generate the additional parity bits.

Figure 24:
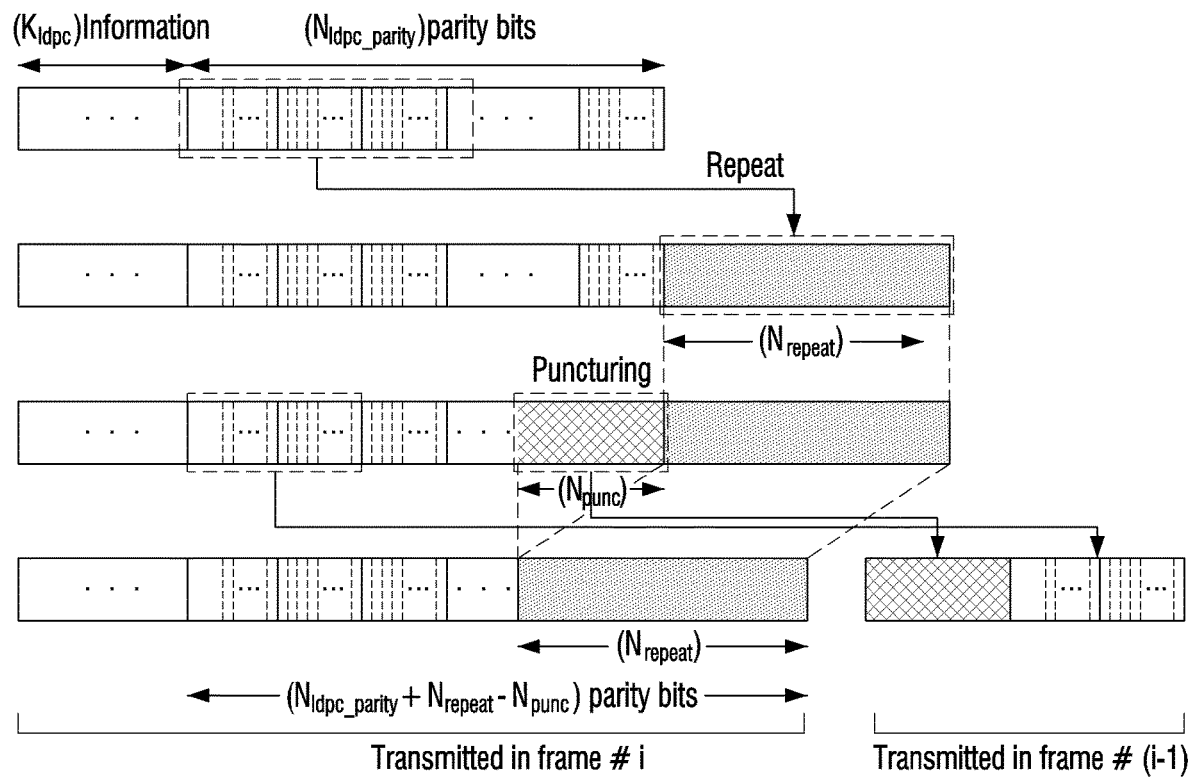

That is, when $N_{AP} > N_{punc}$, as illustrated in FIG. 24, the additional parity generator 130 may first select all the punctured LDPC parity bits. Therefore, at first, $(v_{N_{inner}-N_{punc}}, v_{N_{inner}-N_{punc}+1}, \ldots, v_{N_{inner}-N_{punc}+N_{AP}-1})$ may be selected.

Further, the additional parity generator 140 may additionally select $N_{AP}-N_{punc}$ bits from the first bit among the $N_{ldpc\_parity}$ LDPC parity bits generated by the LDPC encoding. Therefore, $(v_{K_{ldpc}}, v_{K_{ldpc}+1}, v_{K_{ldpc}+N_{AP}+N_{punc}-1})$ may be additionally selected.

As a result, for the additional parity bits, $(v_{N_{inner}-N_{punc}}, v_{N_{inner}-N_{punc}+1}, v_{N_{inner}-N_{punc}+N_{AP}-1})$ and $(v_{K_{ldpc}}, v_{K_{ldpc}+1}, v_{K_{ldpc}+N_{AP}-N_{punc}-1})$ may be selected.

According to another exemplary embodiment, another method for generating additional parity bits will be described below.

For example, a case in which $N_{punc} > 0$ and $N_{repeat} = 0$ is assumed.

In detail, when the number of punctured LDPC parity bits is equal to or greater than the number of additional parity bits to be generated, the additional parity generator 140 may select at least some from the punctured LDPC parity bits to generate the additional parity bits, and otherwise, select all the punctured LDPC parity bits and sequentially select the rest of the additional parity bits from the LDPC codeword to generate the additional parity bits.

Figure 25:
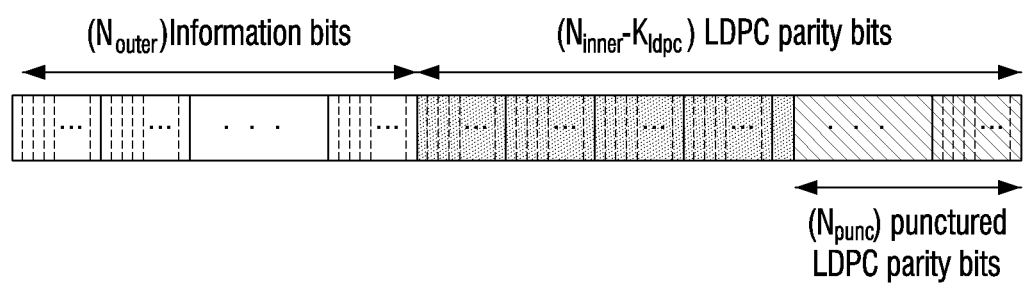

For example when $N_{punc} > 0$ and $N_{repeat} = 0$, the LDPC codeword may be represented as illustrated in FIG. 25. Here, the number of LDPC information bits is $N_{outer}$, zero bits are not padded, and thus, the LDPC information bits are formed of only the outer encoded bits.

Figure 26:
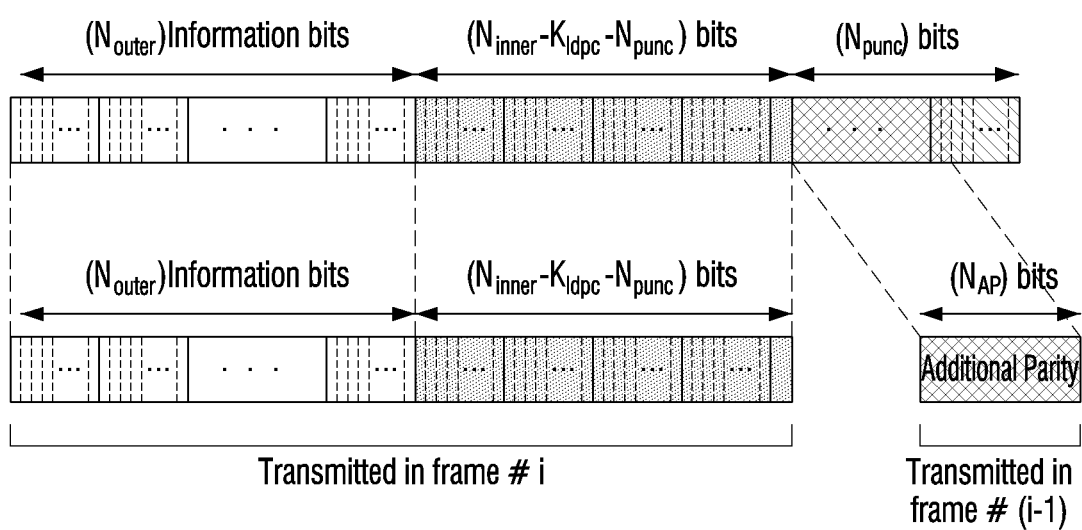

First, when $N_{AP} \le N_{punc}$, as illustrated in FIG. 26, the additional parity generator 140 may select the $N_{AP}$ bits from the punctured LDPC parity bits to generate the additional parity bits.

Figure 27:
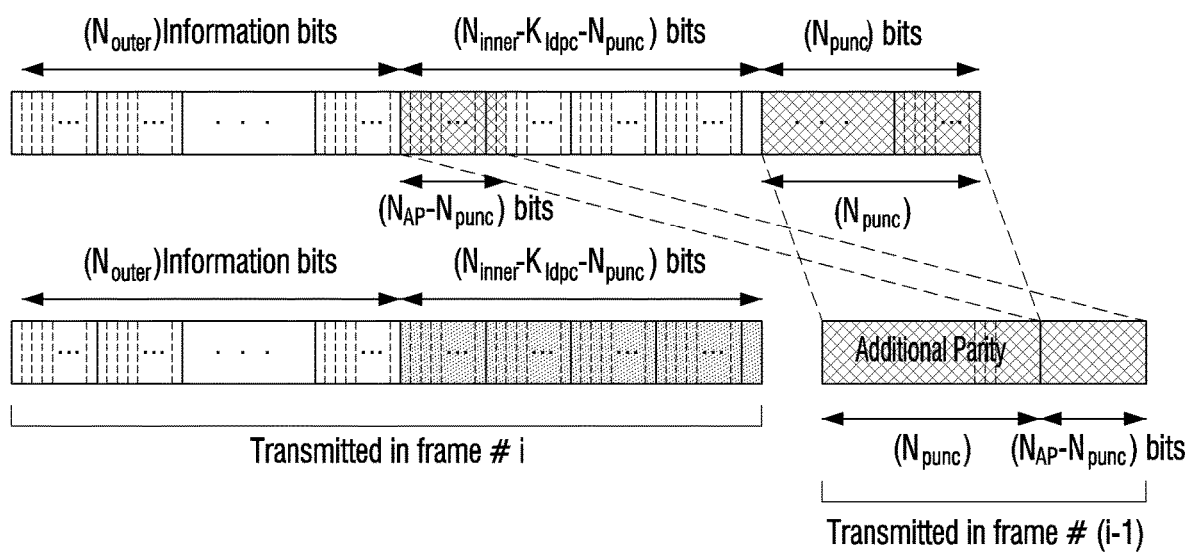

Further, when $N_{AP} > N_{punc}$, as illustrated in FIG. 27, the additional parity generator 140 may select all the punctured LDPC parity bits and additionally select $N_{AP}-N_{punc}$ bits from the first bit among the LDPC parity bits to generate the additional parity bits.

The foregoing example describes that $N_{AP}-N_{punc}$ bits are additionally selected from a first bit of the LDPC parity bits, which is only one example. That is, the additional parity generator 140 may also additionally select $N_{AP}-N_{punc}$ bits from the first bit among the LDPC information bits.

Figure 28:
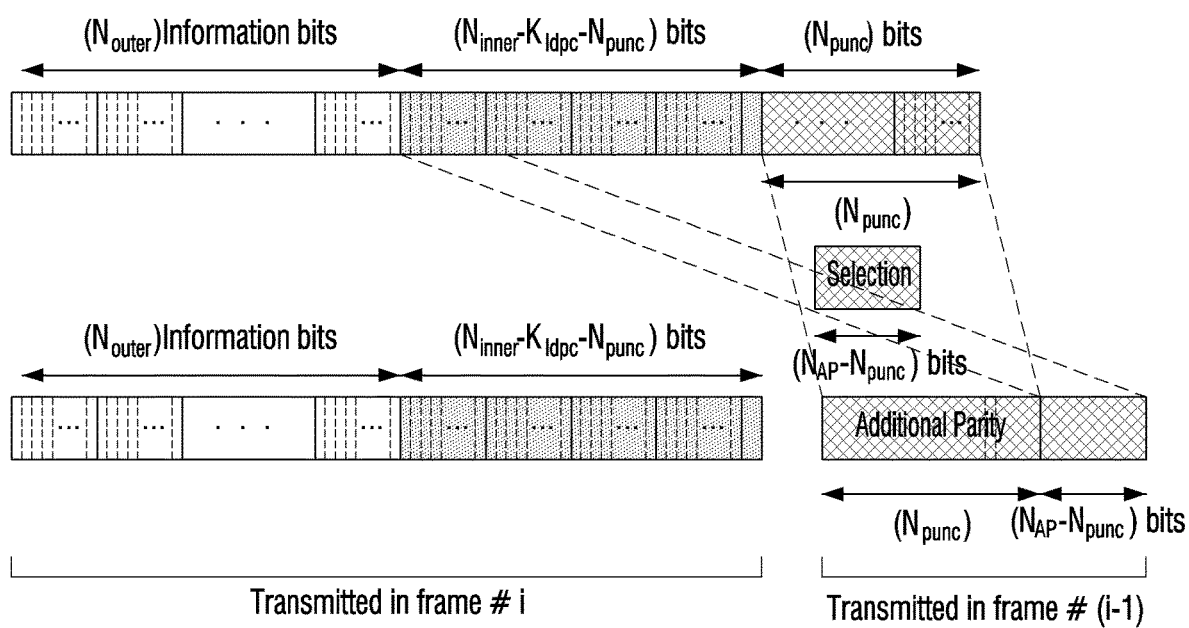

As another example, when $N_{AP} > N_{punc}$, as illustrated in FIG. 28, the additional parity generator 140 may select all the punctured LDPC parity bits and additionally select $N_{AP}-N_{punc}$ bits from the LDPC parity bits based on the preset pattern to generate the additional parity bits.

Figure 29:
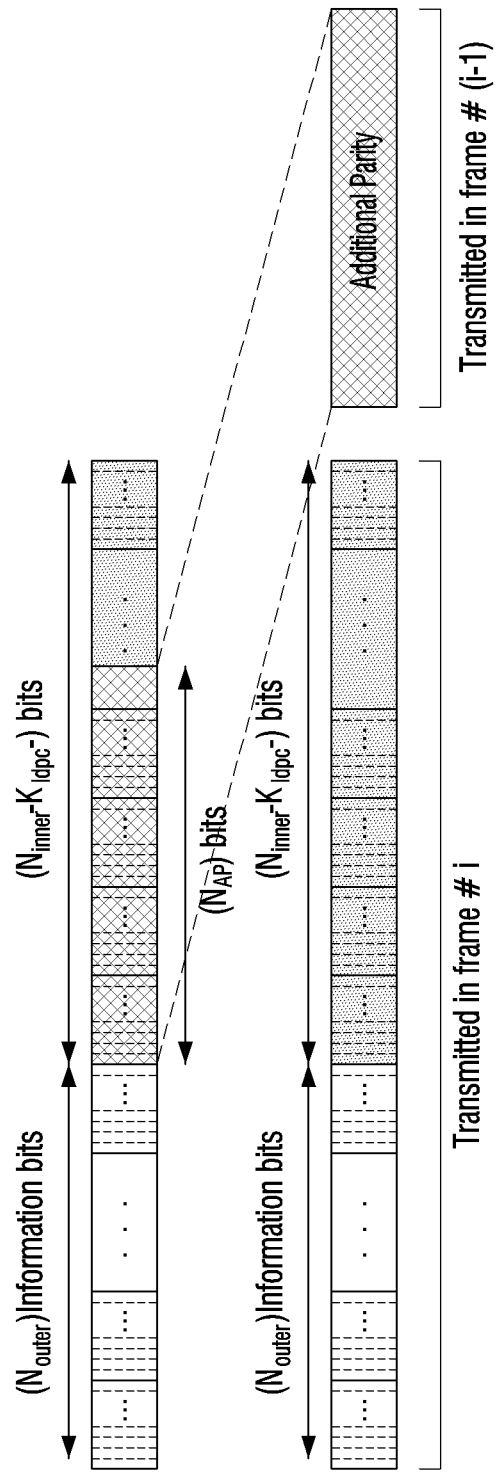

As another example, when $N_{punc} = 0$, as illustrated in FIG. 29, the additional parity generator 140 may select the $N_{AP}$ bits from the first LDPC parity bit to generate the additional parity bits.

The foregoing example describes that bits are selected within the LDPC codeword with repetition to generate the additional parity bits.

However, according to the exemplary embodiment, additional parity bits may also be selected from the LDPC codeword to generate the additional parity bits before repetition is performed. That is, the repetition may be performed after puncturing and generation of the additional parity bits. For this purpose, the LDPC encoder 110 may output the LDPC codeword to the puncturer 130 followed by the additional parity generator 140.

For example, a case in which the $N_{repeat} > 0$ is assumed. Hereinafter, it is assumed that the number of LDPC information bits is $K_{ldpc}$.

The additional parity generator 140 may preferentially, but not necessarily, select the punctured LDPC parity bits to generate the additional parity bits and select some of the LDPC parity bits as long as the number of punctured LDPC parity bits is less than the number of additional parity bits to be generated to generate the additional parity bits.

In this case, the LDPC parity bits may be formed of only the LDPC parity bits generated by the LDPC encoding.

In detail, the additional parity generator 140 may start to select the first LDPC parity bit to generate the additional parity bits.

According to another exemplary embodiment, a case in which $N_{repeat} < N_{ldpc\_parity} - N_{punc}$ is assumed.

When $N_{AP} \le N_{punc}$, the additional parity generator 140 may perform the selection from the punctured LDPC parity bits to generate the additional parity bits.

Figure 30:
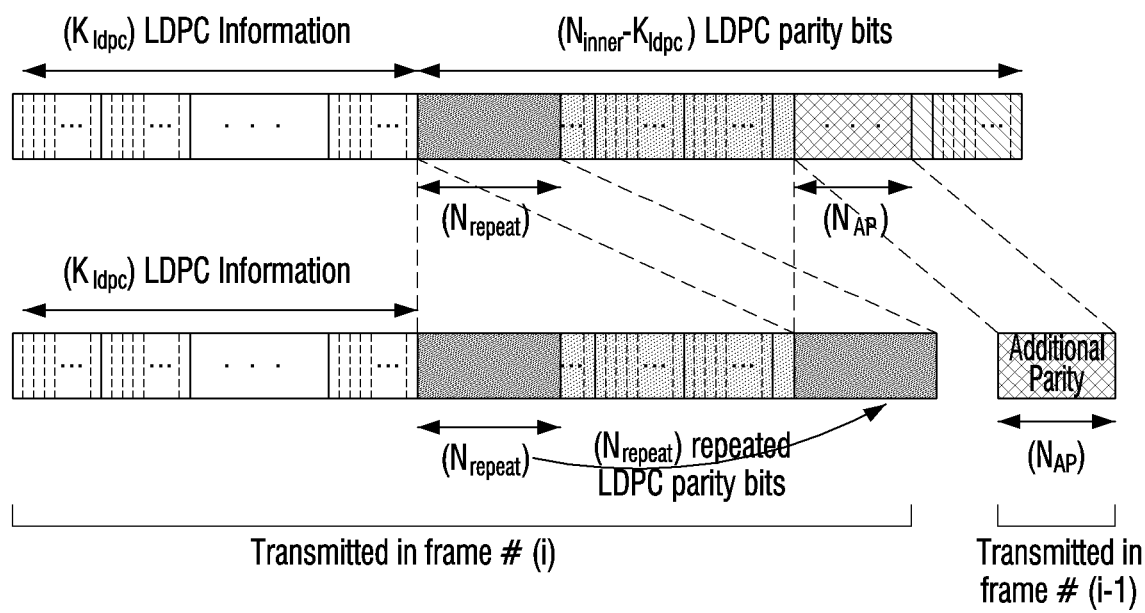

For example, as illustrated in FIG. 30, the additional parity generator 140 may select $N_{AP}$ bits from the first bit among the punctured LDPC parity bits to generate the additional parity bits. In this case, as illustrated in FIG. 30, the repeater 120 may select the $N_{repeat}$ bits from the first bit among the LDPC parity bits and add the selected $N_{repeat}$ bits after the LDPC parity bits. Thus, after the puncturing, the repetition bits are positioned after the LDPC parity bits which are not punctured.

Figure 31:
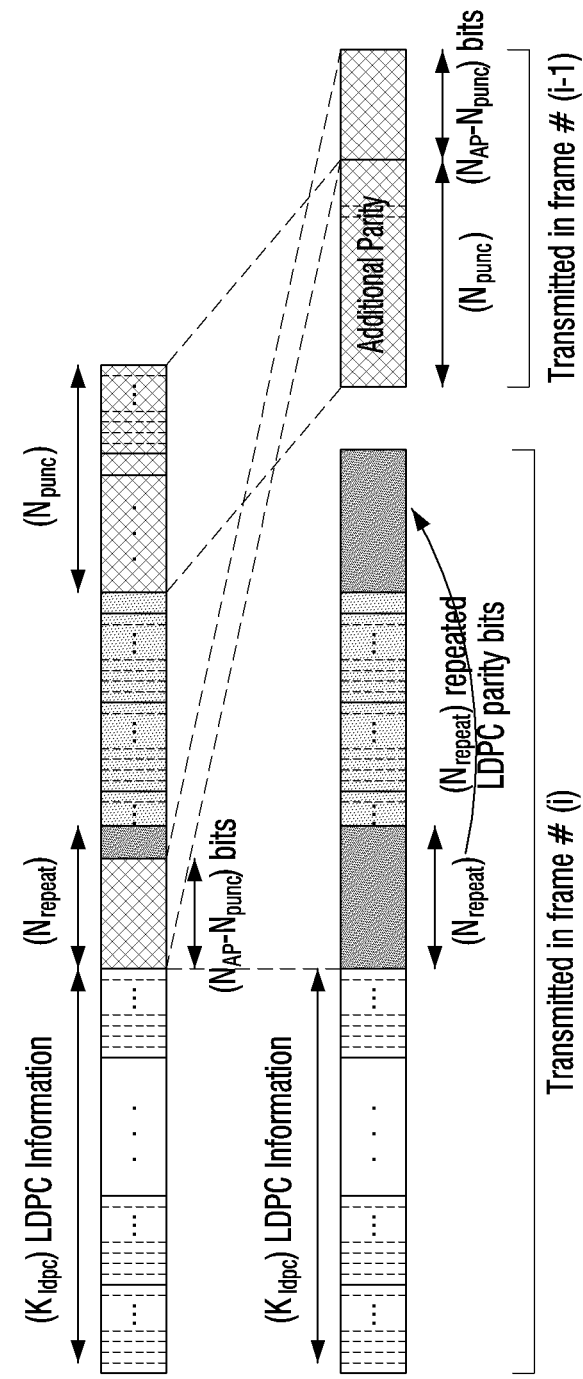

When $N_{AP} > N_{punc}$, as illustrated in FIG. 31, the additional parity generator 140 may select all the punctured LDPC parity bits and select $N_{AP}-N_{punc}$ bits from the first LDPC parity bit to generate the additional parity bits.

In this case, as illustrated in FIG. 30, the repeater 120 may select the $N_{repeat}$ bits from the first bit among the LDPC parity bits and add the selected $N_{repeat}$ bits after the LDPC parity bits, and thus, after the puncturing, the repetition bits are positioned after the LDPC parity bits which are not punctured. Therefore, at least some of the bits selected as the additional parity bits in the LDPC parity bits may be selected as the repetition bits.

As another example, the case in which $N_{ldpc\_parity} \ge N_{repeat} \ge N_{ldpc\_parity} - N_{punc}$ is assumed.

Figure 32:
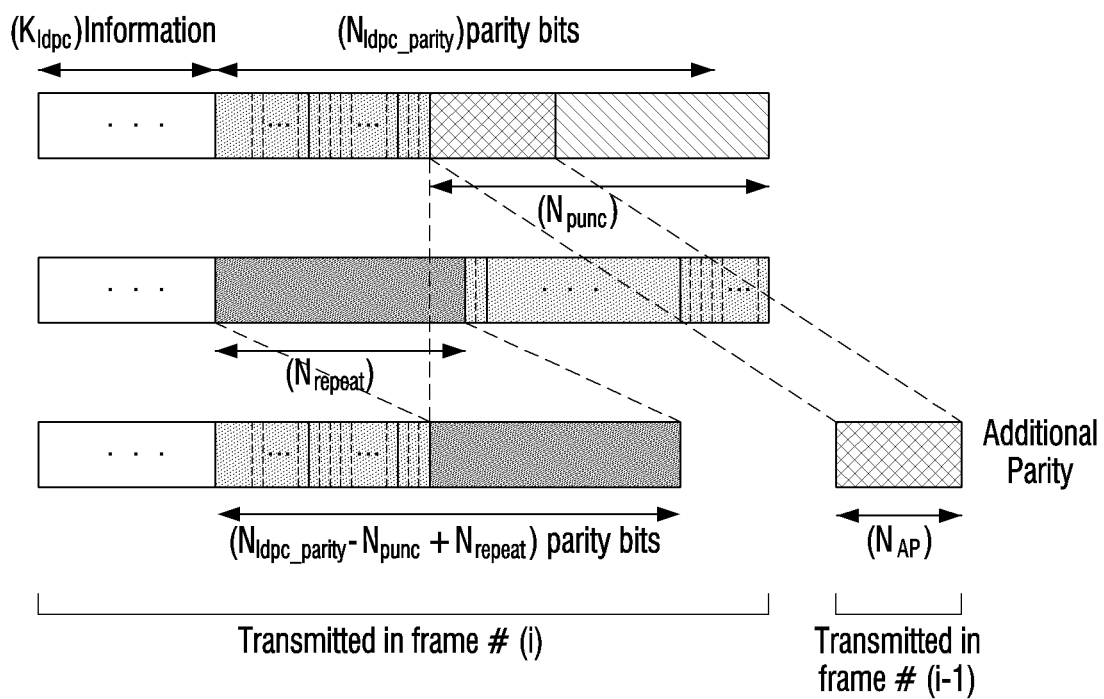

When $N_{AP} \le N_{punc}$, as illustrated in FIG. 32, the additional parity generator 140 may select $N_{AP}$ bits from the first bit among the punctured LDPC parity bits to generate the additional parity bits. In this case, as illustrated in FIG. 32, the repeater 120 may select the $N_{repeat}$ bits from the first bit among the LDPC parity bits and add the selected $N_{repeat}$ bits after the LDPC parity bits, and thus, after the puncturing, the repetition bits are positioned after the LDPC parity bits which are not punctured.

Figure 33:
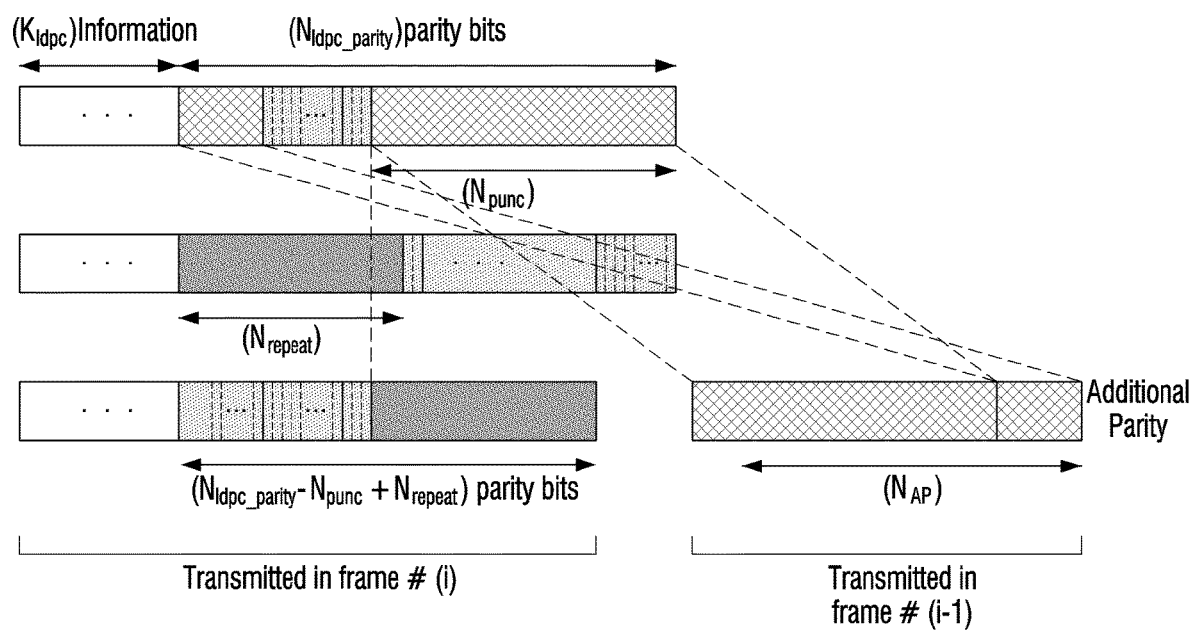

When $N_{AP}>N_{punc}$, as illustrated in FIG. 33, the additional parity generator 140 may select all the punctured LDPC parity bits and select $N_{AP}-N_{punc}$ bits from the first LDPC parity bit to generate the additional parity bits.

In this case, as illustrated in FIG. 33, the repeater 120 may select the $N_{repeat}$ bits from the first bit among the LDPC parity bits and add the selected $N_{repeat}$ bits after the LDPC parity bits, and thus, after the puncturing, the repetition bits are positioned after the LDPC parity bits which are not punctured. Therefore, at least some of the bits selected as the additional parity bits in the LDPC parity bits may be selected as the repetition bits.

As another example, a case in which $N_{repeat}>N_{ldpc\_parity}$ is assumed.

Figure 34:
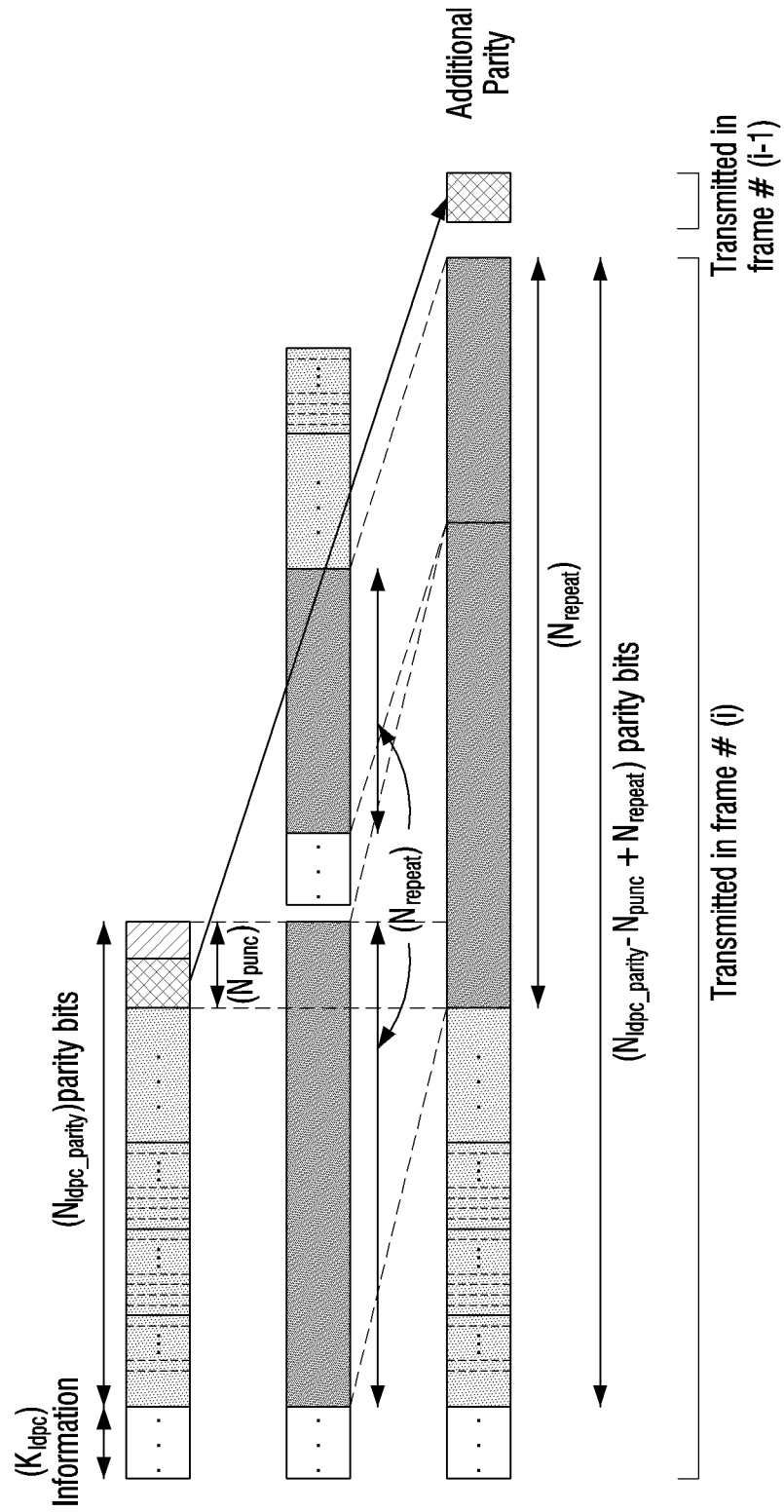

When $N_{AP}\leq N_{punc}$, as illustrated in FIG. 34, the additional parity generator 140 may select $N_{AP}$ bits from the first bit among the punctured LDPC parity bits to generate the additional parity bits.

When $N_{AP}>N_{punc}$ as illustrated in FIG. 33, the additional parity generator 140 may select all the punctured LDPC parity bits and select $N_{AP}-N_{punc}$ bits from the first LDPC parity bit to generate the additional parity bits.

In this case, as illustrated in FIGS. 33 and 34, the repeater 120 may select the $N_{repeat}$ bits from the first bit among the LDPC parity bits and add the selected $N_{repeat}$ bits after the LDPC parity bits, and thus, after the puncturing, the repetition bits are positioned after the LDPC parity bits which are not punctured.

Figure 35:
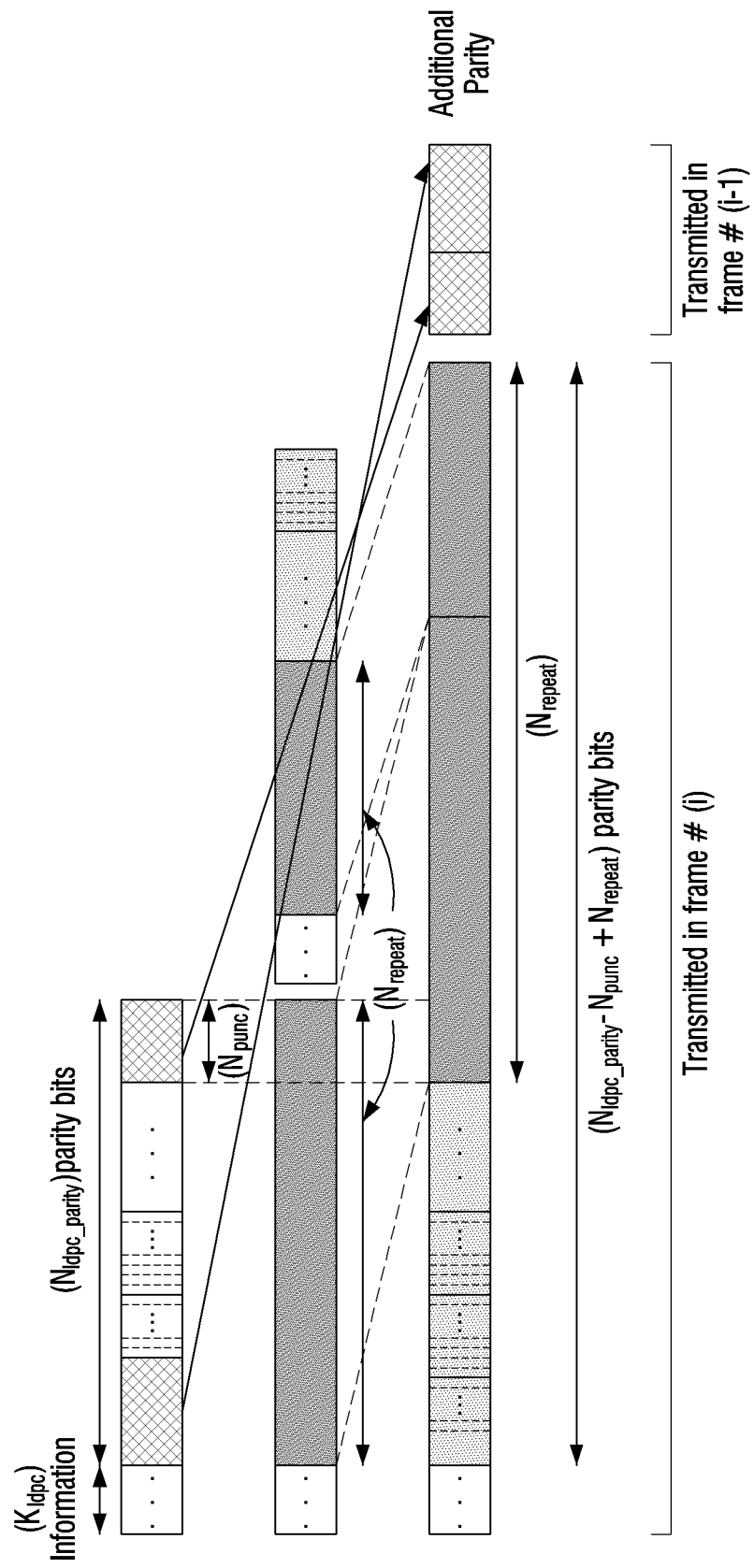

Further, when $N_{repeat}$ is greater than $N_{ldpc\_parity}$, as illustrated in FIGS. 34 and 35, all the LDPC parity bits may be repeated and at least some of the LDPC parity bits may be additionally repeated.

The additional parity generator 140 may also select the predetermined number of bits from the rest of the LDPC parity bits other than the repeated LDPC parity bits among the LDPC parity bits.

Figure 36:
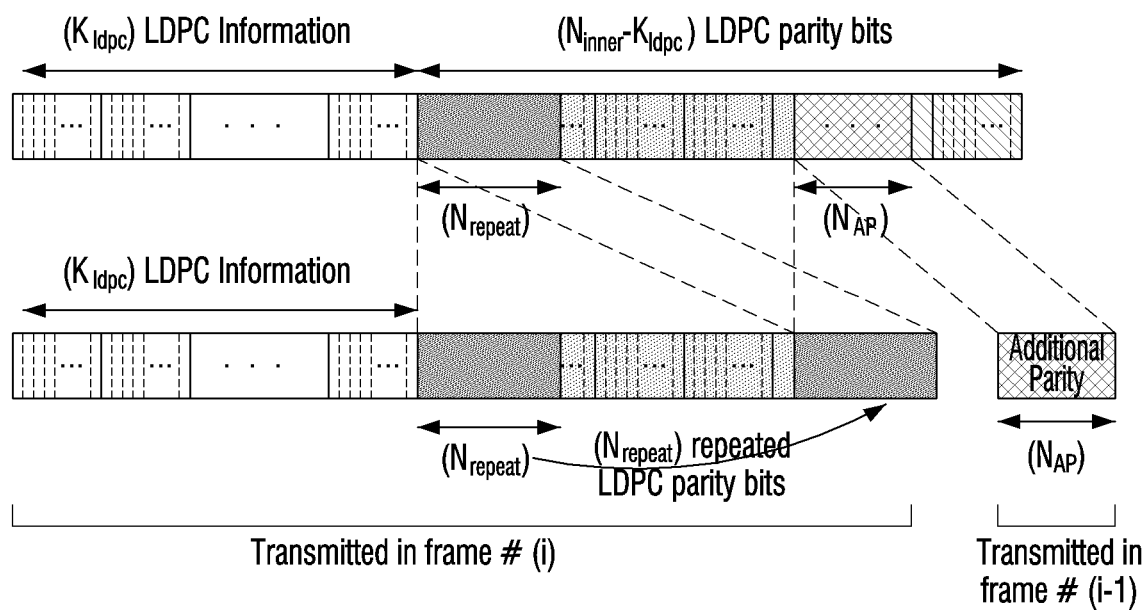

For example, in the case of $N_{AP}\leq N_{punc}$, as illustrated in FIG. 36, the additional parity generator 140 may select $N_{AP}$ bits from the first bit among the punctured LDPC parity bits to generate the additional parity bits.

Figure 37:
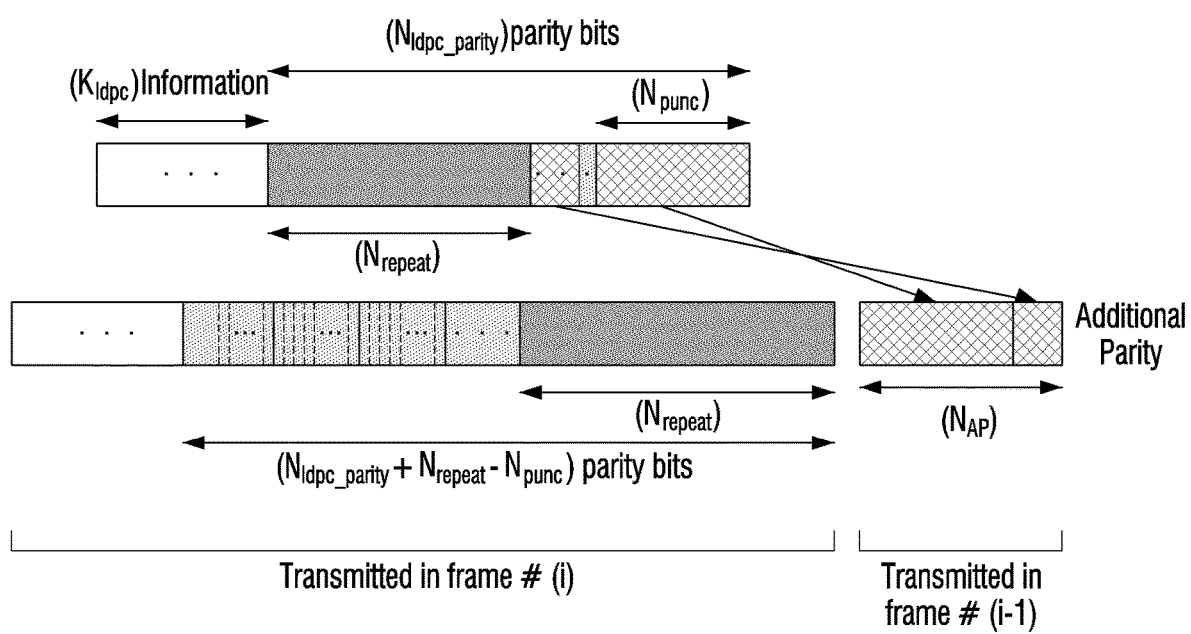

Further, when $N_{AP}>N_{punc}$, as illustrated in FIG. 37, the additional parity generator 140 may select all the punctured LDPC parity bits and select $N_{AP}-N_{punc}$ bits from the first bit among the rest of the LDPC parity bits other than the repeated LDPC parity bits among the LDPC parity bits to generate the additional parity bits.

Figure 38:
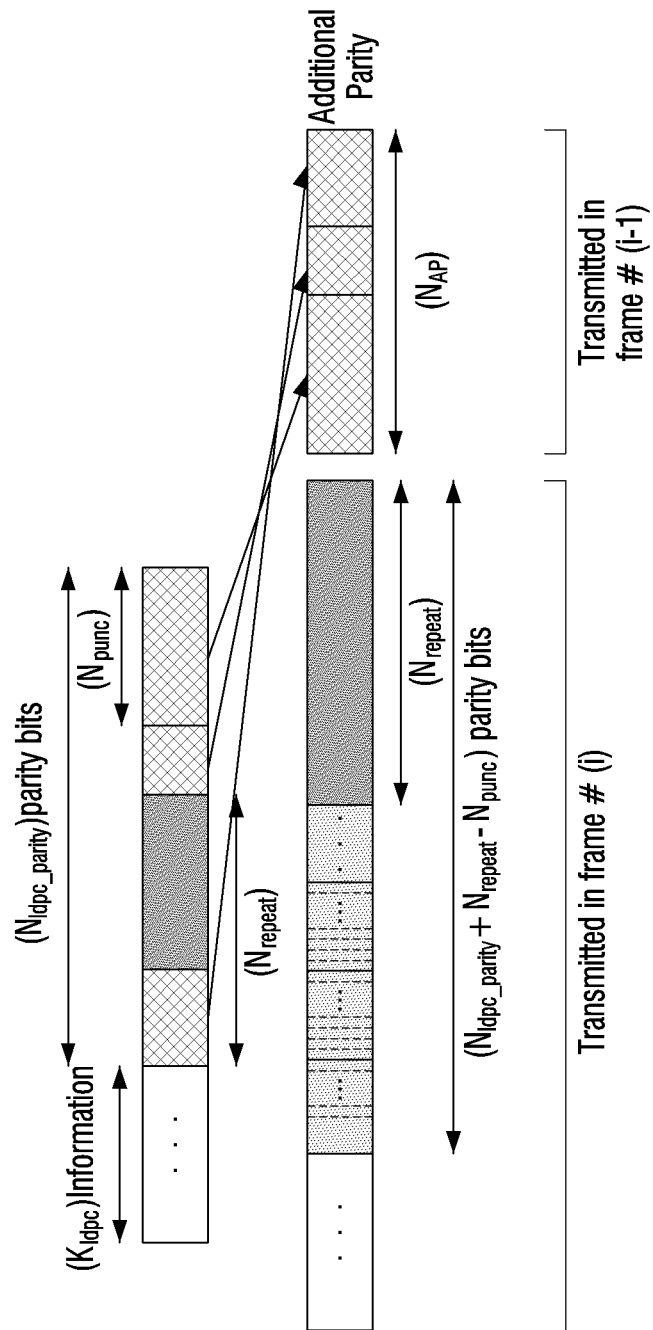

In this case, as illustrated in FIG. 38, when all of the rest of the LDPC parity bits other than the repeated LDPC parity bits among the LDPC parity bits are selected, the additional parity generator 130 may select the rest of the additional bits from the repeated LDPC parity bits to generate the additional parity bits.

The foregoing example describes that bits are selected from the LDPC parity bits to generate the additional parity bits, which is only one example. Therefore, when the number of LDPC parity bits is less than the number of additional parity bits to be generated, the additional parity generator 140 may also select bits from the outer encoded bits and the LDPC parity bits to generate the additional parity bits.

In this case, when bits are selected from the outer encoded bits and the LDPC parity bits, the additional parity generator 140 may select bits other than the already selected bits. In this case, when redundant selection is made, bits having the smallest selection frequency may be first selected to generate the additional parity bits.

Further, the foregoing example describes that the repetition is performed along with generation of the additional parity bits in consideration of the repetition bits, which is only one example. That is, in some cases, the repetition may also be omitted.

In this case, when the number of additional parity bits to be generated is equal to or less than the number of punctured LDPC parity bits, the additional parity generator 140 may select bits as many as the number of additional parity bits to be generated from the first bit among the punctured LDPC parity bits to generate the additional parity bits.

Further, when the number of additional parity bits to be generated is greater than the number of punctured LDPC parity bits, the additional parity generator 140 may select all the punctured LDPC parity bits and select bits as many as the number obtained by subtracting the number of punctured LDPC parity bits from the number of additional parity bits to be generated from the first bit among the LDPC parity bits, that is, the LDPC parity bits generated by the LDPC encoding to generate the additional parity bits.

Further, the foregoing example describes that the LDPC parity bits are selected in a bit unit to generate the additional parity bits, which is only one example. Therefore, the additional parity generator 140 may also select the LDPC parity bits in a bit group unit to generate the additional parity bits.

For example, a case in which an LDPC codeword ($v_0$, $v_1$, ..., $v_{N_{inner}-1}$) is divided into $N_{group}$ bit groups, and thus, is represented like $V=(Y_0, Y_1, ..., Y_{N_{group}-1})$ is assumed.

In this case, the additional parity generator 140 may calculate a temporary number $N_{AP\_temp}$ of additional parity bits based on following Equation 13.

$$N_{AP\_temp}=\alpha \times K \times (N_{ldpc\_parity}-N_{punc}), \quad (13)$$

In above Equation 13, $N_{ldpc\_parity}$ is the number of LDPC parity bits and $N_{punc}$ is the number of punctured LDPC parity bits. Further, $\alpha=0.5$ and $K=0, 1, 2$.

Further, the additional parity generator 140 may calculate the number N of additional parity bits based on following Equation 14 or 15.

$$N_{AP} = \left\lceil \frac{N_{AP\_temp}}{\eta_{MOD}} \right\rceil \times \eta_{MOD} \quad (14)$$

$$N_{AP} = \left\lfloor \frac{N_{AP\_temp}}{\eta_{MOD}} \right\rfloor \times \eta_{MOD} \quad (15)$$

In these Equations 14 and 15, $\lceil x \rceil$ represents a minimum integer which is equal to or greater than x and $\lfloor x \rfloor$ represents a maximum integer which is not greater than x. Here, $\eta_{MOD}$ is a modulation order. For example, in QPSK, 16-QAM, 64-QAM and 256-QAM, $\eta_{MOD}$ may be 2, 4, 6 and 8, respectively.

Next, the additional parity generator 140 may select bits as many as the calculated number in the LDPC parity bits to generate the additional parity bits.

In detail, when the number of additional parity bits to be generated is equal to or less than the number of punctured LDPC parity bits, the additional parity generator 140 may select bits as many as the calculated number from the first bit among the punctured LDPC parity bits to generate the additional parity bits.

Figure 39:
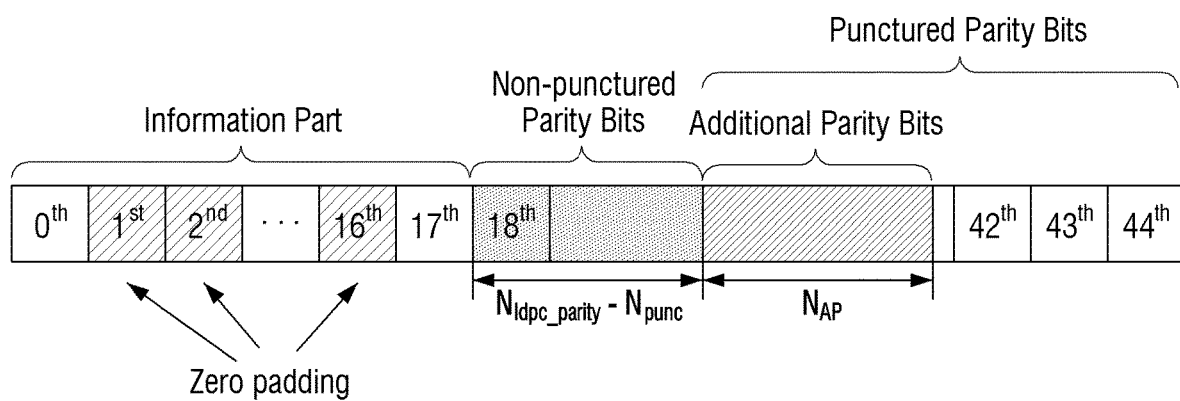

That is, when $N_{AP}\leq N_{punc}$, as illustrated in FIG. 39, the additional parity generator 140 may select N bits from the first bit among the punctured LDPC parity bits to generate the additional parity bits. Therefore, for the additional parity bits, ($v_{N_{inner}-N_{punc}}$, $v_{N_{inner}-N_{punc}+1}$, . . . , $v_{N_{inner}-N_{punc}+N_{AP}-1}$) may be selected.

When the number of additional parity bits to be generated is greater than the number of punctured LDPC parity bits, that is, $N_{AP}>N_{punc}$, the additional parity generator 140 may first select all the punctured LDPC parity bits. Therefore, $v_{N_{inner}-N_{punc}}$, $v_{N_{inner}-N_{punc}+1}$, . . . , $v_{N_{inner}-1}$ may be selected as the additional parity bits.

Further, the additional parity generator 140 may select bits as many as the number obtained by subtracting the number of punctured LDPC parity bits from the number of additional parity bits to be generated in a bit group unit.

For this purpose, the additional parity generator 140 may calculate the number of bit groups in which all bits within a bit group are selected for the additional parity bits, based on following Equation 16.

$$N_{AP\_groups} = \left\lfloor \frac{N_{AP} - N_{punc}}{360} \right\rfloor \quad (16)$$

Further, the additional parity generator 140 may determine at least one bit group used to generate the additional parity bits among a plurality of bit groups based on an additional parity pattern, and select all bits within some of the determined bit group and some bits within the rest of the plurality of bit groups to generate the additional parity bits.

In this case, the additional parity pattern is a pattern defining an order of bit groups selected as the additional parity bits among the plurality of bit groups configuring the LDPC parity bits, and, for example, may be defined like $\pi_{AP}(0)=x_0$, $\pi_{AP}(1)=x_1$, . . . , $\pi_{AP}(N_{group}-1)=x_{N_{group}-1}$, for $\pi_{AP}(j)(0 \leq j < N_{group})$.

Here, $x_0, x_1, \ldots, x_{N_{group}-1}$ represent an index of the plurality of bit groups configuring the LDPC parity bits, $N_{group}$ represents the number of the plural of bit groups configuring the LDPC parity bits, and one bit group may be formed of 360 bits.

In detail, the additional parity generator 140 may select all bits of a ($\pi_{AP}(0)$-th) bit group, a $\pi_{AP}(1)$-th bit group, . . . , a $\pi_{AP}(N_{AP\_group}-1)$-th bit group among the plurality of bit groups for the additional parity bits, based on the additional parity pattern. That is, all bits of an $x_0$-th bit group, an $x_1$-th bit group, . . . , an $x_{N_{group}-1}$-th bit group may be selected as the additional parity bits.

The additional parity generator 140 needs to select $N_{AP}-N_{punc}$ bits but bits selected from the $N_{AP\_groups}$ bit groups are $360 \times N_{AP\_groups}$, and therefore, the additional parity generator 140 may additionally select $N_{AP}-N_{punc}-360 \times N_{AP\_groups}$ bits.

In this case, the additional parity generator 140 may determine a bit group including additionally selected bits based on the additional parity pattern, and additionally select $N_{AP}-N_{punc}-360 \times N_{AP\_groups}$ bits from the first bit of the determined bit group.

In detail, the additional parity generator 140 may determine a $\pi_{AP}(N_{AP\_groups})$-th bit group based on the additional parity pattern, and select a first bit to $N_{AP}-N_{punc}-360 \times N_{AP\_groups}$ bits of the $\pi_{AP}(N_{AP\_groups})$-th bit group for the additional parity bits. That is, a bit of an $x_{N_{group}}$-th bit group to $N_{AP}-N_{punc}-360 \times N_{AP\_groups}$ bits may be additionally selected as the additional parity bits.

Figure 40:
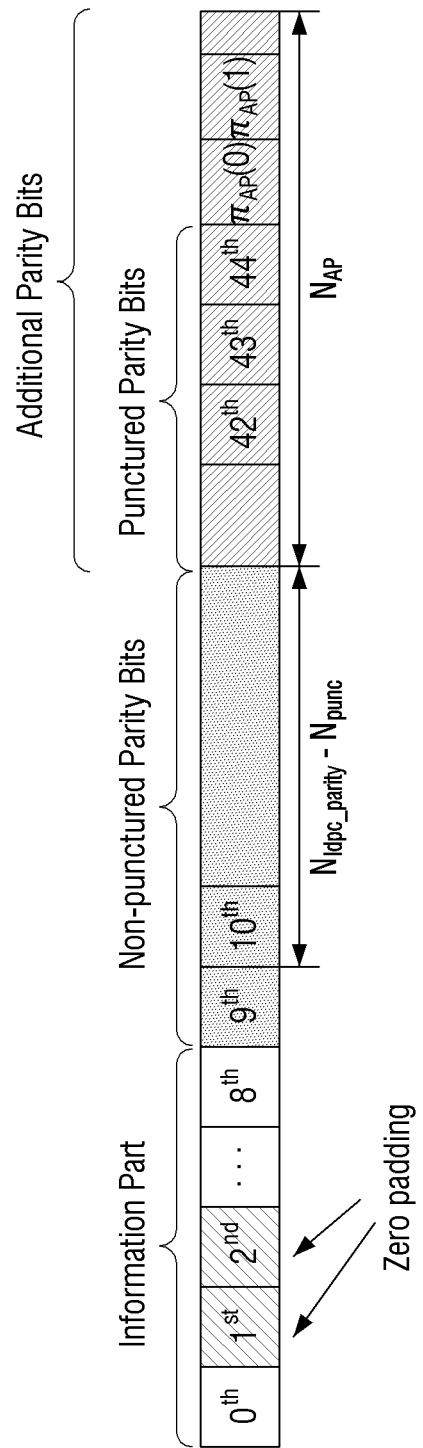

As a result, when $N_{AP}>N_{punc}$, as illustrated in FIG. 40, the additional parity generator 140 may select all the punctured LDPC parity bits, and select all bits of a $\pi_{AP}(0)$-th bit group, a $\pi_{AP}(1)$-th bit group, . . . , a $\pi_{AP}(N_{AP\_groups}-1)$-th bit group and a first bit to $N_{AP}-N_{punc}-360 \times N_{AP\_groups}$ bits of the $\pi_{AP}(N_{AP\_groups})$ bit group to generate the additional parity bits.

In the case in which repetition is selected based on a predetermined pattern, a predetermined repetition pattern may be used by being preferentially considered when the additional parity bits are selected. That is, bits after the repetition bits are selected based on the repetition pattern to be selected as the additional parity bits. When the number other than the number of repetition bits from the maximum number of repetition bits defined as the repetition pattern is larger than the number of additional parity bits to be generated, the additional parity bits may be generated based on both of the repetition pattern and the additional parity pattern. The repetition pattern means an order of groups having excellent transmission/reception performance among bits included in a given LDPC codeword when transmitting the LDPC codeword, and thus, the additional parity is generated based on the repetition pattern, and when the additional parity bit is further required, it is based on the pattern of the additional parity bit.

The transmitter 100 may transmit the bits output from the puncturer 130 and the bits output from the additional parity generator 140 to the receiver 200.

In this case, the transmitter 100 may transmit the LDPC codeword bits, that is, the repeated, punctured, and shortened LDPC codeword other than zero bits padded in the repeated and punctured LDPC codeword output from the puncturer 130 to the receiver 200.

In detail, the transmitter 100 may modulate the repeated, punctured and shortened LDPC codeword bits and the additional parity bits, respectively, map the bits to the constellation symbols, and map the symbols to a frame for transmission to the receiver 200.

However, when the repetition is omitted, the transmitter 100 may transmit the LDPC codeword bits, that is, the punctured and shortened LDPC codeword other than zero bits padded in the punctured LDPC codeword to the receiver 200.

In this case, the transmitter 100 may perform modulation by QPSK, 16-QAM, 64-QAM, 256-QAM, or the like, and modulate the repeated, punctured, and shortened LDPC codeword bits (or punctured and shortened LDPC codeword) and the additional parity bits by the same modulation scheme.

The transmitter 100 may map the additional parity bits generated based on the information bits transmitted in a current frame to a frame before the current frame.

That is, the transmitter 100 may map the punctured and shortened LDPC codeword including the information bits corresponding to an (i−1)-th frame to the (i−1)-th frame, and map the additional parity bits generated based on the information bits corresponding to an i-th frame to the (i−1)-th frame and transmit the mapped bits to the receiver 200.

Therefore, the information bits corresponding to the (i−1)-th frame and the parity bits generated based on the information bits as well as the additional parity bits generated based on the information bits corresponding to the i-th frame may be mapped to the (i−1)-th frame.

As described earlier, since the information bits are signaling including information required for the receiver 200 to process service data, the transmitter 100 may map the data to a frame along with the signaling for processing and transmit the mapped data and signaling to the receiver 200.

In detail, the transmitter 100 may process the data in a predetermined scheme to generate constellation symbols and map the generated constellation symbols to data symbols of each frame. Further, the transmitter 100 may map the signaling for the data mapped to each frame to a preamble of a corresponding frame. For example, the transmitter 100 may map the signaling for the data mapped to the i-th frame to the i-th frame.

As a result, the receiver 200 may use the signaling acquired from the frame to acquire and process the data from the corresponding frame.

According to an exemplary embodiment, the foregoing information bits may constitute L1-detail signaling. The transmitter 100 may generate additional parity bits for the L1-detail signaling by using the foregoing method and transmit the generated additional parity bits to the receiver 200.

Here, the L1-detail signaling may be signaling defined in an Advanced Television System Committee (ATSC) 3.0 standard.

There are seven (7) modes of processing the L1-detail signaling processing. The transmitter 100 according to the exemplary embodiment may generate the additional parity bits for the L1-detail signaling based on the seven modes.

The ATSC 3.0 standard defines L1-basic signaling besides the L1-detail signaling. The transmitter 100 may process the L1-basic signaling and the L1-detail signaling by using a specific scheme and transmit the processed L1-basic signaling and L1-detail signaling to the receiver 200.

A method for processing the L1-basic signaling and the L1-detail signaling will be described below.

The transmitter 100 may map the L1-basic signaling and the L1-detail signaling to a preamble of a frame and map data to data symbols of the frame for transmission to the receiver 200.

Figure 41:
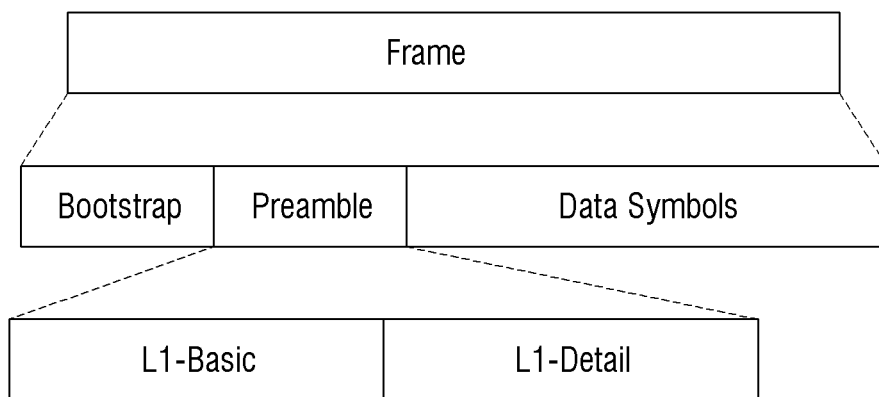
FIG. 41 is a diagram for describing a frame structure, according to an exemplary embodiment.

Referring to FIG. 41, the frame may be configured of three parts, that is, a bootstrap part, a preamble part, and a data part.

The bootstrap part is used for initial synchronization and provides a basic parameter required for the receiver 200 to decode the L1 signaling. Further, the bootstrap part may include information about a mode of processing the L1-basic signaling at the transmitter 100, that is, information about a mode the transmitter 100 uses to process the L1-basic signaling.

The preamble part includes the L1 signaling, and may be configured of two parts, that is, the L1-basic signaling and the L1-detail signaling.

Here, the L1-basic signaling may include information about the L1-detail signaling, and the L1-detail signaling may include information about data. Here, the data is broadcasting data for providing broadcasting services and may be transmitted through at least one physical layer pipes (PLPs).

In detail, the L1-basic signaling includes information required for the receiver 200 to process the L1-detail signaling. This information includes, for example, information about a mode of processing the L1-detail signaling at the transmitter 100, that is, information about a mode the transmitter 100 uses to process the L1-detail signaling, information about a length of the L1-detail signaling, information about an additional parity mode, that is, information about a K value used for the transmitter 100 to generate additional parity bits using an L1B_L1_Detail_additional_parity_mode (here, when the L1B_L1_Detail_additional_parity_mode is set as '00', K=0 and the additional parity bits are not used), and information about a length of total cells. Further, the L1-basic signaling may include basic signaling information about a system including the transmitter 100 such as a fast Fourier transform (FFT) size, a guard interval, and a pilot pattern.

Further, the L1-detail signaling includes information required for the receiver 200 to decode the PLPs, for example, start positions of cells mapped to data symbols for each PLP, PLP identifier (ID), a size of the PLP, a modulation scheme, a code rate, etc.

Therefore, the receiver 200 may acquire frame synchronization, acquire the L1-basic signaling and the L1-detail signaling from the preamble, and receive service data required by a user from data symbols using the L1-detail signaling.

The method for processing the L1-basic signaling and the L1-detail signaling will be described below in more detail with reference to the accompanying drawings.

Figure 42:
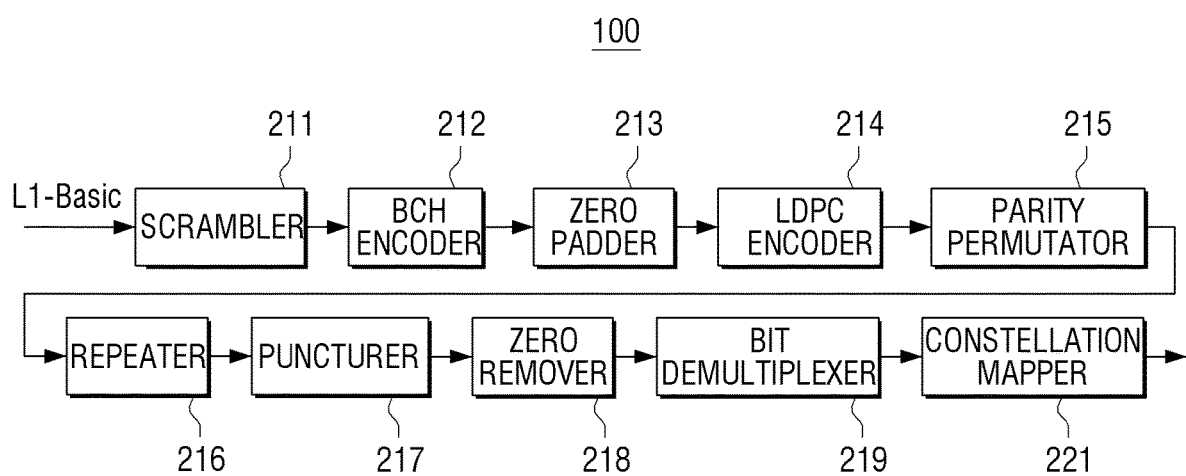
FIGS. 42 and 43 are block diagrams for describing detailed configurations of a transmitter, according to exemplary embodiments.
Figure 43:
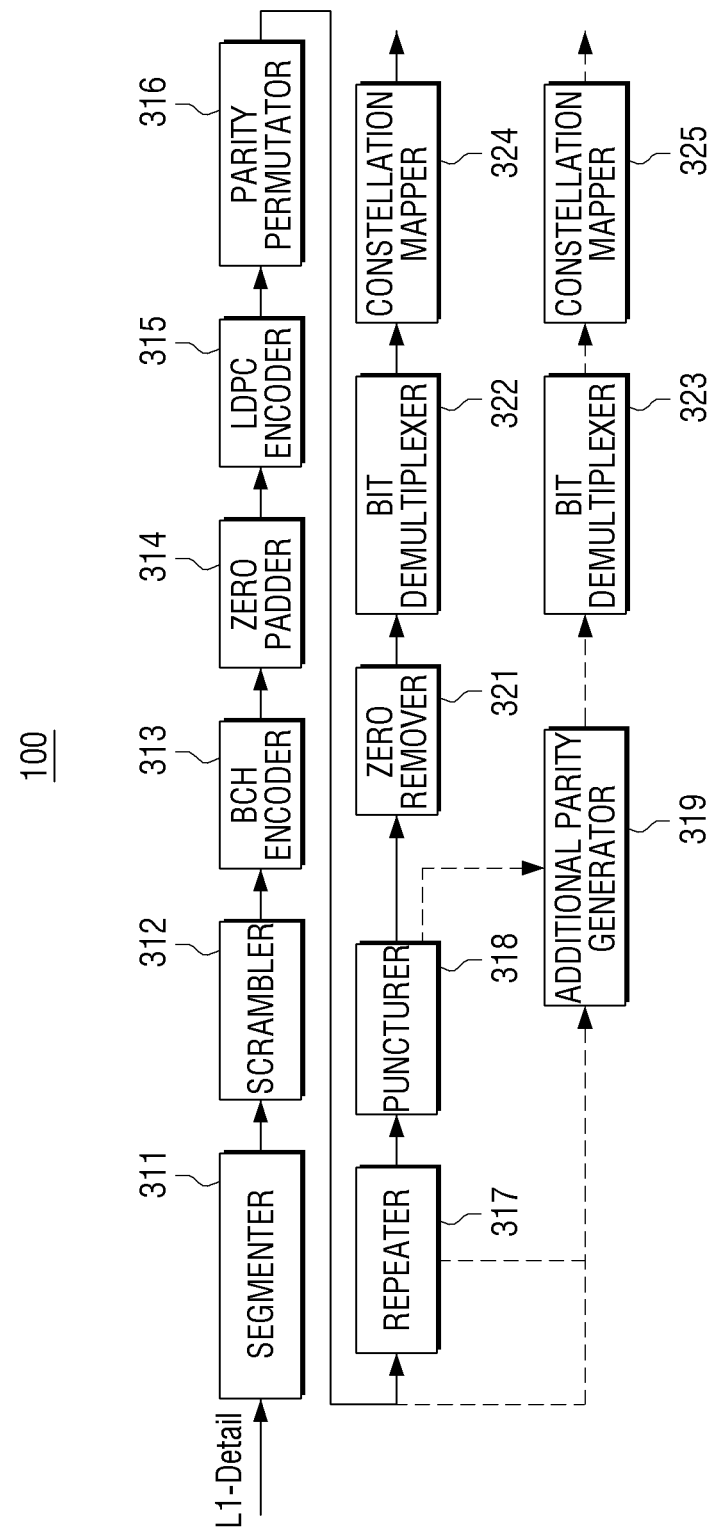

FIGS. 42 and 43 are block diagrams for describing a detailed configuration of the transmitter 100, according to an exemplary embodiment.

In detail, as illustrated in FIG. 42, to process the L1-basic signaling, the transmitter 100 may include a scrambler 211, a BCH encoder 212, a zero padder 213, an LDPC encoder 214, a parity permutator 215, a repeater 216, a puncturer 217, a zero remover 219, a bit demultiplexer 219, and a constellation mapper 221.

Further, as illustrated in FIG. 43, to process the L1-detail signaling, the transmitter 100 may include a segmenter 311, a scrambler 312, a BCH encoder 313, a zero padder 314, an LDPC encoder 315, a parity permutator 316, a repeater 317, a puncturer 318, an additional parity generator 319, a zero remover 321, bit demultiplexers 322 and 323, and constellation mappers 324 and 325.

Here, the components illustrated in FIGS. 42 and 43 are components for performing encoding and modulation on the L1-basic signaling and the L1-detail signaling, which is only one example. According to another exemplary embodiments, some of the components illustrated in FIGS. 42 and 43 may be omitted or changed, and other components may also be added. Further, positions of some of the components may be hanged. For example, the positions of the repeaters 216 and 317 may be disposed after the puncturers 217 and 318, respectively.

The LDPC encoder 315, the repeater 317, the puncturer 318, and the additional parity generator 319 illustrated in FIG. 43 may perform the operations performed by the LDPC encoder 110, the repeater 120, the puncturer 130, and the additional parity generator 140 illustrated in FIG. 1, respectively.

In describing FIGS. 42 and 43, for convenience, components for performing common functions will be described together.

The L1-basic signaling and the L1-detail signaling may be protected by concatenation of a BCH outer code and an LDPC inner code. However, this is only one example. Therefore, as outer encoding performed before inner encoding in the concatenated coding, another encoding such as CRC encoding in addition to the BCH encoding may be used. Further, the L1-basic signaling and the L1-detail signaling may be protected only by the LDPC inner code without the outer code.

First, the L1-basic signaling and the L1-detail signaling may be scrambled. Further, the L1-basic signaling and the L1-detail signaling are BCH encoded, and thus, BCH parity check bits of the L1-basic signaling and the L1-detail signaling generated from the BCH encoding may be added to the L1-basic signaling and the L1-detail signaling, respectively. Further, the concatenated signaling and the BCH parity check bits may be additionally protected by a shortened and punctured 16K LDPC code.

To provide various robustness levels appropriate for a wide signal to noise ratio (SNR) range, a protection level of the L1-basic signaling and the L1-detail signaling may be divided into seven (7) modes. That is, the protection level of the L1-basic signaling and the L1-detail signaling may be divided into the seven modes based on an LDPC code, a modulation order, shortening/puncturing parameters (that is, a ratio of the number of bits to be punctured to the number of bits to be shortened), and the number of bits to be basically punctured (that is, the number of bits to be basically punctured when the number of bits to be shortened is 0). In each mode, at least one different combination of the LDPC code, the modulation order, the constellation, and the shortening/puncturing pattern may be used.

A mode for the transmitter 100 to processes the signaling may be set in advance depending on a system. Therefore, the transmitter 100 may determine parameters (for example, modulation and code rate (ModCod) for each mode, parameter for the BCH encoding, parameter for the zero padding, shortening pattern, code rate/code length of the LDPC code, group-wise interleaving pattern, parameter for repetition, parameter for puncturing, and modulation scheme, etc.) for processing the signaling depending on the set mode, and may process the signaling based on the determined parameters and transmit the processed signaling to the receiver 200. For this purpose, the transmitter 100 may pre-store the parameters for processing the signaling depending on the mode.

Modulation and code rate configurations (ModCod configurations) for the seven modes for processing the L1-basic signaling and the seven modes for processing the L1-detail signaling are shown in following Table 4. The transmitter 100 may encode and modulate the signaling based on the ModCod configurations defined in following Table 4 according to a corresponding mode. That is, the transmitter 100 may determine an encoding and modulation scheme for the signaling in each mode based on following Table 4, and may encode and modulate the signaling according to the determined scheme. In this case, even when modulating the L1 signaling by the same modulation scheme, the transmitter 100 may also use different constellations.

TABLE 4

| Signaling | FEC Type | $K_{sig}$ | Code Length | Code Rate | Constellation |
|---|---|---|---|---|---|
| L1-Basic | Mode 1 | 200 | 16200 | 3/15 (Type A) | QPSK |
| | Mode 2 | | | | QPSK |
| | Mode 3 | | | | QPSK |
| | Mode 4 | | | | NUC_16-QAM |
| | Mode 5 | | | | NUC_64-QAM |
| | Mode 6 | | | | NUC_256-QAM |
| | Mode 7 | | | | NUC_256-QAM |
| L1-Detail | Mode 1 | 400~2352 | | | QPSK |
| | Mode 2 | 400~3072 | | | QPSK |
| | Mode 3 | 400~6312 | | 6/15 (Type B) | QPSK |
| | Mode 4 | | | | NUC_16-QAM |
| | Mode 5 | | | | NUC_64-QAM |
| | Mode 6 | | | | NUC_256-QAM |
| | Mode 7 | | | | NUC_256-QAM |

In above Table 4, $K_{sig}$ represents the number of information bits for a coded block. That is, since the L1 signaling bits having a length of $K_{sig}$ are encoded to generate the coded block, a length of the L1 signaling in one coded block becomes $K_{sig}$. Therefore, the L1 signaling bits having the size of $K_{sig}$ may be considered as corresponding to one LDPC coded block.

Referring to above Table 4, the $K_{sig}$ value for the L1-basic signaling is fixed to 200. However, since the amount of L1-detail signaling bits varies, the $K_{sig}$ value for the L1-detail signaling varies.

In detail, in a case of the L1-detail signaling, the number of L1-detail signaling bits varies, and thus, when the number of L1-detail signaling bits is greater than a preset value, the L1-detail signaling may be segmented to have a length which is equal to or less than the preset value.

In this case, each size of the segmented L1-detail signaling blocks (that is, segment of the L1-detail signaling) may have the $K_{sig}$ value defined in above Table 4. Further, each of the segmented L1-detail signaling blocks having the size of $K_{sig}$ may correspond to one LDPC coded block.

However, when the number of L1-detail signaling bits is equal to or less than the preset value, the L1-detail signaling is not segmented. In this case, the size of the L1-detail signaling may have the $K_{sig}$ value defined in above Table 4. Further, the L1-detail signaling having the size of $K_{sig}$ may correspond to one LDPC coded block.

Hereinafter, a method for segmenting L1-detail signaling will be described in detail.

The segmenter 311 segments the L1-detail signaling. In detail, since the length of the L1-detail signaling varies, when the length of the L1-detail signaling is greater than the preset value, the segmenter 311 may segment the L1-detail signaling to have the number of bits which are equal to or less than the preset value and output each of the segmented L1-detail signalings to the scrambler 312.

However, when the length of the L1-detail signaling is equal to or less than the preset value, the segmenter 311 does not perform a separate segmentation operation.

A method for segmenting, by the segmenter 311, the L1-detail signaling is as follows.

The amount of L1-detail signaling bits varies and mainly depends on the number of PLPs. Therefore, to transmit all bits of the L1-detail signaling, at least one forward error correction (FEC) frame is required. Here, an FEC frame may represent a form in which the L1-detail signaling is encoded, and thus, parity bits according to the encoding are added to the L1-detail signaling.

In detail, when the L1-detail signaling is not segmented, the L1-detail signaling is BCH-encoded and LDPC encoded to generate one FEC frame, and therefore, one FEC frame is required for the L1-detail signaling transmission. On the other hand, when the L1-detail signaling is segmented into at least two, at least two segmented L1-detail signalings each are BCH encoded and LDPC encoded to generate at least two FEC frames, and therefore, at least two FEC frames are required for the L1-detail signaling transmission.

Therefore, the segmenter 311 may calculate the number $N_{L1D\_FECFRAME}$ of FEC frames for the L1-detail signaling based on following Equation 17. That is, the number $N_{L1D\_FECFRAME}$ of FEC frames for the L1-detail signaling may be determined based on following Equation 17.

$$N_{L1D\_FECFRAME} = \left\lceil \frac{K_{L1D\_ex\_pad}}{K_{seg}} \right\rceil \quad (17)$$

In above Equation 17, $\lceil x \rceil$ represents a minimum integer which is equal to or greater than x.

Figure 44:
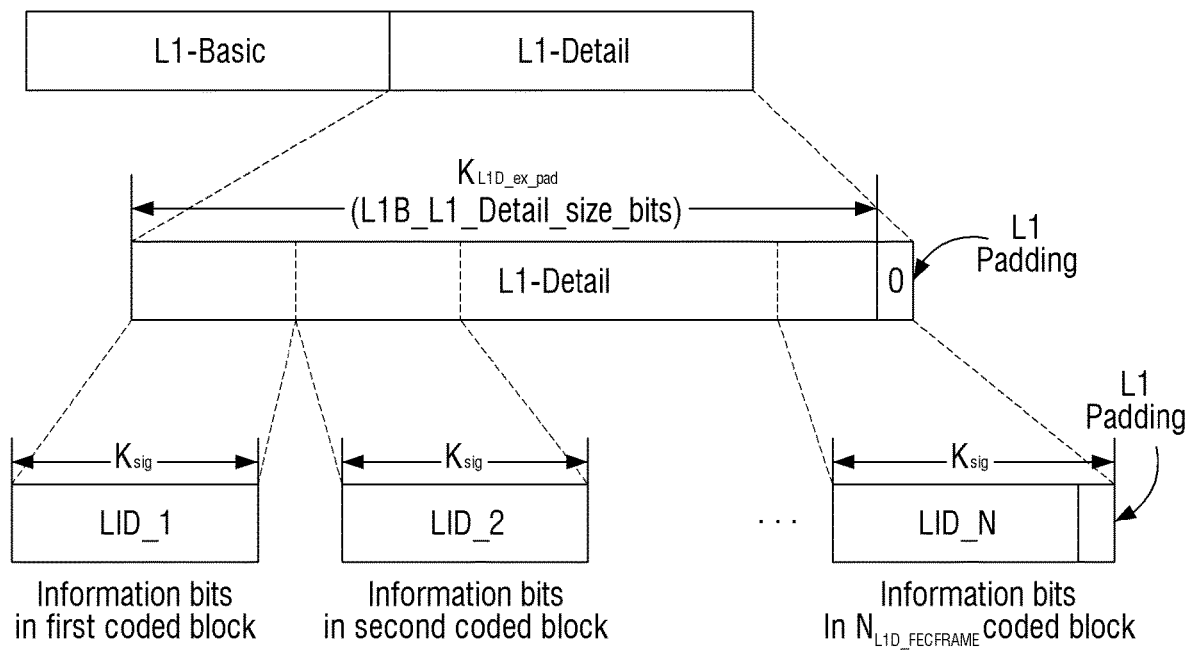
FIGS. 44 to 57 are diagrams for describing methods for processing signaling, according to exemplary embodiments.

Further, in above Equation 17, $K_{L1D\_ex\_pad}$ represents the length of the L1-detail signaling other than L1 padding bits as illustrated in FIG. 44, and may be determined by a value of an L1B_L1_Detail_size_bits field included in the L1-basic signaling.

Further, $K_{seg}$ represents a threshold number for segmentation defined based on the number $K_{ldpc}$ of information bits input to the LDPC encoder 315, that is, the LDPC information bits. Further, $K_{seg}$ may be defined based on the number of BCH parity check bits of a BCH code and a multiple value of 360.

$K_{seg}$ is determined such that, after the L1-detail signaling is segmented, the number $K_{seg}$ of information bits in the coded block is set to be equal to or less than $K_{ldpc} - M_{outer}$. In detail, when the L1-detail signaling is segmented based on $K_{seg}$, since the length of segmented L1-detail signaling does not exceed $K_{seg}$, the length of the segmented L1-detail signaling is set to be equal to or less than $K_{ldpc} - M_{outer}$ when $K_{seg}$ is set like in Table 5 as following.

Here, $M_{outer}$ and $K_{ldpc}$ are as following Tables 6 and 7. For sufficient robustness, outer the $K_{seg}$ value for the L1-detail signaling mode 1 may be set to be $K_{ldpc} - M_{outer} - 720$.

$K_{seg}$ for each mode of the L1-detail signaling may be defined as following Table 5. In this case, the segmenter 311 may determine $K_{seg}$ according to a corresponding mode as shown in following Table 5.

TABLE 5

| L1-Detail | $K_{seg}$ |
| --- | --- |
| Mode 1 | 2352 |
| Mode 2 | 3072 |
| Mode 3 | 6312 |
| Mode 4 | |
| Mode 5 | |
| Mode 6 | |
| Mode 7 | |

As illustrated in FIG. 44, an entire L1-detail signaling may be formed of L1-detail signaling and L1 padding bits.

In this case, the segmenter 311 may calculate a length of an L1_PADDING field for the L1-detail signaling, that is, the number $_{L1D\_PAD}$ of the L1 padding bits based on following Equation 18.

However, calculating $K_{L1D\_PAD}$ based on following Equation 18 is only one example. That is, the segmenter 311 may calculate the length of the L1_PADDING field for the L1-detail signaling, that is, the number $K_{L1D\_PAD}$ of the L1 padding bits based on $K_{L1D\_ex\_pad}$ and $N_{L1D\_FECFRAME}$ values. As one example, the $K_{L1D\_PAD}$ value may be obtained based on following Equation 18. That is, following Equation 18 is only one example of a method for obtaining a $K_{L1D\_PAD}$ value, and thus, another method based on the $K_{L1D\_ex\_pad}$ and $N_{L1D\_FECFRAME}$ values may be applied to obtain an equivalent result.

$$N_{L1D\_PAD} = \left\lceil \frac{K_{L1D\_ex\_pad}}{K_{L1D\_FECFRAME}} \right\rceil \times N_{L1D\_FECFRAME} - K_{L1D\_ex\_pad} \quad (18)$$

Further, the segmenter 311 may fill the L1_PADDING field with $K_{L1D\_PAD}$ zero bits (that is, bits having a 0 value). Therefore, as illustrated in FIG. 44, the $K_{L1D\_PAD}$ zero bits may be filled in the L1_PADDING field.

As such, by calculating the length of the L1_PADDING field and padding zero bits of the calculated length to the L1_PADDING field, the L1-detail signaling may be segmented into the plurality of blocks formed of the same number of bits when the L1-detail signaling is segmented.

Next, the segmenter 311 may calculate a final length $K_{L1D}$ of the entire L1-detail signaling including the zero padding bits based on following Equation 19.

$$K_{L1D} = K_{L1D\_ex\_pad} + K_{L1D\_PAD} \quad (19)$$

Further, the segmenter 311 may calculate the number $K_{sig}$ of information bits in each of the $N_{L1D\_FECFRAME}$ blocks based on following Equation 20.

$$K_{sig} = \frac{K_{L1D}}{N_{L1D\_FECFRAME}} \quad (20)$$

Next, the segmenter 311 may segment the L1-detail signaling by $K_{sig}$ number of bits.

In detail, as illustrated in FIG. 44, when the $N_{L1D\_FECFRAME}$ is greater than 1, the segmenter 311 may segment the L1-detail signaling by the number of $K_{sig}$ bits to segment the L1-detail signaling into the $N_{L1D\_FECFRAME}$ blocks.

Therefore, the L1-detail signaling may be segmented into $N_{L1D\_FECFRAME}$ blocks, and the number of L1-detail signaling bits in each of the $N_{L1D\_FECFRAME}$ blocks may be $K_{sig}$. Further, each segmented L1-detail signaling is encoded. As an encoded result, a coded block, that is, an FEC frame is formed, such that the number of L1-detail signaling bits in each of the $N_{L1D\_FECFRAME}$ coded blocks may be $K_{sig}$.

However, when the L1-detail signaling is not segmented, $K_{sig} = K_{L1D\_ex\_pad}$.

The segmented L1-detail signaling blocks may be encoded by a following procedure.

In detail, all bits of each of the L1-detail signaling blocks having the size $K_{sig}$ may be scrambled. Next, each of the scrambled L1-detail signaling blocks may be encoded by concatenation of the BCH outer code and the LDPC inner code.

In detail, each of the L1-detail signaling blocks is BCH-encoded, and thus $M_{outer}$ (=168) BCH parity check bits may be added to the $K_{sig}$ L1-detail signaling bits of each block, and then, the concatenation of the L1-detail signaling bits and the BCH parity check bits of each block may be encoded by a shortened and punctured 16K LDPC code. The details of the BCH code and the LDPC code will be described below. However, the exemplary embodiments describe only a case in which $M_{outer}$=168, but it is apparent that $M_{outer}$ may be changed into an appropriate value depending on the requirements of a system.

The scramblers 211 and 312 scramble the L1-basic signaling and the L1-detail signaling, respectively. In detail, the scramblers 211 and 312 may randomize the L1-basic signaling and the L1-detail signaling, and output the randomized L1-basic signaling and L1-detail signaling to the BCH encoders 212 and 313, respectively.

In this case, the scramblers 211 and 312 may scramble the information bits by a unit of $K_{sig}$.

That is, since the number of L1-basic signaling bits transmitted to the receiver 200 through each frame is 200, the scrambler 211 may scramble the L1-basic signaling bits by $K_{sig}$ (=200).

Since the number of L1-basic signaling bits transmitted to the receiver 200 through each frame varies, in some cases, the L1-detail signaling may be segmented by the segmenter 311. Further, the segmenter 311 may output the L1-detail signaling formed of $K_{sig}$ bits or the segmented L1-detail signaling blocks to the scrambler 312. As a result, the scrambler 312 may scramble the L1-detail signaling bits by every $K_{sig}$ which are output from the segmenter 311.

The BCH encoders 212 and 313 perform the BCH encoding on the L1-basic signaling and the L1-detail signaling to generate the BCH parity check bits.

In detail, the BCH encoders 212 and 313 may perform the BCH encoding on the L1-basic signaling and the L1-detail signaling output from the scramblers 211 and 313, respectively, to generate the BCH parity check bits, and output the BCH-encoded bits in which the BCH parity check bits are added to each of the L1-basic signaling and the L1-detail signaling to the zero padders 213 and 314, respectively.

For example, the BCH encoders 212 and 313 may perform the BCH encoding on the input $K_{sig}$ bits to generate the $M_{outer}$ (that is, $K_{sig}=K_{payload}$) BCH parity check bits and output the BCH-encoded bits formed of $N_{outer}$ $K_{sig}+M_{outer}$) bits to the zero padders 213 and 314, respectively.

The parameters for the BCH encoding may be defined as following Table 6.

TABLE 6

| Signaling FEC Type | | $K_{sig} = K_{payload}$ | $M_{outer}$ | $N_{outer} = K_{sig} + M_{outer}$ |
|---|---|---|---|---|
| L1-Basic | Mode 1 | 200 | 168 | 368 |
| | Mode 2 | | | |
| | Mode 3 | | | |
| | Mode 4 | | | |
| | Mode 5 | | | |
| | Mode 6 | | | |
| | Mode 7 | | | |
| L1-Detail | Mode 1 | 400~2352 | | 568~2520 |
| | Mode 2 | 400~3072 | | 568~3240 |
| | Mode 3 | 400~6312 | | 568~6480 |
| | Mode 4 | | | |
| | Mode 5 | | | |
| | Mode 6 | | | |
| | Mode 7 | | | |

Referring to FIGS. 42 and 43, it may be appreciated that the LDPC encoders 214 and 315 may be disposed after the BCH encoders 212 and 313, respectively.

Therefore, the L1-basic signaling and the L1-detail signaling may be protected by the concatenation of the BCH outer code and the LDPC inner code.

In detail, the L1-basic signaling and the L1-detail signaling are BCH-encoded, and thus, the BCH parity check bits for the L1-basic signaling are added to the L1-basic signaling and the BCH parity check bits for the L1-detail signaling are added to the L1-detail signaling. Further, the concatenated L1-basic signaling and BCH parity check bits are additionally protected by an LDPC code, and the concatenated L1-detail signaling and BCH parity check bits may be additionally protected by an LDPC code.

Here, it is assumed that an LDPC code for LDPC encoding is a 16K LDPC code, and thus, in the BCH encoders 212 and 213, a systematic BCH code for $N_{inner}=16200$ (that is, the code length of the 16K LDPC is 16200 and an LDPC codeword generated by the LDPC encoding may be formed of 16200 bits) may be used to perform outer encoding of the L1-basic signaling and the L1-detail signaling.

The zero padders 213 and 314 pad zero bits. In detail, for the LDPC code, a predetermined number of LDPC information bits defined according to a code rate and a code length is required, and thus, the zero padders 213 and 314 may pad zero bits for the LDPC encoding to generate the predetermined number of LDPC information bits formed of the BCH-encoded bits and zero bits, and output the generated bits to the LDPC encoders 214 and 315, respectively, when the number of BCH-encoded bits is less than the number of LDPC information bits. When the number of BCH-encoded bits is equal to the number of LDPC information bits, zero bits are not padded.

Here, zero bits padded by the zero padders 213 and 314 are padded for the LDPC encoding, and therefore, the padded zero bits padded are not transmitted to the receiver 200 by a shortening operation.

For example, when the number of LDPC information bits of the 16K LDPC code is $K_{ldpc}$, in order to form $K_{ldpc}$ LDPC information bits, zero bits are padded.

In detail, when the number of BCH-encoded bits is $N_{outer}$, the number of LDPC information bits of the 16K LDPC code is $K_{ldpc}$, and $N_{outer}<K_{ldpc}$, the zero padders 213 and 314 may pad the $K_{ldpc}-N_{outer}$ zero bits and use the $N_{outer}$ BCH-encoded bits as the remaining portion of the LDPC information bits to generate the LDPC information bits formed of $K_{ldpc}$ bits. However, when $N_{outer}=K_{ldpc}$, zero bits are not padded.

For this purpose, the zero padders 213 and 314 may divide the LDPC information bits into a plurality of bit groups.

For example, the zero padders 213 and 314 may divide the $K_{ldpc}$ LDPC information bits ($i_0, i_{K_{ldpc}-1}$) into $N_{info\_group}$ ($=K_{ldpc}/360$) bit groups based on following Equation 21 or 22. That is, the zero padders 213 and 314 may divide the LDPC information bits into the plurality of bit groups so that the number of bits included in each bit group is 360.

$$Z_j = \left\{ i_k \mid j = \left\lfloor \frac{k}{360} \right\rfloor, 0 \leq k \leq K_{ldpc} \right\} \text{ for } 0 \leq j < N_{info\_group} \quad (21)$$

$$Z_j = \{i_k \mid 360 \times j \leq k < 360 \times (j+1)\} \text{ for } 0 \leq j < N_{info\_group} \quad (22)$$

In above Equations 21 and 22, $Z_j$ represents a j-th bit group.

The parameters $N_{outer}$, $K_{ldpc}$, and $N_{info\_group}$ for the zero padding for the L1-basic signaling and the L1-detail signaling may be defined as shown in following Table 7. In this case, the zero padders 213 and 314 may determine parameters for the zero padding according to a corresponding mode as shown in following Table 7.

TABLE 7

| Signaling FEC Type | $N_{outer}$ | $K_{ldpc}$ | $N_{info\_group}$ |
|---|---|---|---|
| L1-Basic (all modes) | 368 | 3240 | 9 |
| L1-Detail Mode 1 | 568~2620 | | |
| L1-Datail Mode 2 | 568~3240 | | |
| L1-Detail Mode 3 | 568~6480 | 6480 | 18 |
| L1-Detail Mode 4 | | | |
| L1-Detail Mode 5 | | | |
| L1-Detail Mode 6 | | | |
| L1-Detail Mode 7 | | | |

Figure 45:
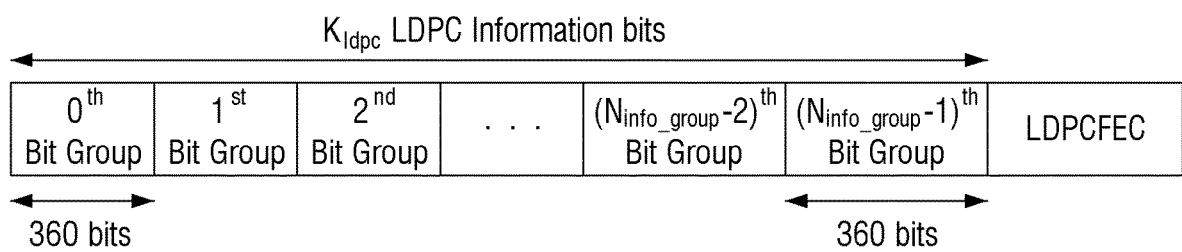

Further, for $0 \leq j < N_{info\_group}$, each bit group 4 as shown in FIG. 45 may be formed of 360 bits.

In detail, FIG. 45 illustrates a data format after the L1-basic signaling and the L1-detail signaling each are LDPC-encoded. In FIG. 45, an LDPC FEC added to the $K_{ldpc}$ LDPC information bits represents the LDPC parity bits generated by the LDPC encoding.

Referring to FIG. 45, the $K_{ldpc}$ LDPC information bits are divided into the $N_{info\_group}$ bits groups and each bit group may be formed of 360 bits.

When the number $N_{outer}(=K_{sig}+M_{outer})$ of BCH-encoded bits for the L1-basic signaling and the L1-detail signaling is less than the $K_{ldpc}$, that is, $N_{outer}(=K_{sig}+M_{outer})<K_{ldpc}$, for the LDPC encoding, the $K_{ldpc}$ LDPC information bits may be filled with the $N_{outer}$ BCH-encoded bits and the $K_{ldpc}-N_{outer}$ zero-padded bits. In this case, the padded zero bits are not transmitted to the receiver 200.

Hereinafter, a shortening procedure performed by the zero padders 213 and 314 will be described in more detail.

The zero padders 213 and 314 may calculate the number of padded zero bits. That is, to fit the number of bits required for the LDPC encoding, the zero padders 213 and 314 may calculate the number of zero bits to be padded.

In detail, the zero padders 213 and 314 may calculate a difference between the number of LDPC information bits and the number of BCH-encoded bits as the number of padded zero bits. That is, for a given $N_{outer}$, the zero padders 213 and 314 may calculate the number of padded zero bits as $K_{ldpc}-N_{outer}$.

Further, the zero padders 213 and 314 may calculate the number of bit groups in which all the bits are padded. That is, the zero padders 213 and 314 may calculate the number of bit groups in which all bits within the bit group are padded by zero bits.

In detail, the zero padders 213 and 314 may calculate the number $N_{pad}$ of groups to which all bits are padded based on following Equation 23 or 24.

$$N_{pad} = \left\lfloor \frac{K_{ldpc} - N_{outer}}{360} \right\rfloor \quad (23)$$

$$N_{pad} = \left\lfloor \frac{(K_{ldpc} - M_{outer}) - K_{sig}}{360} \right\rfloor \quad (24)$$

Next, the zero padders 213 and 314 may determine bit groups in which zero bits are padded among a plurality of bit groups based on a shortening pattern, and may pad zero bits to all bits within some of the determined bit groups and some bits within the remaining bit groups.

In this case, the shortening pattern of the padded bit group may be defined as shown in following Table 8. In this case, the zero padders 213 and 314 may determine the shortening pattern according to a corresponding mode as shown in following Table 8.

Here, $\pi_s(j)$ is an index of a j-th padded bit group. That is, the $\pi_s(j)$ represents a shortening pattern order of the j-th bit group. Further, $N_{info\_group}$ is the number of bit groups configuring the LDPC information bits.

In detail, the zero padders 213 and 314 may determine $Z_{\pi_s(0)}, Z_{\pi_s(1)}, \ldots, Z_{\pi_s(N_{pad}-1)}$ as bit groups in which all bits within the bit group are padded by zero bits based on the shortening pattern, and pad zero bits to all bits of the bit groups. That is, the zero padders 213 and 314 may pad zero bits to all bits of a $\pi_s(0)$-th bit group, a $n_s(1)$-th bit group, ... a $n_s(N_{pad}-1)$-th bit group among the plurality of bit groups based on the shortening pattern.

As such, when $N_{pad}$ is not 0, the zero padders 213 and 314 may determine a list of the $N_{pad}$ bit groups, that is, $Z_{\pi_s(0)}, Z_{\pi_s(N_{pad}-1)}$ based on above Table 8, and pad zero bits to all bits within the determined bit group.

However, when the $N_{pad}$ is 0, the foregoing procedure may be omitted.

Since the number of all the padded zero bits is $K_{ldpc}-N_{outer}$ and the number of zero bits padded to the $N_{pad}$ bit groups is $360 \times N_{pad}$, the zero padders 213 and 314 may additionally pad zero bits to $K_{ldpc}-N_{outer}-360 \times N_{pad}$ LDPC information bits.

In this case, the zero padders 213 and 314 may determine a bit group to which zero bits are additionally padded based on the shortening pattern, and may additionally pad zero bits from a head portion of the determined bit group.

In detail, the zero padders 213 and 314 may determine $Z_{\pi_s(N_{pad})}$ as a bit group to which zero bits are additionally padded based on the shortening pattern, and may additionally pad zero bits to the $K_{ldpc}-N_{outer}-360 \times N_{pad}$ bits positioned at the head portion of $Z_{\pi_s(N_{pad})}$. Therefore, the $K_{ldpc}-N_{outer}-360 \times N_{pad}$ zero bits may be padded from a first bit of the $\pi_s(N_{pad})$-th bit group.

As a result, for $Z_{\pi_s(N_{pad})}$, zero bits may be additionally padded to the $K_{ldpc}-N_{bch}-360 \times N_{pad}$ bits positioned at the head portion of the $Z_{\pi_s(N_{pad})}$.

The foregoing example describes that $K_{ldpc}-N_{outer}-360 \times N_{pad}$ zero bits are padded from a first bit of the $Z_{\pi_s(N_{pad})}$, which is only one example. Therefore, the position at which zero bits are padded in the $Z_{\pi_s(N_{pad})}$ may be changed. For example, $K_{ldpc}-N_{outer}-360 \times N_{pad}$ zero bits may be padded to a middle portion or a last portion of the $Z_{\pi_s(N_{pad})}$ or may also be padded at any position of the $Z\pi_s(N_{pad})$.

TABLE 8

| Signaling | | $\pi_s(j)(0 \le j < N_{info\_group})$ | | | | | | | | |
|---|---|---|---|---|---|---|---|---|---|---|
| FEC Type | $N_{info\_group}$ | $\pi_s(0)$ $\pi_s(9)$ | $\pi_s(1)$ $\pi_s(10)$ | $\pi_s(2)$ $\pi_s(11)$ | $\pi_s(3)$ $\pi_s(12)$ | $\pi_s(4)$ $\pi_s(13)$ | $\pi_s(5)$ $\pi_s(14)$ | $\pi_s(6)$ $\pi_s(15)$ | $\pi_s(7)$ $\pi_s(16)$ | $\pi_s(8)$ $\pi_s(17)$ |
| L1-Basic (for all modes) | 9 | 4 — | 1 — | 5 — | 2 — | 8 — | 6 — | 0 — | 7 — | 3 — |
| L1-Detail Mode 1 | | 7 | 8 | 5 | 4 | 1 | 2 | 6 | 3 | 0 |
| L1-Detail Mode 2 | | 6 | 1 | 7 | 8 | 0 | 2 | 4 | 3 | 5 |
| L1-Detail Mode 3 | 18 | 0 6 | 12 16 | 15 10 | 13 14 | 2 1 | 5 17 | 7 11 | 9 4 | 8 3 |
| L1-Detail Mode 4 | | 0 4 | 15 7 | 5 12 | 16 8 | 17 14 | 1 2 | 6 3 | 13 9 | 11 10 |
| L1-Detail Mode 5 | | 2 8 | 4 10 | 5 14 | 17 16 | 9 0 | 7 11 | 1 13 | 6 12 | 15 3 |
| L1-Detail Mode 6 | | 0 4 | 15 7 | 5 12 | 16 6 | 17 14 | 1 2 | 6 3 | 13 9 | 11 10 |
| L1-Detail Mode 7 | | 15 3 | 7 0 | 8 6 | 11 9 | 5 1 | 10 14 | 16 17 | 4 2 | 12 13 |

Next, the zero padders 213 and 314 may map the BCH-encoded bits to the positions at which zero bits are not padded to configure the LDPC information bits.

Therefore, $N_{outer}$ BCH-encoded bits are sequentially mapped to the bit positions at which zero bits are not padded in the $K_{ldpc}$ LDPC information bits ($i_0, i_1, \ldots, i_{K_{ldpc}-1}$), and thus, $K_{ldpc}$ LDPC information bits may be formed of $N_{outer}$ BCH-encoded bits and $K_{ldpc}-N_{outer}$ bits.

The padded zero bits are not transmitted to the receiver 200. As such, a procedure of padding the zero bits or a procedure of padding the zero bits and then not transmitting the padded zero bits to the receiver 200 may be called shortening.

The LDPC encoders 214 and 315 perform LDPC encoding on the L1-basic signaling and the L1-detail signaling, respectively.

In detail, the LDPC encoders 214 and 315 may perform LDPC encoding on the LDPC information bits output from the zero padders 213 and 31 to generate LDPC parity bits, and output an LDPC codeword including the LDPC information bits and the LDPC parity bits to the parity permutators 215 and 316, respectively.

That is, $K_{ldpc}$ bits output from the zero padder 213 may include $K_{sig}$ L1-basic signaling bits, $M_{outer}$ (=$N_{outer}-K_{sig}$) BCH parity check bits, and $K_{ldpc}-N_{outer}$ padded zero bits, which may configure $K_{ldpc}$ LDPC information bits i=($i_0, i_1, \ldots, i_{K_{ldpc}-1}$) for the LDPC encoder 214.

Further, the $K_{ldpc}$ bits output from the zero padder 314 may include the $K_{sig}$ L1-detail signaling bits, the $M_{outer}$ ($N_{outer}-K_{sig}$) BCH parity check bits, and the ($K_{ldpc}-N_{outer}$) padded zero bits, which may configure the $K_{ldpc}$ LDPC information bits i=($i_0, i_1, i_{K_{ldpc}-1}$) for the LDPC encoder 315.

In this case, the LDPC encoders 214 and 315 may systematically perform the LDPC encoding on the $K_{ldpc}$ LDPC information bits to generate an LDPC codeword $\Lambda$=($c_0, c_1, \ldots, c_{N_{inner}-1}$)=($i_0, i_1, \ldots, i_{K_{ldpc}-1}, p_0, p_1, \ldots, p_{N_{inner}-K_{ldpc}-1}$) formed $N_{inner}$ bits.

In the L1-basic modes and the L1-detail modes 1 and 2, the LDPC encoders 214 and 315 may encode the L1-basic signaling and the L1-detail signaling at a code rate of 3/15 to generate 16200 LDPC codeword bits. In this case, the LDPC encoders 214 and 315 may perform the LDPC encoding based on above Table 1.

Further, in the L1-detail modes 3, 4, 5 6, and 7, the LDPC encoder 315 may encode the L1-detail signaling at a code rate of 6/15 to generate the 16200 LDPC codeword bits. In this case, the LDPC encoder 315 may perform the LDPC encoding based on above Table 3.

The code rate and the code length for the L1-basic signaling and the L1-detail signaling are as shown in above Table 4, and the number of LDPC information bits are as shown in above Table 7.

The parity permutators 215 and 316 perform parity permutation. That is, the parity permutators 215 and 316 may perform permutation only on the LDPC parity bits among the LDPC information bits and the LDPC parity bits.

In detail, the parity permutators 215 and 316 may perform the permutation only on the LDPC parity bits in the LDPC codewords output from the LDPC encoders 214 and 315, and output the parity permutated LDPC codewords to the repeaters 216 and 317, respectively. The parity permutator 316 may output the parity permutated LDPC codeword to an additional parity generator 319. In this case, the additional parity generator 319 may use the parity permutated LDPC codeword output from the parity permutator 316 to generate additional parity bits.

For this purpose, the parity permutators 215 and 316 may include a parity interleaver (not illustrated) and a group-wise interleaver (not illustrated).

First, the parity interleaver may interleave only the LDPC parity bits among the LDPC information bits and the LDPC parity bits configuring the LDPC codeword. However, the parity interleaver may perform the parity interleaving only in the cases of the L1-detail modes 3, 4, 5, 6, and 7. That is, since the L1-basic modes and the L1-detail modes 1 and 2 include the parity interleaving as a portion of the LDPC encoding process, in the L1-basic modes and the L1-detail modes 1 and 2, the parity interleaver may not perform the parity interleaving.

In the mode of performing the parity interleaving, the parity interleaver may interleave the LDPC parity bits based on following Equation 25.

$u_i = c_i$ for $0 \leq i < K_{ldpc}$ (information bits are not interleaved)

$u_{K_{ldpc}+360t+s} = c_{K_{ldpc}+27s+t}$ for $0 \leq s < 360, 0 \leq t < 27$ \hfill (25)

In detail, based on above Equation 25, the LDPC codeword ($c_0, c_1, \ldots, c_{N_{inner}-1}$) is parity-interleaved by the parity interleaver and an output of the parity interleaver may be represented by U=($u_0, u_1, \ldots, u_{N_{inner}+1}$).

Since the L1-basic modes and the L1-detail modes 1 and 2 do not use the parity interleaver, an output U=($u_0, u_1, \ldots, u_{N_{inner}-1}$) of the parity interleaver may be represented as following Equation 26.

$u_i = c_i$ for $0 \leq s < N_{inner}$ \hfill (26)

The group-wise interleaver may perform group-wise interleaving on the output of the parity interleaver.

Here, as described above, the output of the parity interleaver may be an LDPC codeword parity-interleaved by the parity interleaver or may be an LDPC codeword which is not parity-interleaved by the parity interleaver.

Therefore, when the parity interleaving is performed, the group-wise interleaver may perform the group-wise interleaving on the parity interleaved LDPC codeword, and when the parity interleaving is not performed, the group-wise interleaver may perform the group-wise interleaving on the LDPC codeword which is not parity-interleaved.

In detail, the group-wise interleaver may interleave the output of the parity interleaver in a bit group unit.

For this purpose, the group-wise interleaver may divide an LDPC codeword output from the parity interleaver into a plurality of bit groups. As a result, the LDPC parity bits output from the parity interleaver may be divided into a plurality of bit groups.

In detail, the group-wise interleaver may divide the LDPC-encoded bits ($u_0, u_1, \ldots, u_{N_{inner}-1}$) output from the parity interleaver into $N_{group}(=N_{inner}/360)$ bit groups based on following Equation 27.

$$X_j=\{u_k | 360 \times j \leq k < 360 \times (j+1), 0 \leq k < N_{inner}\} \text{ for } 0 \leq j < N_{group} \quad (27)$$

In above Equation 27, $X_j$ represents a j-th bit group.

Figure 46:
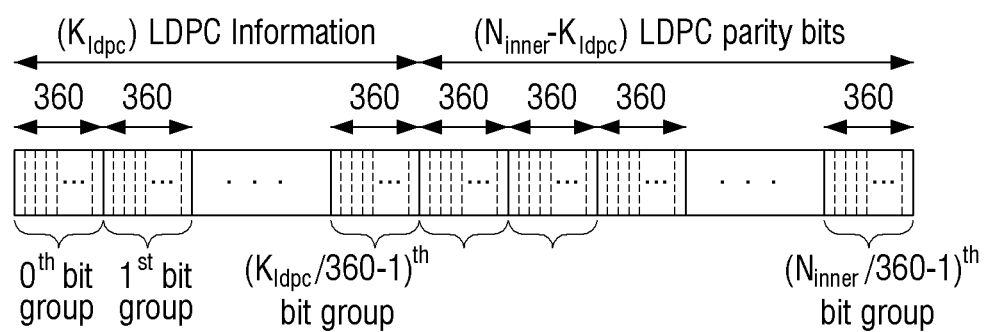

FIG. 46 illustrates an example of dividing the LDPC codeword output from the parity interleaver into a plurality of bit groups.

Referring to FIG. 46, the LDPC codeword is divided into $N_{group}(=N_{inner}/360)$ bit groups, and each bit group $X_j$ for $0 \leq j < N_{group}$ is formed of 360 bits.

As a result, the LDPC information bits formed of $K_{ldpc}$ bits may be divided into $K_{ldpc}/360$ bit groups and the LDPC parity bits formed of $N_{inner}-K_{ldpc}$ bits may be divided into $N_{inner}-K_{ldpc}/360$ bit groups.

Further, the group-wise interleaver performs the group-wise interleaving on the LDPC codeword output from the parity interleaver.

In this case, the group-wise interleaver does not perform interleaving on the LDPC information bits, and may perform the interleaving only on the LDPC parity bits among the LDPC parity bits among the LDPC bits may be interleaved by the group-wise interleaver. In this case, the LDPC parity bits may be interleaved in a group unit.

In detail, the group-wise interleaver may perform the group-wise interleaving on the LDPC codeword output from the parity interleaver based on following Equation 28.

$$X_j=X_j,\ 0 \leq j < K_{ldpc}/360$$

$$Y_j=X_{\pi_p(j)},\ K_{ldpc}/360 \leq j < N_{group} \quad (28)$$

Here, $X_j$ represents a j-th bit group among the plurality of bit groups configuring the LDPC codeword, that is, the j-th bit group prior to the group-wise interleaving and $Y_j$ represents the group-wise interleaved j-th bit group. Further, $\pi_p(j)$ represents a permutation order for the group-wise interleaving.

The permutation order may be defined based on following Table 9 and Table 10. Here, Table 9 shows a group-wise interleaving pattern of a parity portion in the L1-basic modes and the L1-detail modes 1 and 2, and Table 10 shows a group-wise interleaving pattern of a parity portion for the L1-detail modes 3, 4, 5, 6, and 7.

In this case, the group-wise interleaver may determine the group-wise interleaving pattern according to a corresponding mode shown in following Tables 9 and 10.

TABLE 9

| Signaling FEC Type | $N_{group}$ | Order of Group-Wise Interleaving $\pi_p(j)$ (9 ≤ j < 45) $\pi_p(9)\ \pi_p(10)\ \pi_p(11)\ \pi_p(12)\ \pi_p(13)\ \pi_p(14)\ \pi_p(15)\ \pi_p(16)\ \pi_p(17)\ \pi_p(18)\ \pi_p(19)\ \pi_p(20)$ $\pi_p(21)\ \pi_p(22)\ \pi_p(23)\ \pi_p(24)\ \pi_p(25)\ \pi_p(26)\ \pi_p(27)\ \pi_p(28)\ \pi_p(29)\ \pi_p(30)\ \pi_p(31)\ \pi_p(32)$ $\pi_p(33)\ \pi_p(34)\ \pi_p(35)\ \pi_p(36)\ \pi_p(37)\ \pi_p(38)\ \pi_p(39)\ \pi_p(40)\ \pi_p(41)\ \pi_p(42)\ \pi_p(43)\ \pi_p(44)$ | | | | | | | | | | | |
|---|---|---|---|---|---|---|---|---|---|---|---|---|
| L1-Basic (all modes) | 45 | 20 | 23 | 25 | 32 | 38 | 41 | 18 | 9 | 10 | 11 | 31 | 24 |
| | | 14 | 15 | 26 | 40 | 33 | 19 | 28 | 34 | 16 | 39 | 27 | 30 |
| | | 21 | 44 | 43 | 35 | 42 | 36 | 12 | 13 | 29 | 22 | 37 | 17 |
| L1-Detail Mode 1 | | 16 | 22 | 27 | 30 | 37 | 44 | 20 | 23 | 25 | 32 | 38 | 41 |
| | | 9 | 10 | 17 | 18 | 21 | 33 | 35 | 14 | 28 | 12 | 15 | 19 |
| | | 11 | 24 | 29 | 34 | 36 | 13 | 40 | 43 | 31 | 26 | 39 | 42 |
| L1-Detail Mode 2 | | 9 | 31 | 23 | 10 | 11 | 25 | 43 | 29 | 36 | 16 | 27 | 34 |
| | | 25 | 16 | 37 | 15 | 13 | 17 | 35 | 21 | 20 | 24 | 44 | 12 |
| | | 22 | 40 | 19 | 32 | 38 | 41 | 30 | 33 | 14 | 28 | 39 | 42 |

TABLE 10

| Signaling FEC Type | $N_{group}$ | Order of Group-Wise Interleaving $\pi_p(j)$ (18 ≤ j < 45) $\pi_p(18)\ \pi_p(19)\ \pi_p(20)\ \pi_p(21)\ \pi_p(22)\ \pi_p(23)\ \pi_p(24)\ \pi_p(25)\ \pi_p(26)\ \pi_p(27)\ \pi_p(28)\ \pi_p(29)\ \pi_p(30)\ \pi_p(31)$ $\pi_p(32)\ \pi_p(33)\ \pi_p(34)\ \pi_p(35)\ \pi_p(36)\ \pi_p(37)\ \pi_p(38)\ \pi_p(39)\ \pi_p(40)\ \pi_p(41)\ \pi_p(42)\ \pi_p(43)\ \pi_p(44)$ | | | | | | | | | | | | |
|---|---|---|---|---|---|---|---|---|---|---|---|---|---|---|
| L1-Detail Mode 3 | 45 | 19 | 37 | 30 | 42 | 23 | 44 | 27 | 40 | 21 | 34 | 25 | 32 | 29 | 24 |
| | | 26 | 35 | 39 | 20 | 18 | 43 | 31 | 36 | 38 | 22 | 33 | 26 | 41 | |
| L1-Detail Mode 4 | | 20 | 35 | 42 | 39 | 26 | 23 | 30 | 18 | 26 | 37 | 32 | 27 | 44 | 43 |
| | | 41 | 40 | 38 | 36 | 34 | 33 | 31 | 29 | 25 | 24 | 22 | 21 | 19 | |
| L1-Detail Mode 5 | | 19 | 37 | 33 | 26 | 40 | 43 | 22 | 29 | 24 | 35 | 44 | 31 | 27 | 20 |
| | | 21 | 39 | 25 | 42 | 34 | 18 | 32 | 38 | 23 | 30 | 28 | 36 | 41 | |
| L1-Detail Mode 6 | | 20 | 35 | 42 | 39 | 26 | 23 | 30 | 16 | 28 | 37 | 32 | 27 | 44 | 43 |
| | | 41 | 40 | 38 | 36 | 34 | 33 | 31 | 29 | 25 | 24 | 22 | 21 | 19 | |
| L1-Detail Mode 7 | | 44 | 23 | 29 | 33 | 24 | 26 | 21 | 27 | 42 | 18 | 22 | 31 | 32 | 37 |
| | | 43 | 30 | 25 | 35 | 20 | 34 | 39 | 36 | 19 | 41 | 40 | 26 | 38 | |

LDPC information bits and the LDPC parity bits to change the order of the plurality of bit groups configuring the LDPC parity bits.

As a result, the LDPC information bits among the LDPC bits may not be interleaved by the group-wise interleaver but Hereinafter, for the group-wise interleaving pattern in the L1-detail mode 2 as an example, an operation of the group-wise interleaver will be described.

In the L1-detail mode 2, the LDPC encoder 315 performs LDPC encoding on 3240 LDPC information bits at a code rate of 3/15 to generate 12960 LDPC parity bits. In this case, an LDPC codeword may be formed of 16200 bits.

Each bit group is formed of 360 bits, and as a result the LDPC codeword formed of 16200 bits is divided into 45 bit groups.

Here, since the number of the LDPC information bits is 3240 and the number of the LDPC parity bits is 12960, a 0-th bit group to an 8-th bit group correspond to the LDPC information bits and a 9-th bit group to a 44-th bit group correspond to the LDPC parity bits.

In this case, the group-wise interleaver does not perform interleaving on the bit groups configuring the LDPC information bits, that is, a 0-th bit group to a 8-th bit group based on above Equation 28 and Table 9, but may interleave the bit groups configuring the LDPC parity bits, that is, a 9-th bit group to a 44-th bit group in a group unit to change an order of the 9-th bit group to the 44-th bit group.

In detail, in the L1-detail mode 2 in above Table 9, above Equation 28 may be represented like $Y_0=X_0$, $Y_0=X_1$, ..., $Y_7=X_7$, $Y_8=X_8$, $Y_9=X_{\pi p(9)}=X_9$, $Y_{10}=X_{\pi p(10)}=X_{31}$, $Y_{11}=X_{\pi p(11)}=X_{23}$, ..., $Y_{42}=X_{\pi p(42)}=X_{28}$, $Y_{43}=X_{\pi p(43)}=X_{39}$, $Y_{44}=X_{\pi p(44)}=X_{42}$.

Therefore, the group-wise interleaver does not change an order of the 0-th bit group to the 8-th bit group including the LDPC information bits but may change an order of the 9-th bit group to the 44-th bit group including the LDPC parity bits.

In detail, the group-wise interleaver may change the order of the bit groups from the 9-th bit group to the 44-th bit group so that the 9-th bit group is positioned at the 9-th position, the 31-th bit group is positioned at the 10-th position, the 23-th bit group is positioned at the 11-th position, . . . , the 28-th bit group is positioned at the 42-th position, the 39-th bit group is positioned at the 43-th position, the 42-th bit group is positioned at the 44-th position.

As described below, since the puncturers 217 and 318 perform puncturing from the last parity bit, the parity bit groups may be arranged in an inverse order of the puncturing pattern by the parity permutation. That is, the first bit group to be punctured is positioned at the last bit group.

The foregoing example describes that only the parity bits are interleaved, which is only one example. That is, the parity permutators 215 and 316 may also interleave the LDPC information bits. In this case, the parity permutators 215 and 316 may interleave the LDPC information bits with identity and output the LDPC information bits having the same order before the interleaving so that the order of the LDPC information bits is not changed.

The repeaters 216 and 317 may repeat at least some bits of the parity permutated LDPC codeword at a position subsequent to the LDPC information bits, and output the repeated LDPC codeword, that is, the LDPC codeword bits including the repetition bits, to the puncturers 217 and 318. The repeater 317 may also output the repeated LDPC codeword to the additional parity generator 319. In this case, the additional parity generator 319 may use the repeated LDPC codeword to generate the additional parity bits.

In detail, the repeaters 216 and 317 may repeat a predetermined number of LDPC parity bits after the LDPC information bits. That is, the repeaters 216 and 317 may add the predetermined number of repeated LDPC parity bits after the LDPC information bits. Therefore, the repeated LDPC parity bits are positioned between the LDPC information bits and the LDPC parity bits within the LDPC codeword.

Therefore, since the predetermined number of bits within the LDPC codeword after the repetition may be repeated and additionally transmitted to the receiver 200, the foregoing operation may be referred to as repetition.

The term "adding" represents disposing the repetition bits between the LDPC information bits and the LDPC parity bits so that the bits are repeated.

The repetition may be performed only on the L1-basic mode 1 and the L1-detail mode 1, and may not be performed on the other modes. In this case, the repeaters 216 and 317 do not perform the repetition and may output the parity permutated LDPC codeword to the puncturers 217 and 318.

Hereinafter, a method for performing repetition will be described in more detail.

The repeaters 216 and 317 may calculate a number $N_{repeat}$ of bits additionally transmitted per an LDPC codeword based on following Equation 29.

$$N_{repeat}=2\times\lfloor C\times N_{outer}\rfloor+D \qquad (29)$$

In above Equation 29, C has a fixed number and D may be an even integer. Referring to above Equation 29, it may be appreciated that the number of bits to be repeated may be calculated by multiplying C by a given $N_{outer}$ and adding D thereto.

The parameters C and D for the repetition may be selected based on following Table 11. That is, the repeaters 216 and 317 may determine the C and D based on a corresponding mode as shown in following Table 11.

TABLE 11

| | $N_{outer}$ | $K_{sig}$ | $K_{ldpc}$ | C | D | $N_{ldpc\_parity}$ $(=N_{inner}-K_{ldpc})$ | $\eta_{MOD}$ |
|---|---|---|---|---|---|---|---|
| L1-Basic Mode 1 | 368 | 200 | 3240 | 0 | 3672 | 12960 | 2 |
| L1-Detail Mode 1 | 568-2520 | 400-2352 | 3240 | 61/16 | −508 | 12960 | 2 |

Further, the repeaters 216 and 317 may repeat $N_{repeat}$ LDPC parity bits.

Figure 47:
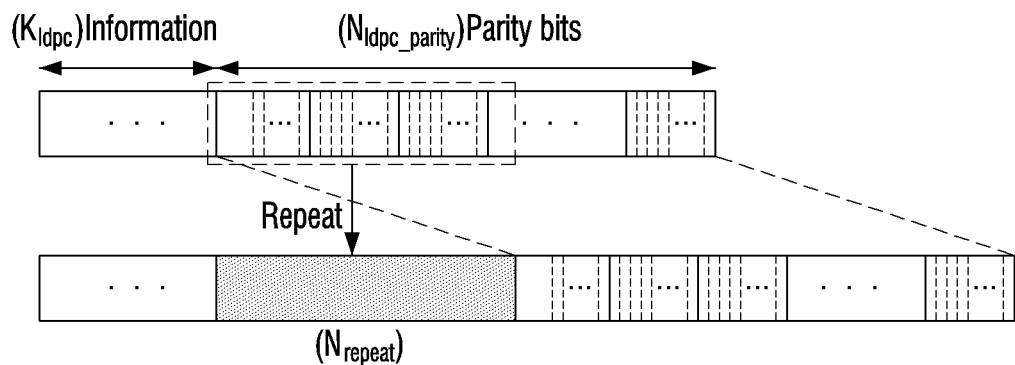

In detail, when $N_{repeat} \leq N_{ldpc\_parity}$, the repeaters 216 and 317 may add first $N_{repeat}$ bits of the parity permutated LDPC parity bits to the LDPC information bits as illustrated in FIG. 47. That is, the repeaters 216 and 317 may add a first LDPC parity bit among the parity permutated LDPC parity bits as an $N_{repeat}$-th LDPC parity bit after the LDPC information bits.

Figure 48:
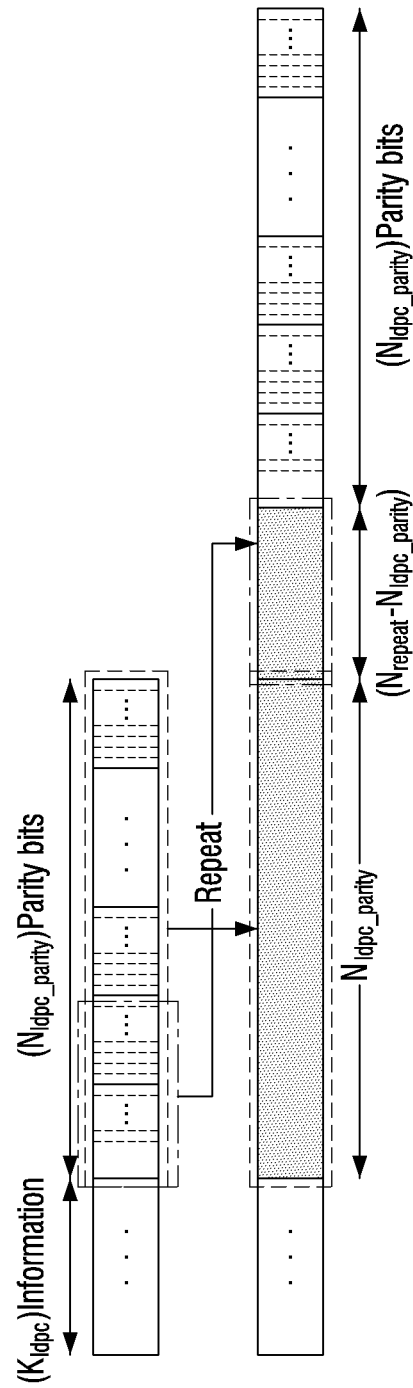

When $N_{repeat}$ $N_{ldpc\_parity}$, the repeaters 216 and 317 may add the parity permutated $N_{ldpc\_parity}$ LDPC parity bits to the LDPC information bits as illustrated in FIG. 48, and may additionally add an $N_{repeat}-N_{ldpc\_parity}$ number of the parity permutated LDPC parity bits to the $N_{ldpc\_parity}$ LDPC parity bits which are first added. That is, the repeaters 216 and 317 may add all the parity permutated LDPC parity bits after the LDPC information bits and additionally add the first LDPC parity bit to the $N_{repeat}-N_{ldpc\_parity}$-th LDPC parity bit among the parity permutated LDPC parity bits after the LDPC parity bits which are first added.

Therefore, in the L1-basic mode 1 and the L1-detail mode 1, the additional $N_{repeat}$ bits may be selected within the LDPC codeword and transmitted.

The puncturers 217 and 318 may puncture some of the LDPC parity bits included in the LDPC codeword output from the repeaters 216 and 317, and output a punctured LDPC codeword (that is, the remaining LDPC codeword bits other than the punctured bits and also referred to as an LDPC codeword after puncturing) to the zero removers 218 and 321. Further, the puncturer 318 may provide information (for example, the number and positions of punctured bits, etc.) about the punctured LDPC parity bits to the additional parity generator 319. In this case, the additional parity generator 319 may generate additional parity bits based thereon.

As a result, after going through the parity permutation, some LDPC parity bits may be punctured.

In this case, the punctured LDPC parity bits are not transmitted in a frame in which L1 signaling bits are transmitted. In detail, the punctured LDPC parity bits are not transmitted in a current frame in which the L1-signaling bits are transmitted, and in some cases, the punctured LDPC parity bits may be transmitted in a frame before the current frame, which will be described with reference to the additional parity generator 319.

For this purpose, the puncturers 217 and 318 may determine the number of LDPC parity bits to be punctured per LDPC codeword and a size of one coded block.

In detail, the puncturers 217 and 318 may calculate a temporary number $N_{punc\_temp}$ of LDPC parity bits to be punctured based on following Equation 30. That is, for a given $N_{outer}$, the puncturers 217 and 318 may calculate the temporary number $N_{punc\_temp}$ of LDPC parity bits to be punctured based on following Equation 30.

$$N_{punc\_temp} = A \times (K_{ldpc} - N_{outer}) + B \quad (30)$$

Referring to above Equation 30, the temporary size of bits to be punctured may be calculated by adding a constant integer B to an integer obtained from a result of multiplying a shortening length (that is, $K_{ldpc} - N_{outer}$) by a preset constant A value. In the present exemplary embodiment, it is apparent that the constant A value is set at a ratio of the number of bits to be punctured to the number of bits to be shortened but may be variously set according to requirements of a system.

Here, the B value is a value which represents a length of bits to be punctured even when the shortening length is 0, and thus, represents a minimum length that the punctured bits can have. Further, the A and B values serve to adjust an actually transmitted code rate. That is, to prepare for a case in which the length of information bits, that is, the length of the L1 signaling is short or a case in which the length of the L1 signaling is long, the A and B values serve to adjust the actually transmitted code rate to be reduced.

The above $K_{ldpc}$, A and B are listed in following Table 12 which shows parameters for puncturing. Therefore, the puncturers 217 and 318 may determine the parameters for puncturing according to a corresponding mode as shown in following Table 12.

TABLE 12

| Signaling FEC Type | | $N_{outer}$ | $K_{ldpc}$ | A | B | $N_{ldpc\_parity}$ | $\eta_{MOD}$ |
|---|---|---|---|---|---|---|---|
| L1-Basic | Mode 1 | 368 | 3240 | 0 | 9360 | 12960 | 2 |
| | Mode 2 | | | | 11460 | | 2 |

TABLE 12-continued

| Signaling FEC Type | | $N_{outer}$ | $K_{ldpc}$ | A | B | $N_{ldpc\_parity}$ | $\eta_{MOD}$ |
|---|---|---|---|---|---|---|---|
| | Mode 3 | | | | 12360 | | 2 |
| | Mode 4 | | | | 12292 | | 4 |
| | Mode 5 | | | | 12350 | | 6 |
| | Mode 6 | | | | 12432 | | 8 |
| | Mode 7 | | | | 12776 | | 8 |
| L1-Detail | Mode 1 | 566-2520 | | 7/2 | 0 | | 2 |
| | Mode 2 | 566-3240 | | 2 | 6036 | | 2 |
| | Mode 3 | 568-6480 | 6480 | 11/16 | 4653 | 9720 | 2 |
| | Mode 4 | | | 29/32 | 3200 | | 4 |
| | Mode 5 | | | 3/4 | 4284 | | 6 |
| | Mode 6 | | | 11/16 | 4900 | | 8 |
| | Mode 7 | | | 49/256 | 8246 | | 8 |

The puncturers 217 and 318 may calculate a temporary size $N_{FEC\_temp}$ of one coded block as shown in following Equation 31. Here, the number $N_{ldpc\_parity}$ of LDPC parity bits according to a corresponding mode is shown as above Table 12.

$$N_{FEC\_temp} = N_{outer} + N_{ldpc\_parity} - N_{punc\_temp} \quad (31)$$

Further, the puncturers 217 and 318 may calculate a size $N_{FEC}$ of one coded block as shown in following Equation 32.

$$N_{FEC} = \left\lceil \frac{N_{FEC\_temp}}{\eta_{MOD}} \right\rceil \times \eta_{MOD} \quad (32)$$

In above Equation 32, $\eta_{MOD}$ is a modulation order. For example, when the L1-basic signaling and the L1-detail signaling are modulated by QPSK, 16-QAM, 64-QAM or 256-QAM according to a corresponding mode, $\eta_{MOD}$ may be 2, 4, 6 and 8 as shown in above Table 12. According to above Equation 32, $N_{FEC}$ may be an integer multiple of the modulation order.

Further, the puncturers 217 and 318 may calculate the number $N_{punc}$ of LDPC parity bits to be punctured based on following Equation 33.

$$N_{punc} = N_{punc\_temp} - (N_{FEC} - N_{FEC\_temp}) \quad (33)$$

Here, $N_{punc}$ is 0 or a positive integer. Further, $N_{FEC}$ is the number of bits of an information block which are obtained by subtracting $N_{punc}$ bits to be punctured from $N_{outer}$ + $N_{ldpc\_parity}$ bits obtained by performing the BCH encoding and the LDPC encoding on $K_{sig}$ information bits. That is, $N_{FEC}$ is the number of bits other than the repetition bits among the actually transmitted bits, and may be called the number of shortened and punctured LDPC codeword bits.

Referring to the foregoing process, the puncturers 217 and 318 multiplies A by the number of padded zero bits, that is, a shortening length and adding B to a result to calculate the temporary number $N_{punc\_temp}$ of LDPC parity bits to be punctured.

Further, the puncturers 217 and 318 calculate the temporary number $N_{FEC\_temp}$ of LDPC codeword bits to constitute the LDPC codeword after puncturing and shortening based on the $N_{punc\_temp}$.

In detail, the LDPC information bits are LDPC-encoded, and the LDPC parity bits generated by the LDPC encoding are added to the LDPC information bits to configure the LDPC codeword. Here, the LDPC information bits include the BCH-encoded bits in which the L1-basic signaling and the L1-detail signaling are BCH encoded, and in some cases, may further include padded zero bits.

In this case, since the padded zero bits are LDPC-encoded, and then, are not transmitted to the receiver 200, the shortened LDPC codeword, that is, the LDPC codeword (that is, shortened LDPC codeword) except the padded zero bits may be formed of the BCH-encoded bits and LDPC parity bits.

Therefore, the puncturers 217 and 318 subtract the temporary number of LDPC parity bits to be punctured from a sum of the number of BCH-encoded bits and the number of LDPC parity bits to calculate the $N_{FEC\_temp}$.

The punctured and shortened LDPC codeword (that is, LDPC codeword bits remaining after puncturing and shortening) are mapped to constellation symbols by various modulation schemes such as QPSK, 16-QAM, 64-QAM or 256-QAM according to a corresponding mode, and the constellation symbols may be transmitted to the receiver 200 through a frame.

Therefore, the puncturers 217 and 318 determine the number $N_{FEC}$ of LDPC codeword bits to constitute the LDPC codeword after puncturing and shortening based on $N_{FEC\_temp}$, $N_{FEC}$ being an integer multiple of the modulation order, and determine the number $N_{punc}$ of bits which need to be punctured based on LDPC codeword bits after shortening to obtain the $N_{FEC}$.

When zero bits are not padded, an LDPC codeword may be formed of BCH-encoded bits and LDPC parity bits, and the shortening may be omitted.

Further, in the L1-basic mode 1 and the L1-detail mode 1, repetition is performed, and thus, the number of shortened and punctured LDPC codeword bits is equal to $N_{FEC}$+$N_{repeat}$.

The puncturers 217 and 318 may puncture the LDPC parity bits as many as the calculated number.

In this case, the puncturers 217 and 318 may puncture the last $N_{punc}$ bits of all the LDPC codewords. That is, the puncturers 217 and 318 may puncture the $N_{punc}$ bits from the last LDPC parity bits.

In detail, when the repetition is not performed, the parity permutated LDPC codeword includes only LDPC parity bits generated by the LDPC encoding.

In this case, the puncturers 217 and 318 may puncture the last $N_{punc}$ bits of all the parity permutated LDPC codewords. Therefore, the $N_{punc}$ bits from the last LDPC parity bits among the LDPC parity bits generated by the LDPC encoding may be punctured.

When the repetition is performed, the parity permutated and repeated LDPC codeword includes the repeated LDPC parity bits and the LDPC parity bits generated by the LDPC encoding.

Figure 49:
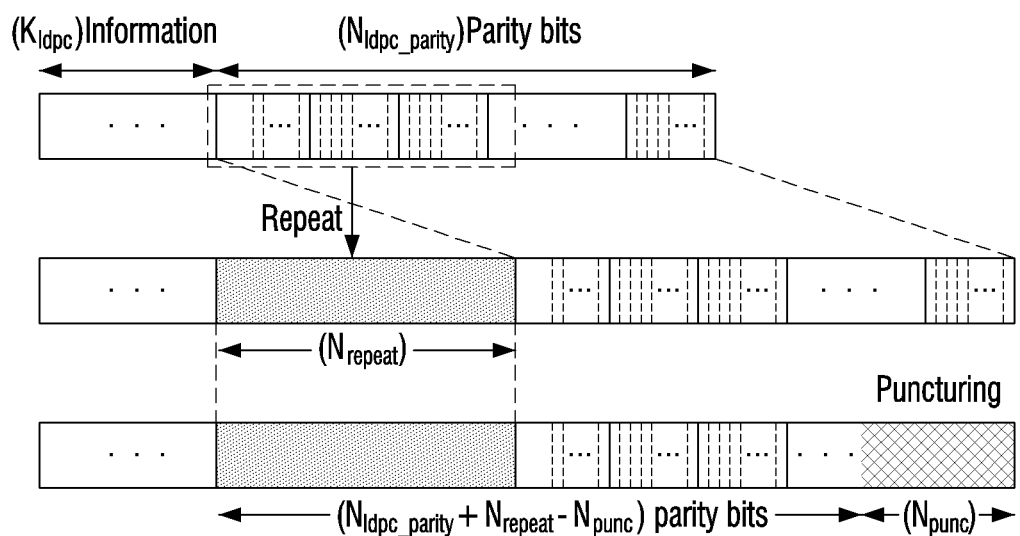
Figure 50:
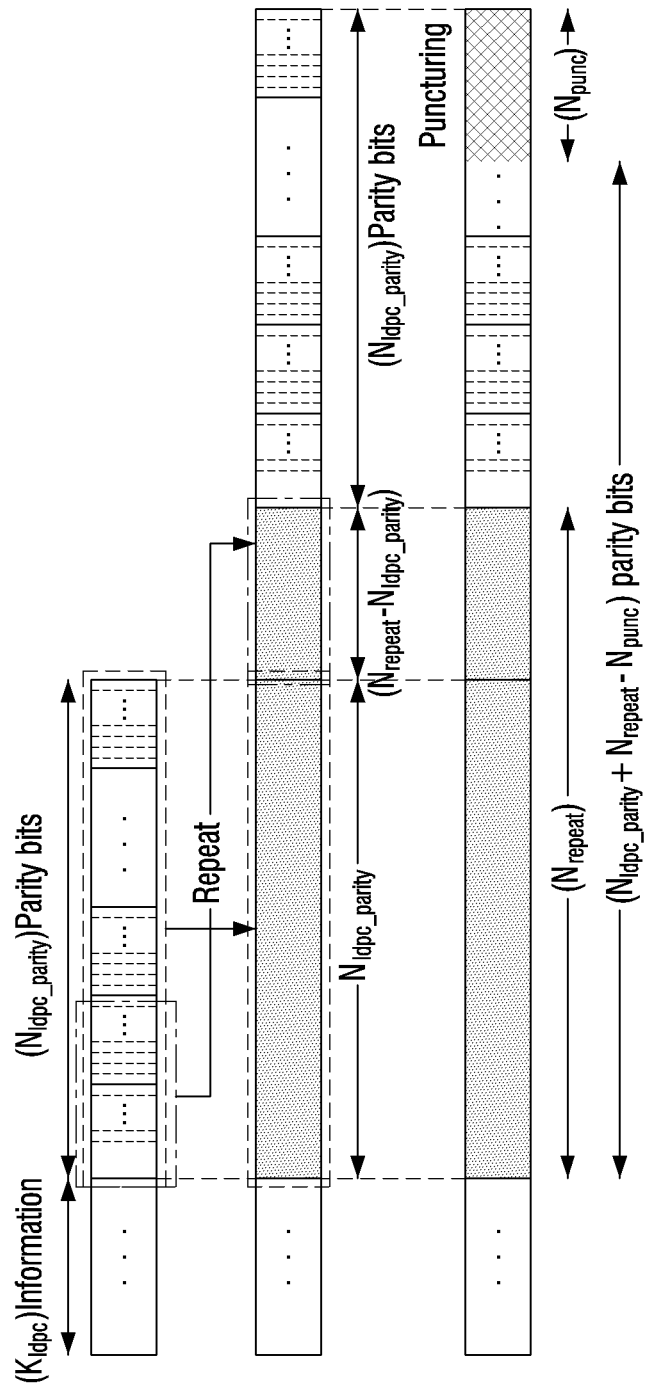

In this case, the puncturers 217 and 318 may puncture the last $N_{punc}$ bits of all the parity permutated and repeated LDPC codewords, respectively, as illustrated in FIGS. 49 and 50.

In detail, the repeated LDPC parity bits are positioned between the LDPC information bits and the LDPC parity bits generated by the LDPC encoding, and thus, the puncturers 217 and 318 may puncture the $N_{punc}$ bits from the last LDPC parity bits among the LDPC parity bits generated by the LDPC encoding, respectively.

As such, the puncturers 217 and 318 may puncture the $N_{punc}$ bits from the last LDPC parity bits, respectively.

$N_{punc}$ is 0 or a positive integer and the repetition may be applied only to the L1-basic mode 1 and the L1-detail mode 1.

The foregoing example describes that the repetition is performed, and then, the puncturing is performed, which is only one example. In some cases, after the puncturing is performed, the repetition may be performed.

The additional parity generator 319 may select bits from the LDPC parity bits to generate additional parity (AP) bits.

In this case, the additional parity bits may be selected from the LDPC parity bits generated based on the L1-detail signaling transmitted in a current frame, and transmitted to the receiver 200 through a frame before the current frame, that is, a previous frame.

In detail, the L1-detail signaling is LDPC-encoded, and the LDPC parity bits generated by the LDPC encoding are added to the L1-detail signaling to configure an LDPC codeword.

Further, puncturing and shortening are performed on the LDPC codeword, and the punctured and shortened LDPC codeword may be mapped to a frame to be transmitted to the receiver 200. Here, when the repetition is performed according to a corresponding mode, the punctured and shortened LDPC codeword may include the repeated LDPC parity bits.

In this case, the L1-detail signaling corresponding to each frame may be transmitted to the receiver 200 through each frame, along with the LDPC parity bits. For example, the punctured and shortened LDPC codeword including the L1-detail signaling corresponding to an (i−1)-th frame may be mapped to the (i−1)-th frame to be transmitted to the receiver 200, and the punctured and shortened LDPC codeword including the L1-detail signaling corresponding to the i-th frame may be mapped to the i-th frame to be transmitted to the receiver 200.

The additional parity generator 319 may select at least some of the LDPC parity bits generated based on the L1-detail signaling transmitted in the i-th frame to generate the additional parity bits.

In detail, some of the LDPC parity bits generated by performing the LDPC encoding on the L1-detail signaling are punctured, and then, are not transmitted to the receiver 200. In this case, the additional parity generator 319 may select at least some of the punctured LDPC parity bits among the LDPC parity bits generated by performing the LDPC encoding on the L1-detail signaling transmitted in the i-th frame, thereby generating the additional parity bits.

Further, the additional parity generator 319 may select at least some of the LDPC parity bits to be transmitted to the receiver 200 through the i-th frame to generate the additional parity bits.

In detail, the LDPC parity bits included in the punctured and shortened LDPC codeword to be mapped to the i-th frame may be configured of only the LDPC parity bits generated by the LDPC encoding according to a corresponding mode or the LDPC parity bits generated by the LDPC encoding and the repeated LDPC parity bits.

In this case, the additional parity generator 319 may select at least some of the LDPC parity bits included in the punctured and shortened LDPC codeword to be mapped to the i-th frame to generate the additional parity bits.

The additional parity bits may be transmitted to the receiver 200 through the frame before the i-th frame, that is, the (i−1)-th frame.

That is, the transmitter 100 may not only transmit the punctured and shortened LDPC codeword including the L1-detail signaling corresponding to the (i−1)-th frame but also transmit the additional parity bits generated based on the L1-detail signaling transmitted in the i-th frame to the receiver 200 through the (i−1)-th frame.

In this case, the frame in which the additional parity bits are transmitted may be temporally the most previous frame among the frames before the current frame.

For example, the additional parity bits have the same bootstrap major/minor version as the current frame among the frames before the current frame, and may be transmitted in temporally the most previous frame.

In some cases, the additional parity generator 319 may not generate the additional parity bits.

In this case, the transmitter 100 may transmit information about whether additional parity bits for an L1-detail signaling of a next frame are transmitted through the current frame to the receiver 200 using an L1-basic signaling transmitted through the current frame.

For example, the use of the additional parity bits for the L1-detail signaling of the next frame having the same bootstrap major/minor version as the current frame may be signaled through a field L1B_L1_Detail_additional_parity_mode of the L1-basic parameter of the current frame. In detail, when the L1B_L1_Detail_additional_parity_mode in the L1-basic parameter of the current frame is set to be '00', additional parity bits for the L1-detail signaling of the next frame are not transmitted in the current frame.

As such, to additionally increase robustness of the L1-detail signaling, the additional parity bits may be transmitted in the frame before the current frame in which the L1-detail signaling of the current frame is transmitted.

Figure 51:
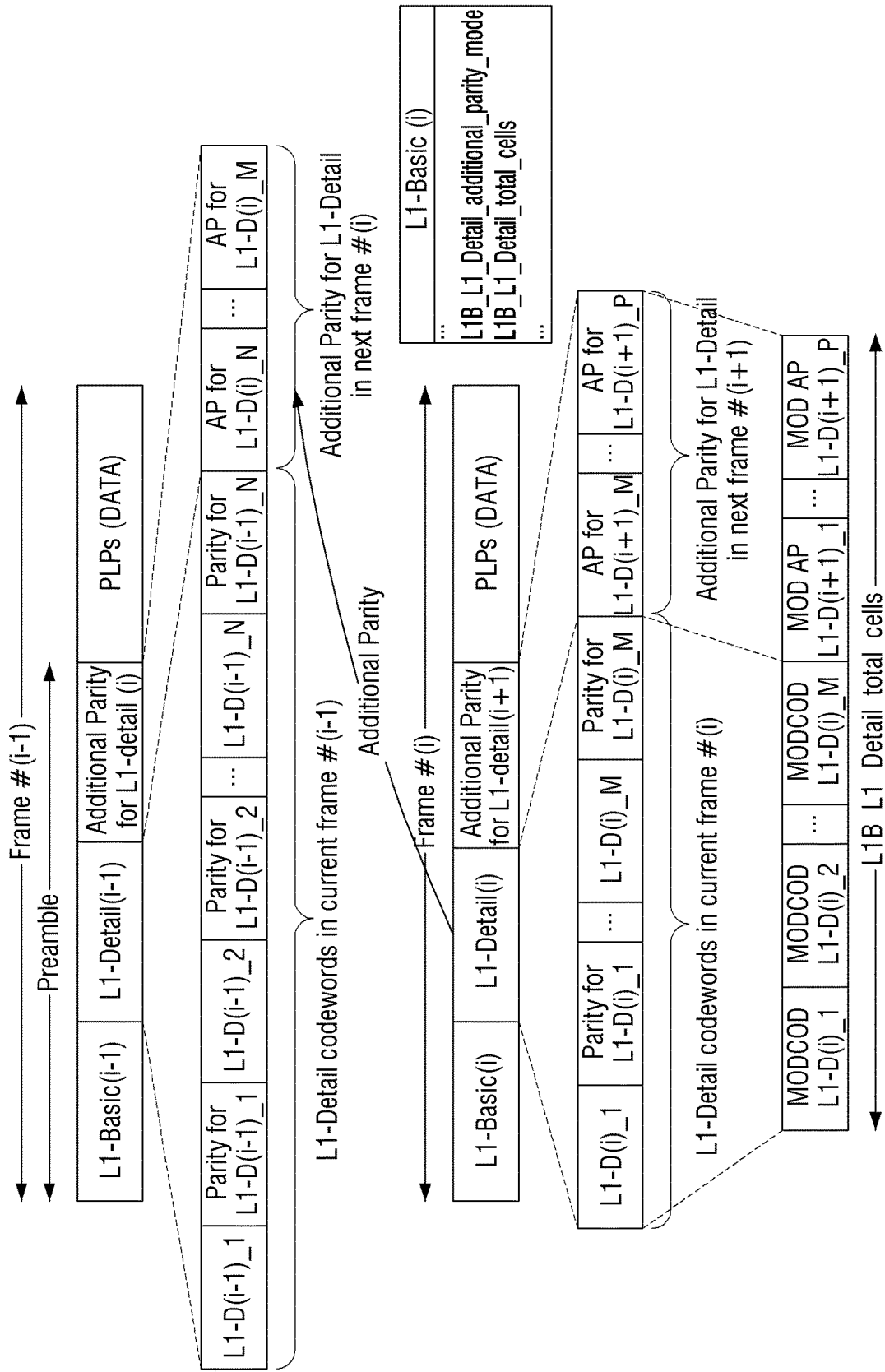

FIG. 51 illustrates an example in which the additional parity bits for the L1-detail signaling of the i-th frame are transmitted in a preamble of the (i−1)-th frame.

FIG. 51 illustrates that the L1-detail signaling transmitted through the i-th frame is segmented into M blocks by segmentation and each of the segmented blocks is FEC encoded.

Therefore, M number of LDPC codewords, that is, an LDPC codeword including LDPC information bits L1-D(i)_1 and parity bits parity for L1-D(i)_1 therefor, . . . , and an LDPC codeword including LDPC information bits L1-D(i)_M and parity bits parity for L1-D(i)_M therefor are mapped to the i-th frame to be transmitted to the receiver 200.

In this case, the additional parity bits generated based on the L1-detail signaling transmitted in the i-th frame may be transmitted to the receiver 200 through the (i−1)-th frame.

In detail, the additional parity bits, that is, AP for L1-D(i) 1, . . . AP for L1-D(i)_M generated based on the L1-detail signaling transmitted in the i-th frame may be mapped to the preamble of the (i−1)-th frame to be transmitted to the receiver 200. As a result of using the additional parity bits, a diversity gain for the L1 signaling may be obtained.

Hereinafter, a method for generating additional parity bits will be described in detail.

The additional parity generator 319 calculates a temporary number $N_{AP\_temp}$ of additional parity bits based on following Equation 34.

$$N_{AP\_temp} = \min\begin{Bmatrix} 0.5 \times K \times (N_{outer} + N_{ldpc\_parity} - N_{punc} + N_{repeat}), \\ (N_{ldpc\_parity} - N_{punc} + N_{repeat}) \end{Bmatrix}, \quad (34)$$

$$K = 0, 1, 2$$

In above Equation 34, $$\min(a, b) = \begin{cases} a, & \text{if } a \leq b \\ b, & \text{if } b < a \end{cases}.$$

Further, K represents a ratio of the additional parity bits to a half of a total number of bits of a transmitted coded L1-detail signaling block (that is, bits configuring the L1-detail signaling block repeated, punctured, and have the zero bits removed (that is, shortened)).

In this case, K corresponds to an L1B_L1_Detail_additional_parity_mode field of the L1-basic signaling. Here, a value of the L1B_L1_Detail_additional_parity_mode associated with the L1-detail signaling of the i-th frame (that is, frame (#i)) may be transmitted in the (i−1)-th frame (that is, frame (#i−1)).

As described above, when L1 detail modes are 2, 3, 4, 5, 6 and 7, since repetition is not performed, in above Equation 34, $N_{repeat}$ is 0.

Further, the additional parity generator 319 calculates the number $N_{AP}$ of additional parity bits based on following Equation 35. Therefore, the number $N_{AP}$ of additional parity bits may be a multiple of a modulation order.

$$N_{AP} = \left\lfloor \frac{N_{AP\_temp}}{\eta_{MOD}} \right\rfloor \times \eta_{MOD} \quad (35)$$

Here, $\lfloor x \rfloor$ is a maximum integer which is equal to or greater than x. Here, $\eta_{MOD}$ is the modulation order. For example, when the L1-detail signaling is modulated by QPSK, 16-QAM, 64-QAM or 256-QAM according to a corresponding mode, the $\eta_{MOD}$ may be 2, 4, 6 or 8, respectively.

As such, the number of additional parity bits to be generated may be determined based on the total number of bits to be transmitted in the current frame.

Next, the additional parity generator 319 may select bits as many as the number of bits calculated in the LDPC parity bits to generate the additional parity bits.

In detail, when the number of punctured LDPC parity bits is equal to or greater than the number of additional parity bits to be generated, the additional parity generator 319 may select bits as many as the calculated number from the first LDPC parity bit among the punctured LDPC parity bits to generate the additional parity bits.

When the number of punctured LDPC parity bits is less than the number of additional parity bits to be generated, the additional parity generator 319 may first select all the punctured LDPC parity bits, and additionally select bits as many as the number obtained by subtracting the number of punctured LDPC parity bits from the number of additional parity bits to be generated, from the first LDPC parity bit among the LDPC parity bits included in the LDPC codeword, to generate the additional parity bits.

In detail, when repetition is not performed, LDPC parity bits included in a repeated LDPC codeword are the LDPC parity bits generated by the LDPC encoding.

In this case, the additional parity generator 319 may first select all the punctured LDPC parity bits and additionally select bits as many as the number obtained by subtracting the number of punctured LDPC parity bits from the number of additional parity bits, from the first LDPC parity bit among the LDPC parity bits generated by the LDPC encoding, to generate the additional parity bits.

Here, the LDPC parity bits generated by the LDPC encoding are divided into non-punctured LDPC parity bits and punctured LDPC parity bits. As a result, when the bits are selected from the first bit among the LDPC parity bits generated by the LDPC encoding, they may be selected in an order of the non-punctured LDPC parity bits and the punctured LDPC parity bits.

When the repetition is performed, the LDPC parity bits included in the repeated LDPC codeword are the repeated LDPC parity bits and the LDPC parity bits generated by the encoding. Here, the repeated LDPC parity bits are positioned between the LDPC information bits and the LDPC parity bits generated by the LDPC encoding.

In this case, the additional parity generator 319 may first select all the punctured LDPC parity bits and additionally select bits as many as the number obtained by subtracting the number of punctured LDPC parity bits from the number of additional parity bits, from the first LDPC parity bit among the repeated LDPC parity bits to generate the additional parity bits.

Here, when bits are selected from the first bit among the repeated LDPC parity bits, they may be selected in an order of the repetition bits and the LDPC parity bits generated by the LDPC encoding. Further, bits may be selected in an order of the non-punctured LDPC parity bits and the punctured LDPC parity bits, within the LDPC parity bits generated by the LDPC encoding.

Hereinafter, methods for generating additional parity bits according to exemplary embodiments will be described in more detail with reference to FIGS. 52 to 54.

Figure 52:
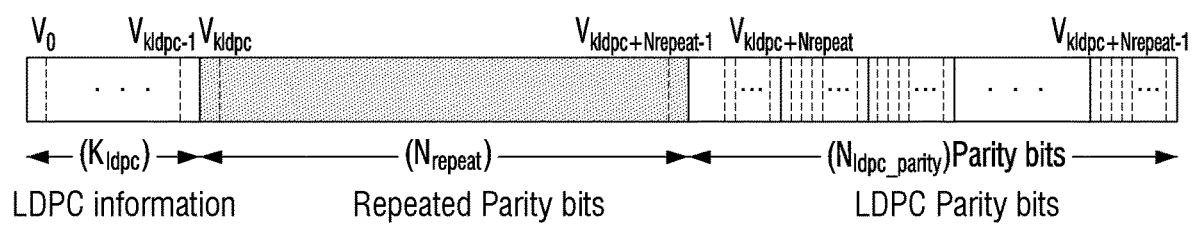
Figure 53:
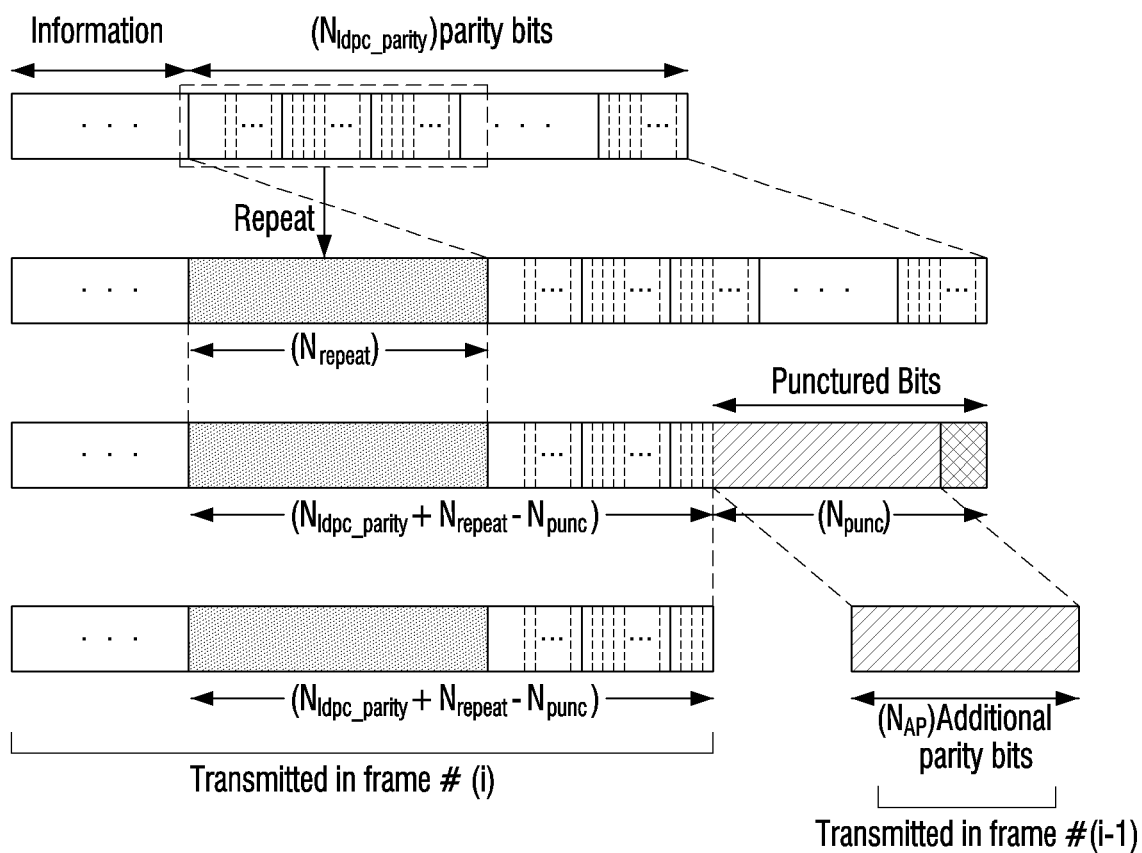
Figure 54:
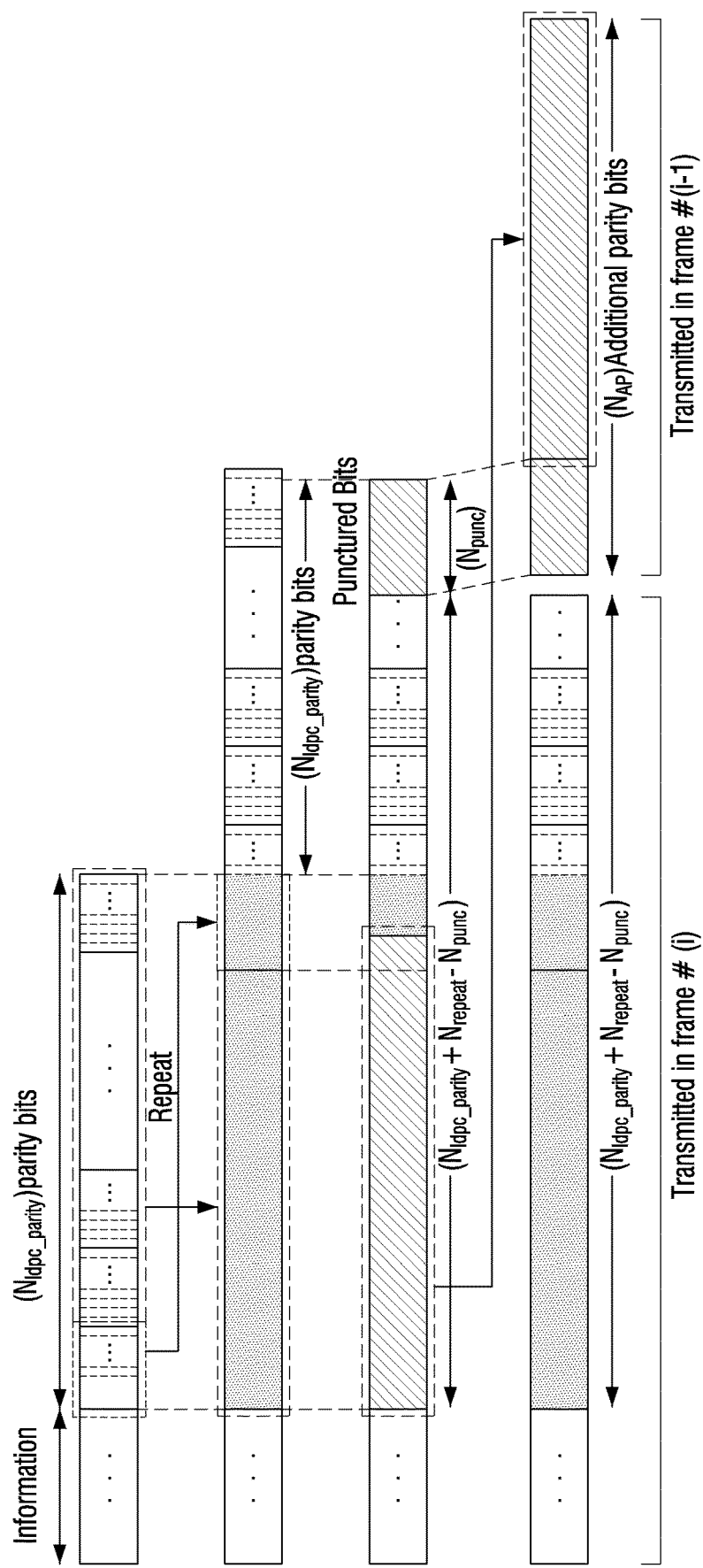

FIGS. 52 to 54 are diagrams for describing the methods for generating additional parity bits when repetition is performed, according to the exemplary embodiments. In this case, a repeated LDPC codeword $V=(v_0, v_1, \ldots, v_{N_{inner}+N_{repeat}-1})$ may be represented as illustrated in FIG. 52.

First, when $N_{AP} \leq N_{punc}$, as illustrated in FIG. 53, the additional parity generator 319 may select $N_{AP}$ bits from the first LDPC parity bit among punctured LDPC parity bits to generate the additional parity bits.

Therefore, for the additional parity bits, the punctured LDPC parity bits $(v_{N_{repeat}+N_{inner}-N_{punc}}, v_{N_{repeat}+N_{inner}-N_{punc}+1}, v_{N_{repeat}+N_{inner}-N_{punc}-N_{AP}-1})$ may be selected. That is, the additional parity generator 319 may select the $N_{AP}$ bits from the first bit among the punctured LDPC parity bits to generate the additional parity bits.

When $N_{AP} > N_{punc}$, as illustrated in FIG. 54, the additional parity generator 319 selects all the punctured LDPC parity bits.

Therefore, for the additional parity bits, all the punctured LDPC parity bits $(v_{N_{repeat}+N_{inner}-N_{punc}}, v_{N_{repeat}+N_{inner}-N_{punc}+1}, \ldots, v_{N_{repeat}+N_{inner}-1})$ may be selected.

Further, the additional parity generator 319 may additionally select first $N_{AP}-N_{punc}$ bits from the LDPC parity bits including the repeated LDPC parity bits and the LDPC parity bits generated by the LDPC encoding.

That is, since the repeated LDPC parity bits and the LDPC parity bits generated by the LDPC encoding are sequentially arranged, the additional parity generator 319 may additionally select the $N_{AP}-N_{punc}$ parity bits from the first LDPC parity bit among the repeated LDPC parity bits.

Therefore, for the additional parity bits, the LDPC parity bits $(v_{K_{ldpc}}, v_{K_{ldpc}+1}, \ldots, v_{K_{ldpc}+N_{AP}-N_{punc}-1})$ may be additionally selected.

In this case, the additional parity generator 319 may add the additionally selected bits to the previously selected bits to generate the additional parity bits. That is, as illustrated in FIG. 54, the additional parity generator 319 may add the additionally selected LDPC parity bits to the punctured LDPC parity bits to generate the additional parity bits.

As a result, for the additional parity bits, $(v_{N_{repeat}+N_{inner}-N_{punc}}, v_{N_{repeat}+N_{inner}-N_{punc}+1}, \ldots, v_{N_{repeat}+N_{inner}-1}, v_{K_{ldpc}}, v_{K_{ldpc}+1}, \ldots, v_{K_{ldpc}+N_{AP}-N_{punc}-1})$ may be selected.

As such, when the number of punctured bits is equal to or greater than the number of additional parity bits to be generated, the additional parity bits may be generated by selecting bits among the punctured bits based on the puncturing order. On the other hand, in other cases, the additional parity bits may be generated by selecting all the punctured bits and the $N_{AP}-N_{punc}$ parity bits.

Since $N_{repeat}=0$ when repetition is not performed, the method for generating additional parity bits when the repetition is not performed is the same as the case in which $N_{repeat}=0$ in FIGS. 52 to 54.

The additional parity bits may be bit-interleaved, and may be mapped to constellation. In this case, the constellation for the additional parity bits may be generated by the same method as constellation for the L1-detail signaling bits transmitted in the current frame, in which the L1-detail signaling bits are repeated, punctured, and have the zero bits removed. Further, as illustrated in FIG. 51, after being mapped to the constellation, the additional parity bits may be added after the L1-detail signaling block in a frame before the current frame in which the L1-detail signaling of the current frame is transmitted.

The additional parity generator 319 may output the additional parity bits to a bit demultiplexer 323.

As described above in reference to Tables 9 and 10, the group-wise interleaving pattern defining the permutation order may have two patterns: a first pattern and a second pattern.

In detail, since the B value of above Equation 30 represents the minimum length of the LDPC parity bits to be punctured, the predetermined number of bits may be always punctured depending on the B value regardless of the length of the input signaling. For example, in the L1-detail mode 2, since B=6036 and the bit group is formed of 360 bits, even when the shortening length is 0, at least $$\left\lfloor \frac{6036}{360} \right\rfloor = 16$$

bit groups are always punctured.

In this case, since the puncturing is performed from the last LDPC parity bit, the predetermined number of bit groups from a last bit group among the plurality of bit groups configuring the group-wise interleaved LDPC parity bits may be always punctured regardless of the shortening length.

For example, in the L1-detail mode 2, the last 16 bit groups among 36 bit groups configuring the group-wise interleaved LDPC parity bits may be always punctured.

As a result, some of the group-wise interleaving patterns defining the permutation order represent bit groups always to punctured, and therefore, the group-wise interleaving pattern may be divided into two patterns. In detail, a pattern defining the remaining bit groups other than the bit groups to be always punctured in the group-wise interleaving pattern is referred to as the first pattern, and the pattern defining the bit groups to be always punctured is referred to as the second pattern.

For example, in the L1-detail mode 2, since the group-wise interleaving pattern is defined as above Table 9, a pattern representing indexes of bit groups which are not group-wise interleaved and positioned in a 9-th bit group to a 28-th bit group after group-wise interleaving, that is, $Y_9=X_{\pi p(9)}=X_9$, $Y_{10}=X_{\pi p(10)}=X_{31}$, $Y_{11}=X_{\pi p(11)}=X_{23}$, ..., $Y_{26}=X_{\pi p(26)}=X_{17}$, $Y_{27}=X_{\pi p(27)}=X_{35}$, $Y_{28}=X_{\pi p(28)}=X_{21}$ may be the first pattern, and a pattern representing indexes of bit groups which are not group-wise interleaved and positioned in a 29-th bit group to a 44-th bit group after group-wise interleaving, that is, $Y_{29}=X_{\pi p(29)}=X_{20}$, $Y_{30}=X_{\pi p(30)}=X_{24}$, $Y_{31}=X_{\pi p(31)}=X_{44}$, ..., $Y_{42}=X_{\pi p(42)}=X_{28}$, $Y_{43}=X_{\pi p(43)}=X_{39}$, $Y_{44}=X_{\pi p(44)}=X_{42}$ may be the second pattern.

As described above, the second pattern defines bit groups to be always punctured in a current frame regardless of the shortening length, and the first pattern defines bit groups additionally to be punctured as the shortening length is long, such that the first pattern may be considered as determining the LDPC parity bits to be transmitted in the current frame after the puncturing.

In detail, according to the number of LDPC parity bits to be punctured, in addition to the LDPC parity bits to be always punctured, more LDPC parity bits may additionally be punctured.

For example, in the L1-detail mode 2, when the number of LDPC parity bits to be punctured is 7200, 20 bit groups need to be punctured, and thus, four (4) bit groups need to be additionally punctured, in addition to the 16 bit groups to be always punctured.

In this case, the additionally punctured four (4) bit groups correspond to the bit groups positioned at 25-th to 28-th positions after group-wise interleaving, and since these bit groups are determined according to the first pattern, that is, belong to the first pattern, the first pattern may be used to determine bit groups to be punctured.

That is, when LDPC parity bits are punctured more than a minimum value of LDPC parity bits to be punctured, which bit groups are to be additionally punctured is determined according to which bit groups are positioned after the bit groups to be always punctured. As a result, according to a puncturing direction, the first pattern which defines the bit groups positioned after the bit groups to be always punctured may be considered as determining bit groups to be punctured.

That is, as in the foregoing example, when the number of LDPC parity bits to be punctured is 7200, in addition to the 16 bit groups to be always punctured, four (4) bit groups, that is, the bit groups positioned at 28-th, 27-th, 26-th, and 25-th positions, after group-wise interleaving is performed, are additionally punctured. Here, the bit groups positioned at 25-th to 28-th positions after the group-wise interleaving are determined according to the first pattern.

As a result, the first pattern may be considered as being used to determine the bit groups to be punctured. Further, the remaining LDPC parity bits other than the punctured LDPC parity bits are transmitted through the current frame, and therefore, the first pattern may be considered as being used to determine the bit groups transmitted in the current frame.

The second pattern may be used to determine the additional parity bits transmitted in the previous frame.

In detail, since the bit groups determined to be always punctured are always punctured, and then, are not transmitted in the current frame, these bit groups need to be positioned only where bits are always punctured after group-wise interleaving. Therefore, it is not important at which position of these bit groups are positioned after the group-wise interleaving.

For example, in the L1-detail mode 2, bit groups positioned at 20-th, 24-th, 44-th, ..., 28-th, 39-th and 42-th positions before the group-wise interleaving need to be positioned only at a 29-th bit group to a 44-th bit group after the group-wise interleaving. Therefore, it is not important at which positions of these bit groups are positioned.

As such, the second pattern defining bit groups to be always punctured is used to identify bit groups to be punctured. Therefore, defining an order between the bit groups in the second pattern is meaningless in the puncturing, and thus, the second pattern defining bit groups to be always punctured may be considered as not being used for the puncturing.

However, for determining additional parity bits, positions of the bit groups to be always punctured within these bit groups need to be considered.

In detail, since the additional parity bits are generated by selecting bits as many as a predetermined number from the first bit among the punctured LDPC parity bits, bits included in at least some of the bit groups to be always punctured may be selected as at least some of the additional parity bits depending on the number of punctured LDPC parity bits and the number of additional parity bits to be generated.

That is, when additional parity bits are selected over the number of bit groups defined according to the first pattern, since the additional parity bits are sequentially selected from a start portion of the second pattern, the order of the bit groups belonging to the second pattern is meaningful in terms of selection of the additional parity bits. As a result, the second pattern defining bit groups to be always punctured may be considered as being used to determine the additional parity bits.

For example, in the L1-detail mode 2, the total number of LDPC parity bits is 12960 and the number of bit groups to be always punctured is 16.

In this case, the second pattern may be used to generate the additional parity bits depending on whether a value obtained by subtracting the number of LDPC parity bits to be punctured from the number of all LDPC parity bits and adding the subtraction result to the number of additional parity bits to be generated exceeds 7200. Here, 7200 is the number of LDPC parity bits except the bit groups to be always punctured, among the bit groups configuring the LDPC parity bits. That is, $7200=(36-16)\times 360$.

In detail, when the value obtained by the above subtraction and addition is equal to or less than 7200, that is, $12960-N_{punc}+N_{AP}\leq 7200$, the additional parity bits may be generated according to the first pattern.

However, when the value obtained by the above subtraction and addition exceeds 7200, that is, $12960-N_{punc}+N_{AP}>7200$, the additional parity bits may be generated according to the first pattern and the second pattern.

In detail, when $12960-N_{punc}+N_{AP}>7200$, for the additional parity bits, bits included in the bit group positioned at a 28-th position from the first LDPC parity bit among the punctured LDPC parity bits may be selected, and bits included in the bit group positioned at a predetermined position from a 29-th position may be selected.

Here, the bit group to which the first LDPC parity bit among the punctured LDPC parity bits belongs and the bit group (that is, when being sequentially selected from the first LDPC parity bit among the punctured LDPC parity bits, a bit group to which the finally selected LDPC parity bits belong) at the predetermined position may be determined depending on the number of punctured LDPC parity bits and the number of additional parity bits to be generated.

In this case, the bit group positioned at the 28-th position from the firth LDPC parity bit among the punctured LDPC parity bits is determined according to the first pattern, and the bit group positioned at the predetermined position from the 29-th position is determined according to the second pattern.

As a result, the additional parity bits are determined according to the first pattern and the second pattern.

As such, the first pattern may be used to determine additional parity bits to be generated as well as LDPC parity bits to be punctured, and the second pattern may be used to determine the additional parity bits to be generated and LDPC parity bits to be always punctured regardless of the number of parity bits to be punctured by the puncturers 217 and 318.

The foregoing example describes that the group-wise interleaving pattern includes the first pattern and the second pattern, which is only for convenience of explanation in terms of the puncturing and the additional parity. That is, the group-wise interleaving pattern may be considered as one pattern without being divided into the first pattern and the second pattern. In this case, the group-wise interleaving may be considered as being performed with one pattern both for the puncturing and the additional parity.

The values used in the foregoing example such as the number of punctured LDPC parity bits are only example values.

The zero removers 218 and 321 may remove zero bits padded by the zero padders 213 and 314 from the LDPC codewords output from the puncturers 217 and 318, and output the remaining bits to the bit demultiplexers 219 and 322.

Here, the removal does not only remove the padded zero bits but also may include outputting the remaining bits other than the padded zero bits in the LDPC codewords.

In detail, the zero removers 218 and 321 may remove $K_{ldpc}-N_{outer}$ zero bits padded by the zero padders 213 and 314. Therefore, the $K_{ldpc}-N_{out}$ padded zero bits are removed, and thus, may not be transmitted to the receiver 200.

Figure 55:
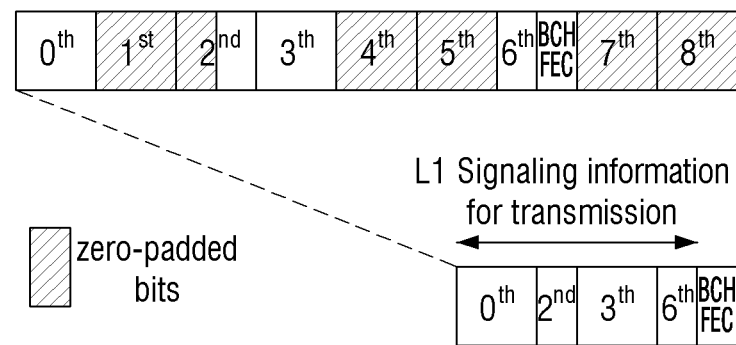

For example, as illustrated in FIG. 55, it is assumed that all bits of a first bit group, a fourth bit group, a fifth bit group, a seventh bit group, and an eighth bit group among a plurality of bit groups configuring an LDPC codeword are padded by zero bits, and some bits of the second bit group are padded by zero bits.

In this case, the zero removers 218 and 321 may remove the zero bits padded to the first bit group, the second bit group, the fourth bit group, the fifth bit group, the seventh bit group, and the eighth bit group.

As such, when zero bits are removed, as illustrated in FIG. 55, an LDPC codeword formed of $K_{sig}$ information bits (that is, $K_{sig}$ L1-basic signaling bits and $K_{sig}$ L1-detail signaling bits), 168 BCH parity check bits (that is, BCH FEC), and $N_{inner}-K_{ldpc}-N_{punc}$ or $N_{inner}-K_{ldpc}-N_{punc}+N_{repeat}$ parity bits may remain.

That is, when repetition is performed, the lengths of all the LDPC codewords become $N_{FEC}+N_{repeat}$. Here, $N_{FEC}=N_{outer}+N_{ldpc\_parity}-N_{punc}$. However, in a mode in which the repetition is not performed, the lengths of all the LDPC codewords become $N_{FEC}$.

The bit demultiplexers 219 and 322 may interleave the bits output from the zero removers 218 and 321, demultiplex the interleaved bits, and then output them to the constellation mappers 221 and 324.

For this purpose, the bit demultiplexers 219 and 322 may include a block interleaver (not illustrated) and a demultiplexer (not illustrated).

Figure 56:
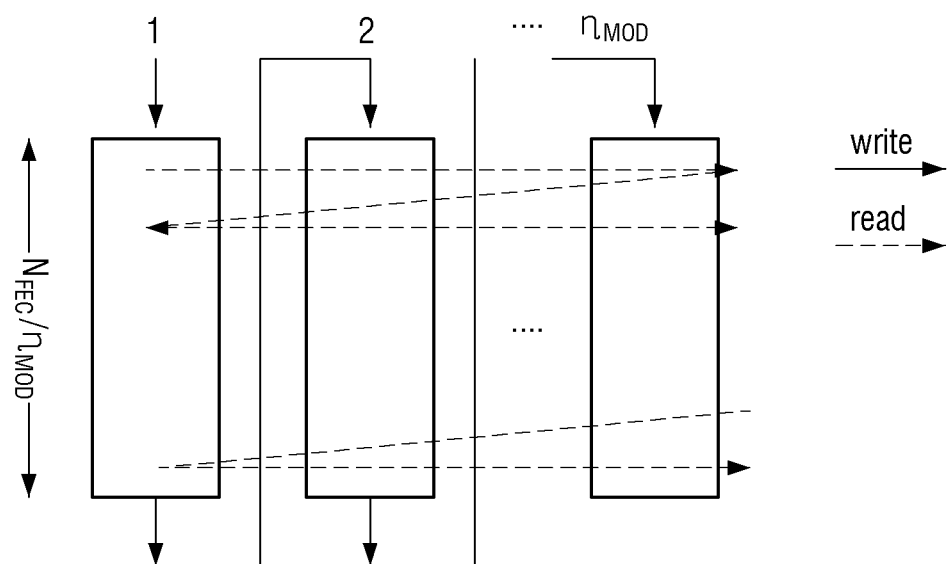

First, a block interleaving scheme performed in the block interleaver is illustrated in FIG. 56.

In detail, the bits of the $N_{FEC}$ or $N_{FEC}\pm N_{repeat}$ length after the zero bits are removed may be column-wisely serially written in the block interleaver. Here, the number of columns of the block interleaver is equivalent to the modulation order and the number of rows is $N_{FEC}/\eta_{MOD}$ or $(N_{FEC}\pm N_{repeat})/\eta_{MOD}$.

Further, in a read operation, bits for one constellation symbol may be sequentially read in a row direction to be input to the demultiplexer. The operation may be continued to the last row of the column.

That is, the $N_{FEC}$ or $(N_{FEC}+N_{repeat})$ bits may be written in a plurality of columns in a column direction from the first row of the first column, and the bits written in the plurality of columns are sequentially read from the first row to the last row of the plurality of columns in a row direction. In this case, the bits read in the same row may configure one modulation symbol.

The demultiplexer may demultiplex the bits output from the block interleaver.

In detail, the demultiplexer may demultiplex each of the block-interleaved bit groups, that is, the bits output while being read in the same row of the block interleaver within the bit group bit-by-bit, before the bits are mapped to constellation.

In this case, two mapping rules may be present according to the modulation order.

In detail, when QPSK is used for modulation, since reliability of bits within a constellation symbol is the same, the demultiplexer does not perform the demultiplexing operation on a bit group. Therefore, the bit group read and output from the block interleaver may be mapped to a QPSK symbol without the demultiplexing operation.

However, when high order modulation is used, the demultiplexer may perform demultiplexing on a bit group read and output from the block interleaver based on following Equation 36. That is, a bit group may be mapped to a QAM symbol depending on following Equation 36.

$$S_{demux\_in(i)}=\{b_i(0),b_i(1),b_i(2),\ldots,b_i(\eta_{MOD}-1)\},$$

$$S_{demux\_out(i)}=\{c_i(0),c_i(1),c_i(2),\ldots,c_i(\eta_{MOD}-1)\},$$

$$c_i(0)=b_i(i\%\eta_{MOD}),c_i(1)=b_i((i+1)\%\eta_{MOD}),\ldots,$$
$$c_i(\eta_{MOD}-1)=b_i((i+\eta_{MOD}-1)\%\eta_{MOD}) \tag{36}$$

In above Equation 36, % represents a modulo operation, and $\eta_{MOD}$ is a modulation order.

Further, i is a bit group index corresponding to a row index of the block interleaver. That is, an output bit group $S_{demux\_out(i)}$ mapped to each of the QAM symbols may be cyclic-shifted in an $S_{demux\_in(i)}$ according to the bit group index i.

Figure 57:
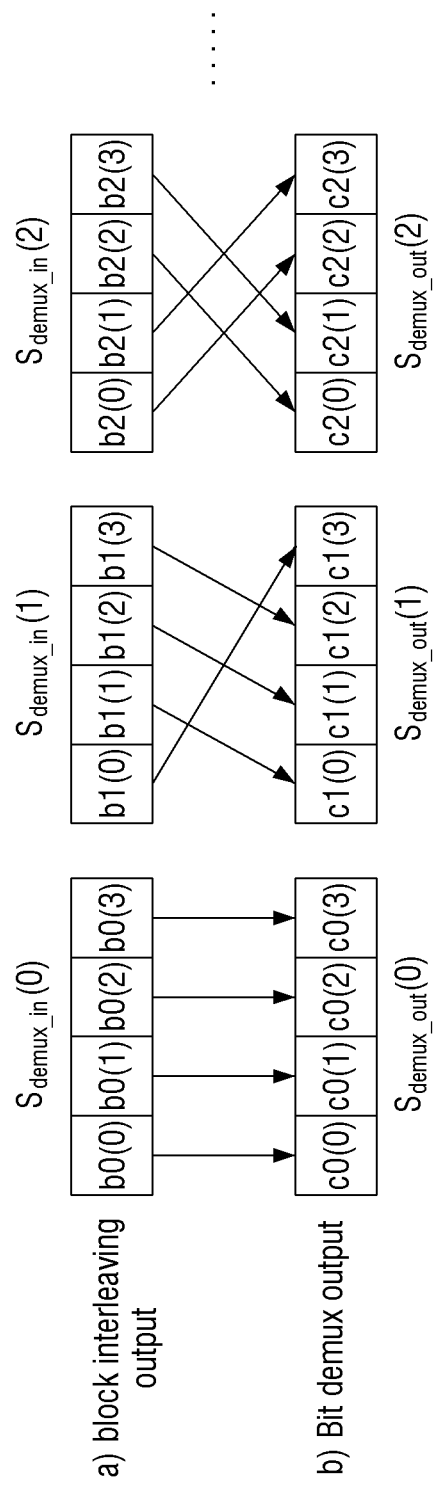

FIG. 57 illustrates an example of performing bit demultiplexing on 16-non uniform constellation (16-NUC), that is, NUC 16-QAM. The operation may be continued until all bit groups are read in the block interleaver.

The bit demultiplexer 323 may perform the same operation, as the operations performed by the bit demultiplexers 219 and 322, on the additional parity bits output from the additional parity generator 319, and output the block-interleaved and demultiplexed bits to the constellation mapper 325.

The constellation mappers 221, 324 and 325 may map the bits output from the bit demultiplexers 219, 322 and 323 to constellation symbols, respectively.

That is, each of the constellation mappers 221, 324 and 325 may map the $S_{demux\_out(i)}$ to a cell word using constellation according to a corresponding mode. Here, the $S_{demux\_out(i)}$ may be configured of bits having the same number as the modulation order.

In detail, the constellation mappers 221, 324 and 325 may map bits output from the bit demultiplexers 219, 322 and 323 to constellation symbols using QPSK, 16-QAM, 64-QAM, the 256-QAM, etc., according to a corresponding mode.

In this case, the constellation mappers 221, 324 and 325 may use the NUC. That is, the constellation mappers 221, 324 and 325 may use NUC 16-QAM, NUC 64-QAM or NUC 256-QAM. The modulation scheme applied to the L1-basic signaling and the L1-detail signaling according to a corresponding mode is shown in above Table 4.

The transmitter 100 may map the constellation symbols to a frame and transmit the mapped symbols to the receiver 200.

In detail, the transmitter 100 may map the constellation symbols corresponding to each of the L1-basic signaling and the L1-detail signaling output from the constellation mappers 221 and 324, and map the constellation symbols corresponding to the additional parity bits output from the constellation mapper 325 to a preamble symbol of a frame.

In this case, the transmitter 100 may map the additional parity bits generated based on the L1-detail signaling transmitted in the current frame to a frame before the current frame.

That is, the transmitter 100 may map the LDPC codeword bits including the L1-basic signaling corresponding to the (i−1)-th frame to the (i−1)-th frame, maps the LDPC codeword bits including the L1-detail signaling corresponding to the (i−1)-th frame to the (i−1)-th frame, and additionally map the additional parity bits generated selected from the LDPC parity bits generated based on the L1-detail signaling corresponding to the i-th frame to the (i−1)-th frame and may transmit the mapped bits to the receiver 200.

In addition, the transmitter 100 may map data to the data symbols of the frame in addition to the L1 signaling and transmit the frame including the L1 signaling and the data to the receiver 200.

In this case, since the L1 signalings include signaling information about the data, the signaling about the data mapped to each data may be mapped to a preamble of a corresponding frame. For example, the transmitter 100 may map the L1 signaling including the signaling information about the data mapped to the i-th frame to the i-th frame.

As a result, the receiver 200 may use the signaling obtained from the frame to receive the data from the corresponding frame for processing.

FIGS. 58 and 59 are block diagrams for describing a configuration of a receiver according to an exemplary embodiment.

In detail, as illustrated in FIG. 58, the receiver 200 may include a constellation demapper 2510, a multiplexer 2520, a Log Likelihood Ratio (LLR) inserter 2530, an LLR combiner 2540, a parity depermutator 2550, an LDPC decoder 2560, a zero remover 2570, a BCH decoder 2580, and a descrambler 2590 to process the L1-basic signaling.

Further, as illustrated in FIG. 59, the receiver 200 may include constellation demappers 2611 and 2612, multiplexers 2621 and 2622, an LLR inserter 2630, an LLR combiner 2640, a parity depermutator 2650, an LDPC decoder 2660, a zero remover 2670, a BCH decoder 2680, a descrambler 2690, and a desegmenter 2695 to process the L1-detail signaling.

Here, the components illustrated in FIGS. 58 and 59 performing functions corresponding to the functions of the components illustrated in FIGS. 42 and 43, respectively, which is only an example, and in some cases, some of the components may be omitted and changed and other components may be added.

The receiver 200 may acquire frame synchronization using a bootstrap of a frame and receive L1-basic signaling from a preamble of the frame using information for processing the L1-basic signaling included in the bootstrap.

Further, the receiver 200 may receive L1-detail signaling from the preamble using information for processing the L1-detail signaling included in the L1-basic signaling, and receive broadcasting data required by a user from data symbols of the frame using the L1-detail signaling.

Therefore, the receiver 200 may determine a mode used at the transmitter 100 to process the L1-basic signaling and the L1-detail signaling, and process a signal received from the transmitter 100 according to the determined mode to receive the L1-basic signaling and the L1-detail signaling. For this purpose, the receiver 200 may pre-store information about parameters used at the transmitter 100 to process the signaling according to corresponding modes.

As such, the L1-basic signaling and the L1-detail signaling may be sequentially acquired from the preamble. In describing FIGS. 58 and 59, components performing common functions will be described together for convenience of explanation.

The constellation demappers 2510, 2611 and 2612 demodulate a signal received from the transmitter 100.

In detail, the constellation demappers 2510, 2611 and 2612 are components corresponding to the constellation mappers 221, 324 and 325 of the transmitter 100, respectively, and may demodulate the signal received from the transmitter 100 and generate values corresponding to bits transmitted from the transmitter 100.

That is, as described above, the transmitter 100 maps an LDPC codeword including the L1-basic signaling and the LDPC codeword including the L1-detail signaling to the preamble of a frame, and transmits the mapped LDPC codeword to the receiver 200. Further, in some cases, the transmitter 100 may map additional parity bits to the preamble of a frame and transmit the mapped bits to the receiver 200.

As a result, the constellation demappers 2510 and 2611 may generate values corresponding to the LDPC codeword bits including the L1-basic signaling and the LDPC codeword bits including the L1-detail signaling. Further, the constellation demapper 2612 may generate values corresponding to the additional parity bits.

For this purpose, the receiver 200 may pre-store information about a modulation scheme used by the transmitter 100 to modulate the L1-basic signaling, the L1-detail signaling, and the additional parity bits according to corresponding modes. Therefore, the constellation demappers 2510, 2611 and 2612 may demodulate the signal received from the transmitter 100 according to the corresponding modes to generate values corresponding to the LDPC codeword bits and the additional parity bits.

The value corresponding to a bit transmitted from the transmitter 100 is a value calculated based on probability that a received bit is 0 and 1, and instead, the probability itself may also be used as a value corresponding to each bit. The value may also be a Likelihood Ratio (LR) or an LLR value as another example.

In detail, an LR value may represent a ratio of probability that a bit transmitted from the transmitter 100 is 0 and probability that the bit is 1, and an LLR value may represent a value obtained by taking a log on probability that the bit transmitted from the transmitter 100 is 0 and probability that the bit is 1.

The foregoing example uses the LR value or the LLR value, which is only one example. According to another exemplary embodiment, the received signal itself rather than the LR or LLR value may also be used.

The multiplexers 2520, 2621 and 2622 perform multiplexing on LLR values output from the constellation demappers 2510, 2611 and 2612.

In detail, the multiplexers 2520, 2621 and 2622 are components corresponding to the bit demultiplexers 219, 322 and 323 of the transmitter 100, and may perform operations corresponding to the operations of the bit demultiplexers 219, 322 and 323, respectively.

For this purpose, the receiver 200 may pre-store information about parameters used for the transmitter 100 to perform demultiplexing and block interleaving. Therefore, the multiplexers 2520, 2621 and 2622 may reversely perform the demultiplexing and block interleaving operations of the bit demultiplexers 219, 322 and 323 on the LLR value corresponding to a cell word to multiplex the LLR value corresponding to the cell word in a bit unit.

The LLR inserters 2530 and 2630 may insert LLR values for the puncturing and shortening bits into the LLR values output from the multiplexers 2520 and 2621, respectively. In this case, the LLR inserters 2530 and 2630 may insert predetermined LLR values between the LLR values output from the multiplexers 2520 and 2621 or a head portion or an end portion thereof.

In detail, the LLR inserters 2530 and 2630 are components corresponding to the zero removers 218 and 321 and the puncturers 217 and 318 of the transmitter 100, respectively, and may perform operations corresponding to the operations of the zero removers 218 and 321 and the puncturers 217 and 318, respectively.

First, the LLR inserters 2530 and 2630 may insert LLR values corresponding to zero bits into a position where the zero bits in an LDPC codeword are padded. In this case, the LLR values corresponding to the padded zero bits, that is, the shortened zero bits may be ∞ or −∞. However, ∞ or −∞ are a theoretical value but may actually be a maximum value or a minimum value of the LLR value used in the receiver 200.

For this purpose, the receiver 200 may pre-store information about parameters and/or patterns used for the transmitter 100 to pad the zero bits according to corresponding modes. Therefore, the LLR inserters 2530 and 2630 may determine positions where the zero bits in the LDPC codewords are padded according to the corresponding modes, and insert the LLR values corresponding to the shortened zero bits into corresponding positions.

Further, the LLR inserters 2530 and 2630 may insert the LLR values corresponding to the punctured bits into the positions of the punctured bits in the LDPC codeword. In this case, the LLR values corresponding to the punctured bits may be 0.

For this purpose, the receiver 200 may pre-store information about parameters and/or patterns used for the transmitter 100 to perform puncturing according to corresponding modes. Therefore, the LLR inserters 2530 and 2630 may determine the lengths of the punctured LDPC parity bits according to the corresponding modes, and insert corresponding LLR values into the positions where the LDPC parity bits are punctured.

When the additional parity bits selected from the punctured bits among the additional parity bits, the LLR inserter 2630 may insert LLR values corresponding to the received additional parity bits, not an LLR value '0' for the punctured bit, into the positions of the punctured bits.

The LLR combiners 2540 and 2640 may combine, that is, a sum the LLR values output from the LLR inserters 2530 and 2630 and the LLR value output from the multiplexer 2622. However, the LLR combiners 2540 and 2640 serve to update LLR values for specific bits into more correct values. However, the LLR values for the specific bits may also be decoded from the received LLR values without the LLR combiners 2540 and 2640, and therefore, in some cases, the LLR combiners 2540 and 2640 may be omitted.

In detail, the LLR combiner 2540 is a component corresponding to the repeater 216 of the transmitter 100, and may perform an operation corresponding to the operation of the repeater 216. Alternatively, the LLR combiner 2640 is a component corresponding to the repeater 317 and the additional parity generator 319 of the transmitter 100, and may perform operations corresponding to the operations of the repeater 317 and the additional parity generator 319.

First, the LLR combiners 2540 and 2640 may combine LLR values corresponding to the repetition bits with other LLR values. Here, the other LLR values may be bits which are a basis of generating the repetition bits by the transmitter 100, that is, LLR values for the LDPC parity bits selected as the repeated object.

That is, as described above, the transmitter 100 selects bits from the LDPC parity bits and repeats the selected bits between the LDPC information bits and the LDPC parity bits generated by LDPC encoding, and transmits the repetition bits to the receiver 200.

As a result, the LLR values for the LDPC parity bits may be formed of the LLR values for the repeated LDPC parity bits and the LLR values for the non-repeated LDPC parity bits, that is, the LDPC parity bits generated by the LDPC encoding. Therefore, the LLR combiners 2540 and 2640 may combine the LLR values for the same LDPC parity bits.

For this purpose, the receiver 200 may pre-store information about parameters used for the transmitter 100 to perform the repetition according to corresponding modes. As a result, the LLR combiners 2540 and 2640 may determine the lengths of the repeated LDPC parity bits, determine the positions of the bits which are a basis of the repetition, and combine the LLR values for the repeated LDPC parity bits with the LLR values for the LDPC parity bits which are a basis of the repetition and generated by the LDPC encoding.

Figure 60:
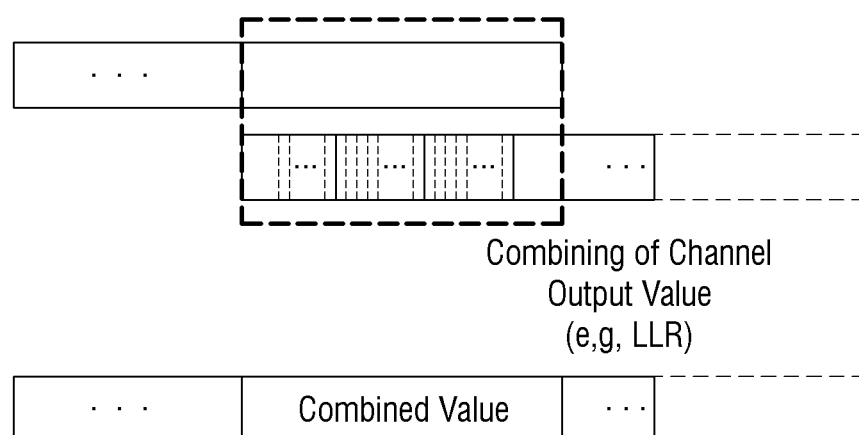
FIGS. 60 and 61 are diagrams for describing an example of combining Log Likelihood Ratio (LLR) values of a receiver, according to exemplary embodiments.
Figure 61:
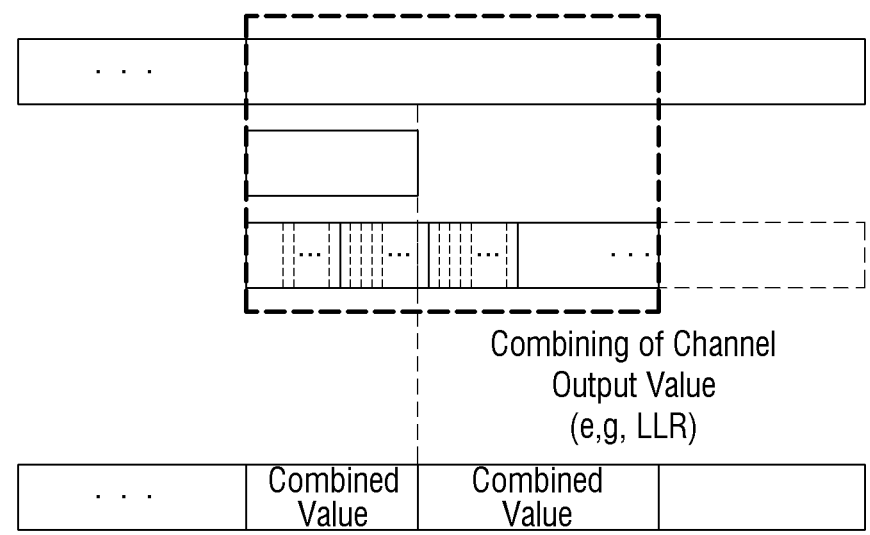

For example, as illustrated in FIGS. 60 and 61, the LLR combiners 2540 and 2640 may combine LLR values for repeated LDPC parity bits with LLR values for LDPC parity bits which are a basis of the repetition and generated by the LDPC encoding.

When LPDC parity bits are repeated n times, the LLR combiners 2540 and 2640 may combine LLR values for bits at the same position at n times or less.

For example, FIG. 60 illustrates a case in which some of LDPC parity bits other than punctured bits are repeated once. In this case, the LLR combiners 2540 and 2640 may combine LLR values for the repeated LDPC parity bits with LLR values for the LDPC parity bits generated by the LDPC encoding, and then, output the combined LLR values or output the LLR values for the received repeated LDPC parity bits or the LLR values for the received LDPC parity bits generated by the LDPC encoding without combining them.

As another example, FIG. 61 illustrates a case in which some of the transmitted LDPC parity bits, which are not punctured, are repeated twice, the remaining portion is repeated once, and the punctured LDPC parity bits are repeated once.

In this case, the LLR combiners 2540 and 2640 may process the remaining portion and the punctured bits which are repeated once by the same scheme as described above. However, the LLR combiners 2540 and 2640 may process the portion repeated twice as follows. In this case, for convenience of description, one of the two portions generated by repeating some of the LDPC parity bits twice is referred to as a first portion and the other is referred to as the second portion.

In detail, the LLR combiners 2540 and 2640 may combine LLR values for each of the first and second portions with LLR values for the LDPC parity bits. Alternatively, the LLR combiners 2540 and 2640 may combine the LLR values for the first portion with the LLR values for the LDPC parity bits, combine the LLR values for the second portion with the LLR values for the LDPC parity bits, or combine the LLR values for the first portion with the LLR values for the second portion. Alternatively, the LLR combiners 2540 and 2640 may output the LLR values for the first portion, the LLR values for the second portion, the LLR values for the remaining portion, and punctured bits, without separate combination.

Further, the LLR combiner 2640 may combine LLR values corresponding to additional parity bits with other LLR values. Here, the other LLR values may be the LDPC parity bits which are a basis of the generation of the additional parity bits by the transmitter 100, that is, the LLR values for the LDPC parity bits selected for generation of the additional parity bits.

That is, as described above, the transmitter 100 may map additional parity bits for L1-detail signaling transmitted in a current frame to a previous frame and transmit the mapped bits to the receiver 200.

In this case, the additional parity bits may include LDPC parity bits which are punctured and are not transmitted in the current frame, and in some cases, may further include LDPC parity bits transmitted in the current frame.

As a result, the LLR combiner 2640 may combine LLR values for the additional parity bits received through the current frame with LLR values inserted into the positions of the punctured LDPC parity bits in the LDPC codeword received through the next frame and LLR values for the LDPC parity bits received through the next frame.

For this purpose, the receiver 200 may pre-store information about parameters and/or patterns used for the transmitter 100 to generate the additional parity bits according to corresponding modes. As a result, the LLR combiner 2640 may determine the lengths of the additional parity bits, determine the positions of the LDPC parity bits which are a basis of generation of the additional parity bits, and combine the LLR values for the additional parity bits with the LLR values for the LDPC parity bits which are a basis of generation of the additional parity bits.

The parity depermutators 2550 and 2650 may depermutate the LLR values output from the LLR combiners 2540 and 2640, respectively.

In detail, the parity depermutators 2550 and 2650 are components corresponding to the parity permutators 215 and 316 of the transmitter 100, and may perform operations corresponding to the operations of the parity permutators 215 and 316, respectively.

For this purpose, the receiver 200 may pre-store information about parameters and/or patterns used for the transmitter 100 to perform group-wise interleaving and parity interleaving according to corresponding modes. Therefore, the parity depermutators 2550 and 2650 may reversely perform the group-wise interleaving and parity interleaving operations of the parity permutators 215 and 316 on the LLR values corresponding to the LDPC codeword bits, that is, perform group-wise deinterleaving and parity deinterleaving operations to perform the parity depermutation on the LLR values corresponding to the LDPC codeword bits, respectively.

The LDPC decoders 2560 and 2660 may perform LDPC decoding based on the LLR values output from the parity depermutators 2550 and 2650, respectively.

In detail, the LDPC decoders 2560 and 2660 are components corresponding to the LDPC encoders 214 and 315 of the transmitter 100 and may perform operations corresponding to the operations of the LDPC encoders 214 and 315, respectively.

For this purpose, the receiver 200 may pre-store information about parameters used for the transmitter 100 to perform the LDPC encoding according to corresponding modes. Therefore, the LDPC decoders 2560 and may perform the LDPC decoding based on the LLR values output from the parity depermutators 2550 and 2650 according to the corresponding modes.

For example, the LDPC decoders 2560 and 2660 may perform the LDPC decoding based on the LLR values output from the parity depermutators 2550 and 2650 by iterative decoding based on a sum-product algorithm and output error-corrected bits depending on the LDPC decoding.

The zero removers 2570 and 2670 may remove zero bits from the bits output from the LDPC decoders 2560 and 2660, respectively.

In detail, the zero removers 2570 and 2670 are components corresponding to the zero padders 213 and 314 of the transmitter 100, and may perform operations corresponding to the operations of the zero padders 213 and 314, respectively.

For this purpose, the receiver 200 may pre-store information about parameters and/or patterns used for the transmitter 100 to pad the zero bits according to corresponding modes. As a result, the zero removers 2570 and 2670 may remove the zero bits padded by the zero padders 213 and 314 from the bits output from the LDPC decoders 2560 and 2660, respectively.

The BCH decoders 2580 and 2680 may perform BCH decoding on the bits output from the zero removers 2570 and 2670, respectively.

In detail, the BCH decoders 2580 and 2680 are components corresponding to the BCH encoders 212 and 313 of the transmitter 100, and may perform operations corresponding to the operations of the BCH encoders 212 and 313, respectively.

For this purpose, the receiver 200 may pre-store the information about parameters used for the transmitter 100 to perform BCH encoding. As a result, the BCH decoders 2580 and 2680 may correct errors by performing the BCH decoding on the bits output from the zero removers 2570 and 2670 and output the error-corrected bits.

The descramblers 2590 and 2690 may descramble the bits output from the BCH decoders 2580 and 2680, respectively.

In detail, the descramblers 2590 and 2690 are components corresponding to the scramblers 211 and 312 of the transmitter 100, and may perform operations corresponding to the operations of the scramblers 211 and 312.

For this purpose, the receiver 200 may pre-store information about parameters used for the transmitter 100 to perform scrambling. As a result, the descramblers 2590 and 2690 may descramble the bits output from the BCH decoders 2580 and 2680 and output them, respectively.

As a result, L1-basic signaling transmitted from the transmitter 100 may be recovered. Further, when the transmitter 100 does not perform segmentation on L1-detail signaling, the L1-detail signaling transmitted from the transmitter 100 may also be recovered.

However, when the transmitter 100 performs the segmentation on the L1-detail signaling, the desegmenter 2695 may desegment the bits output from the descrambler 2690.

In detail, the desegmenter 2695 is a component corresponding to the segmenter 311 of the transmitter 100, and may perform an operation corresponding to the operation of the segmenter 311.

For this purpose, the receiver 200 may pre-store information about parameters used for the transmitter 100 to perform the segmentation. As a result, the desegmenter 2695 may combine the bits output from the descrambler 2690, that is, the segments for the L1-detail signaling to recover the L1-detail signaling before the segmentation.

Figure 62:
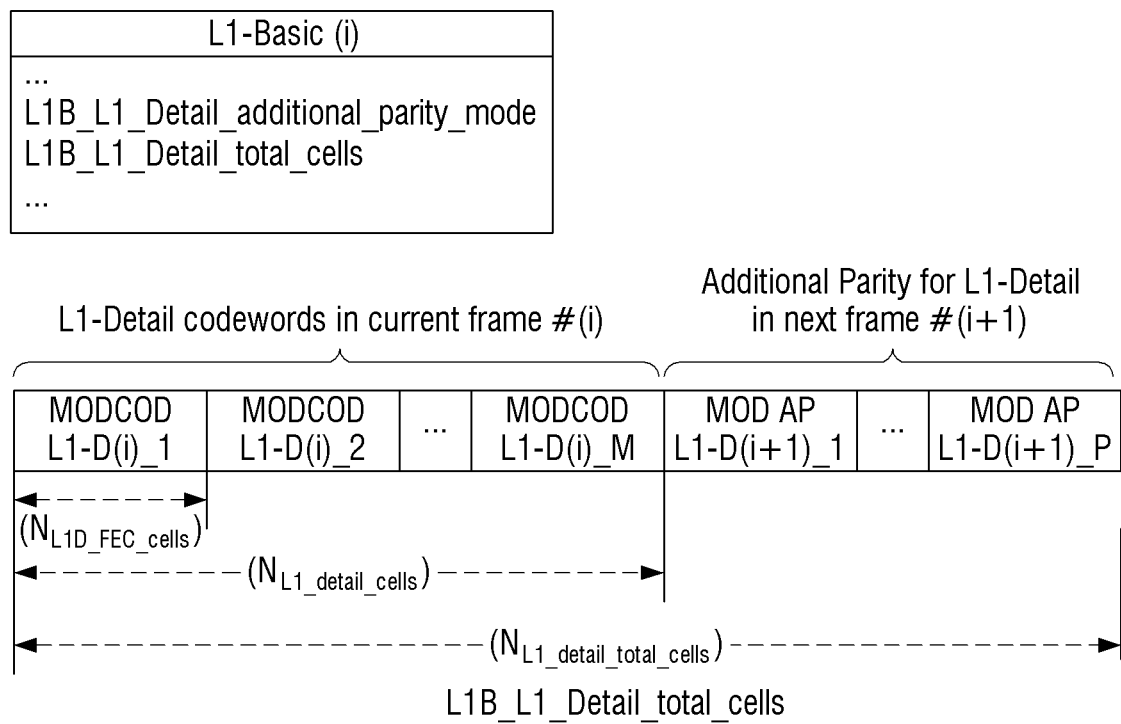
FIG. 62 is a diagram illustrating an example of providing information about a length of an L1 signal according to an exemplary embodiment.

The information about the length of the L1 signaling is provided as illustrated in FIG. 62. Therefore, the receiver 200 may calculate the length of the L1-detail signaling and the length of the additional parity bits.

Referring to FIG. 62, since the L1-basic signaling provides information about L1-detail total cells, the receiver 200 needs to calculate the length of the L1-detail signaling and the lengths of the additional parity bits.

In detail, when L1B_L1_Detail_additional_parity_mode of the L1-basic signaling is not 0, since the information on the given L1B_L1_Detail total cells represents a total cell length ($=N_{L1\_detail\_total\_cells}$), the receiver 200 may calculate the length $N_{L1\_detail\_cells}$ of the L1-detail signaling and the length $N_{AP\_total\_cells}$ of the additional parity bits based on following Equations 37 to 40.

$$N_{L1\_FEC\_cells} = \frac{N_{outer} + N_{repeat} + N_{ldpc\_parity} - N_{punc}}{\eta_{MOD}} \quad (37)$$
$$= \frac{N_{FEC}}{\eta_{MOD}}$$

$$N_{L1\_detail\_cells} = N_{L1D\_FECFRAME} \times N_{L1\_FEC\_cells} \quad (38)$$

$$N_{AP\_total\_cells} = N_{L1\_detail\_total\_cells} - N_{L1\_detail\_cells} \quad (39)$$

In this case, based on above Equations 37 to 39, an $N_{AP\_total\_cells}$ value may be obtained based on an $N_{L1\_detail\_total\_cells}$ value which may be obtained from the information about the L1B_L1_Detail total cells of the L1-basic signaling, $N_{FEC}$, the $N_{L1D\_FECFRAME}$, and the modulation order $\eta_{MOD}$. As an example, $N_{AP\_total\_cells}$ may be calculated based on following Equation 40.

$$N_{AP\_total\_cells} = N_{L1\_detail\_total\_cells} - N_{L1D\_FECFRAME} \times \frac{N_{FEC}}{\eta_{MOD}} \quad (40)$$

A syntax, and field semantics of the L1-basic signaling field are as following Table 13.

TABLE 13

| Syntax | # of bits | Format |
|---|---|---|
| L1_Basic_signaling( ) { | | |
| L1B_L1_Detail_size_bits | 16 | uimsbf |
| L1B_L1_Detail_fec_type | 3 | uimsbf |
| L1B_L1_Detail_additional_parity_mode | 2 | uimsbf |

TABLE 13-continued

| Syntax | # of bits | Format |
|---|---|---|
| L1B_L1_Detail_total_cells | 19 | uimsbf |
| L1B_Reserved | ? | uimsbf |
| L1B_crc | 32 | uimsbf |
| { | | |

As a result, the receiver 200 may perform an operation of a receiver for the additional parity bits in a next frame based on the additional parity bits transmitted to the $N_{AP\_total\_cells}$ cell among the received L1 detail cells.

Figure 63:
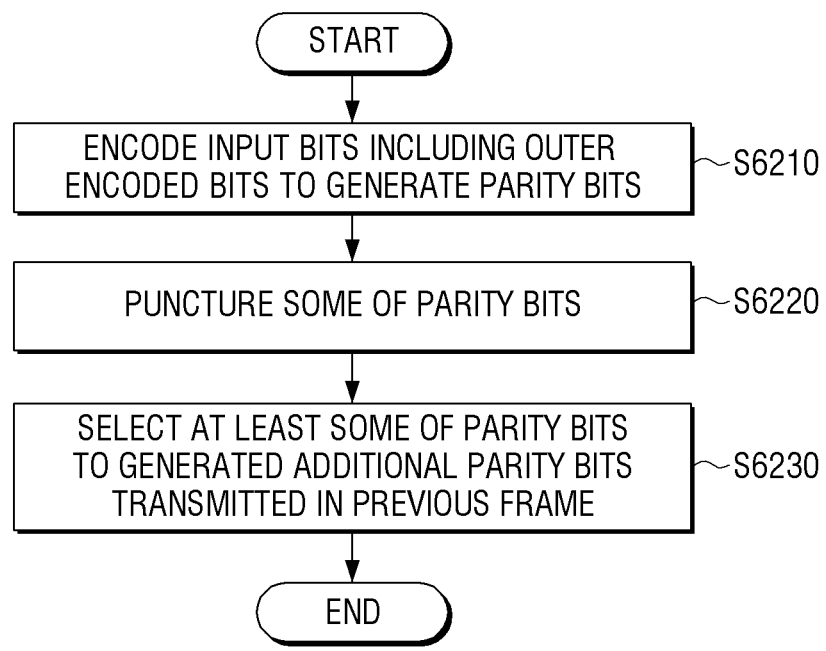
FIG. 63 is a flow chart for describing a method for generating an additional parity, according to an exemplary embodiment.

FIG. 63 is a flow chart for describing a method for generating additional parity bits according to an exemplary embodiment.

First, input bits including outer encoded bits are encoded to generate parity bits (S6210) and some of the parity bits are punctured (S6220).

Further, at least some of the parity bits are selected to generate additional parity bits transmitted in a previous frame (S6230).

In this case, the number of additional parity bits to be generated may be determined based on the number of outer encoded bits transmitted in a current frame and the number of remaining parity bits after the puncturing.

The method may further include repeating at least some bits of the LDPC codeword in the LDPC codeword to repeat at least some bits of the LDPC codeword formed of the input bits and the parity bits in the current frame and transmit them.

In this case, when the repetition is performed, the number of additional parity bits to be generated may be determined based on the number of outer encoded bits transmitted in the current frame, the number of remaining parity bits after the puncturing, and the number of bits repeated in the current frame.

Further, the number of additional parity bits to be generated is calculated based on a temporary number $N_{AP\_temp}$ of the additional parity bits to be generated which is calculated based on above Equation 8, and in detail may be calculated based on above Equation 10.

The detailed method for generating additional parity bits is as described above.

Figure 64:
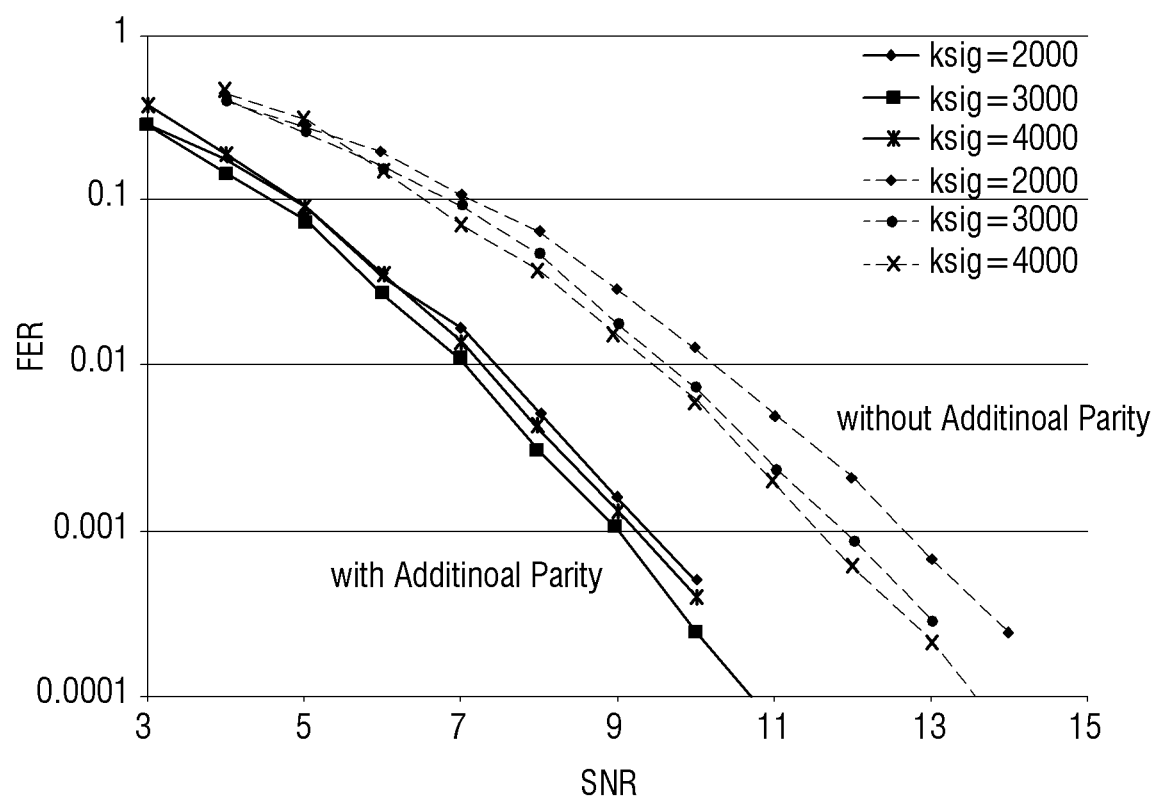
FIG. 64 is a diagram for describing a coding gain and a diversity gain which may be obtained upon using an additional parity, according to an exemplary embodiment.

FIG. 64 is a diagram illustrating performance on a case in which the additional parity bits are used and a case in which they are not used, according to an exemplary embodiment.

In FIG. 64, when the lengths of the L1-detail signaling each are 2000, 3000, and 4000, the case (a dot line) in which the additional parity bits are not used and the case (a solid line) in which the additional parity bits are used represent a frame error rate (FER), and it may be appreciated that a coding gain and a diversity gain (slope) may be obtained when the additional parity bits are used.

A non-transitory computer readable medium in which a program performing the various methods described above are stored may be provided according to an exemplary embodiment. The non-transitory computer readable medium is not a medium that stores data therein for a while, such as a register, a cache, a memory, or the like, but means a medium that at least semi-permanently stores data therein and is readable by a device such as a microprocessor. In detail, various applications or programs described above may be stored and provided in the non-transitory computer readable medium such as a compact disk (CD), a digital versatile disk (DVD), a hard disk, a Blu-ray disk, a universal serial bus (USB), a memory card, a read only memory (ROM), or the like.

At least one of the components, elements, modules or units represented by a block as illustrated in FIGS. 1, 42, 43, 58 and 59 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

Although the exemplary embodiments of inventive concept have been illustrated and described hereinabove, the inventive concept is not limited to the above-mentioned exemplary embodiments, but may be variously modified by those skilled in the art to which the inventive concept pertains without departing from the scope and spirit of the inventive concept as disclosed in the accompanying claims. For example, the exemplary embodiments are described in relation with BCH encoding and decoding and LDPC encoding and decoding. However, these embodiments do not limit the inventive concept to only a particular encoding and decoding, and instead, the inventive concept may be applied to different types of encoding and decoding with necessary modifications. These modifications should also be understood to fall within the scope of the inventive concept.

What is claimed is:

1. A television (TV) broadcast signal transmitting apparatus for transmitting layer 1 (L1) signaling information and TV broadcast data, the TV broadcast signal transmitting apparatus being operable in a mode among a plurality of modes, the transmitting apparatus comprising:

an encoder configured to encode information bits comprising input bits to generate parity bits, wherein the input bits are based on the L1 signaling information for the TV broadcast data;

a repeater configured to append one or more bits of the generated parity bits by repetition between the information bits and the generated parity bits, in a predetermined mode among the plurality of modes;

a puncturer configured to puncture one or more bits from the generated parity bits;

an additional parity generator configured to calculate a number of additional parity bits based on a number of the one or more appended bits and generate the additional parity bits based on the calculated number;

a signal generator configured to generate a TV broadcast signal based on a first frame and a second frame, wherein the first frame includes the additional parity bits, and the second frame includes the input bits, remaining parity bits of the generated parity bits after the puncturing and the one or more appended parity bits; and a transmitter configured to transmit the TV broadcast signal, wherein the first frame is transmitted prior to the second frame.

2. The transmitting apparatus of claim 1, further comprising a mapper configured to modulate the additional parity bits based on a modulation order.

3. The transmitting apparatus of claim 1, wherein the number of the additional parity bits is calculated based on a following equation:

$$N_{AP} = \left\lfloor \frac{N_{AP\_temp}}{\eta_{MOD}} \right\rfloor \times \eta_{MOD},$$

where $N_{AP}$ is the number of the additional parity bits and $N_{AP\_temp}$ is a temporary number of the additional parity bits, and $\eta_{MOD}$ is a modulation order.

4. The transmitting apparatus of claim 3, wherein the temporary number of the additional parity bits is calculated based on a following equation:

$$N_{AP\_temp} = \min\left\{ \begin{array}{l} 0.5 \times K \times (N_{outer} + N_{ldpc\_parity} - N_{punc} + N_{repeat}), \\ (N_{ldpc\_parity} - N_{punc} + N_{repeat}) \end{array} \right\},$$

$$K = 0, 1, 2,$$

where $N_{AP\_temp}$ is the temporary number of the additional parity bits, min denotes a minimum number function, and $N_{ldpc\_parity}$ is a number of the parity bits, $N_{punc}$ is the number of the one or more punctured bits, $N_{outer}$ is the number of the input bits, and $N_{repeat}$ is the number of the one or more appended bits.

* * * * *